United States Patent
Takahashi et al.

(10) Patent No.: US 6,331,466 B1
(45) Date of Patent: Dec. 18, 2001

(54) INSULATED GATE SEMICONDUCTOR DEVICE AND MANUFACTURING METHOD THEREOF

(75) Inventors: Hideki Takahashi; Hidenori Nishihara, both of Fukuoka; Masana Harada, Nishinomiya; Tadaharu Minato, Kobe, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/563,206

(22) Filed: May 2, 2000

Related U.S. Application Data

(62) Division of application No. 08/338,599, filed on Feb. 14, 1995.

(30) Foreign Application Priority Data

Feb. 21, 1994 (JP) .............................. 6-022459(P)

(51) Int. Cl.[7] .................. H01L 21/336; H01L 29/74; H01L 31/111
(52) U.S. Cl. ........................... 438/268; 257/139
(58) Field of Search ................... 438/253, 268, 438/315, 624, 270, 275; 257/678, 213, 203

(56) References Cited

U.S. PATENT DOCUMENTS

| | | | |
|---|---|---|---|
| 4,316,209 | 2/1982 | Ho et al. ........................ | 257/769 |
| 4,697,201 | 9/1987 | Mihara . | |
| 4,766,474 | * 8/1988 | Nakagawa et al. ............. | 257/409 |
| 4,994,871 | 2/1991 | Chang et al. . | |
| 5,063,307 | 11/1991 | Zommer . | |
| 5,072,266 | * 12/1991 | Bulucea et al. . | |
| 5,086,324 | * 2/1992 | Hagino ........................... | 357/23.5 |
| 5,097,302 | 3/1992 | Fujihira et al. ................. | 257/341 |
| 5,134,448 | 7/1992 | Johnsen et al. ................. | 257/330 |
| 5,285,094 | 2/1994 | Muri et al. ..................... | 257/341 |
| 5,341,003 | 8/1994 | Obinata .......................... | 257/337 |
| 5,410,171 | 4/1995 | Tsuzuki et al. ................. | 257/337 |
| 5,448,083 | * 9/1995 | Kitagawa et al. .............. | 257/139 |
| 6,198,130 | * 3/2001 | Nobuto et al. .................. | 257/343 |
| 6,221,721 | * 4/2001 | Takahashi ....................... | 438/270 |

FOREIGN PATENT DOCUMENTS

| | | |
|---|---|---|
| 42 42 578 | 6/1993 | (DE) . |
| 0 561 267 A2 | 9/1993 | (EP) . |

(List continued on next page.)

*Primary Examiner*—David Nelms
*Assistant Examiner*—Thao P. Le
(74) *Attorney, Agent, or Firm*—Oblon, Spivak, McClelland, Maier & Neustadt, P.C.

(57) ABSTRACT

An insulated gate semiconductor device in which the ON voltage is decreased by providing strip like trenches (207) having gate electrodes (210) buried therein are formed in an upper main surface of a semiconductor base body (200), and an N+ emitter layer (206) is exposed in a ladder-like form in the upper main surface of the semiconductor base body interposed between adjacent trenches (207). Accordingly, even if the position of a zonal region (Ra) which is a contact surface with an emitter electrode (212) is shifted, the emitter electrode (212) is surely in contact with the N+ emitter layer (206). Furthermore, the ladder-like N+ emitter layer (206) is formed adjacent to the trench (207), so that a channel region (208) is formed without discontinuation along the trench (207). Accordingly, it has the effect of facilitating miniaturization of elements and of effectively making use of the miniaturization to decrease the ON voltage.

6 Claims, 35 Drawing Sheets

FOREIGN PATENT DOCUMENTS

| | | |
|---|---|---|
| 0 561 267 A3 | 9/1993 | (EP) . |
| 2 518 816 | 6/1983 | (FR) . |
| 2 692 402 | 12/1993 | (FR) . |
| 55-96673 | 7/1980 | (JP) . |
| 59-125653 | 7/1984 | (JP) . |
| 0159663 | 10/1985 | (JP) ................................ 257/330 |
| 61-164263 | 7/1986 | (JP) ................................ 257/341 |
| 61-198781 | 9/1986 | (JP) ................................ 257/341 |
| 63-213968 | 9/1988 | (JP) . |
| 1-198076 | 8/1989 | (JP) . |
| 1-253280 | 10/1989 | (JP) . |
| 2-3288 | 1/1990 | (JP) . |
| 2-36572 | 2/1990 | (JP) . |
| 2-74074 | 3/1990 | (JP) . |
| 2-112282 | 4/1990 | (JP) . |
| 4-251983 | 9/1992 | (JP) . |
| 4-326575 | 11/1992 | (JP) . |
| 5-95118 | 4/1993 | (JP) . |
| 5-144867 | 6/1993 | (JP) . |
| 5-211193 | 8/1993 | (JP) . |
| 6-85268 | 3/1994 | (JP) ................................ 257/341 |

\* cited by examiner

CONTACT WIDTH DEPENDENCY OF CONTACT RESISTANCE IN N+ EMITTER LAYER 206

IMPURITY CONCENTRATION DEPENDENCY OF CONTACT RESISTANCE IN N⁺ EMITTER LAYER 206

INSULATED GATE SEMICONDUCTOR DEVICE AND MANUFACTURING METHOD THEREOF

This application is a Divisional of Ser. No. 08/338,559 filed Feb. 14, 1995.

BACKGROUND OF THE INVENTION

1. Field of the Invention

The present invention relates to an insulated gate semiconductor device having trench.gate and a manufacturing method thereof.

2. Description of the Background Art

The insulated gate semiconductor device is a semiconductor device having the structure in which p-type and n-type semiconductor layers are alternately joined, main electrodes through which main current flows are electrically connected to the semiconductor layers on both ends, and a gate electrode for forming a channel by applying the electric field is connected to at least one of the semiconductor layers with an insulating film interposed therebetween. In this insulated gate semiconductor device, the current flowing between the two main electrodes, i.e., the main current, is controlled by the voltage applied to the gate electrode. Typical examples thereof include the MOS transistors and the insulated gate bipolar transistors (simply referred to as IGBT).

The IGBTs for electric power generally have the structure in which a large number of IGBT elements (referred to as unit cells, hereinafter) are connected in parallel. It is the same in the MOS transistors for electric power, too. Especially, the insulated gate semiconductor devices having trench.gate, that is, the devices having the structure in which the gate electrode is buried in the trench formed in the upper surface of the semiconductor substrate have attracted special interest as excellent devices having such advantages as being capable of enhancing the integration degree because of easy miniaturization and simple producing processes. Two examples of the conventional insulated gate semiconductor devices having the trench.gate will now be described below.

<First Conventional Example>

First, the MOS transistor having trench.gate (referred to as UMOS hereinafter) disclosed in U.S. Pat. No. 4,767,722 is considered. FIG. 40 is a front section view of this device. A section of one unit cell is shown in FIG. 40. In this UMOS 40, an N⁻-type semiconductor layer 4 containing N-type impurity of a low concentration is formed on a semiconductor substrate constituting an N⁺-type semiconductor layer 1 containing N-type impurity of a high concentration, and a P base layer 5 is formed by diffusing P-type impurity on the N⁻ semiconductor layer 4. Furthermore, on the upper main surface of the P base layer 5, an N⁺ emitter layer 6 is selectively formed by selectively diffusing N-type impurity of a high concentration. These four semiconductor layers constitute a flat board like semiconductor base body 20. A trench 7 is formed in the upper main surface of the semiconductor base body 20 from the exposed part of the N⁺ emitter layer 6 toward the deeper portion. This trench 7 passes through the N⁺ emitter layer 6 and the P base layer 5 to reach the N⁻ semiconductor layer 4. Accordingly, the side surface of the trench 7 is adjacent to the N⁺ emitter layer 6, the P base layer 5 and the upper surface portion of the N⁻ semiconductor layer 4.

A gate insulating film 9 is formed on the inner wall surface of the trench 7, and a gate electrode 10 composed of polysilicon is buried inside the gate insulating film 9. Accordingly, the gate electrode 10 faces the N⁺ emitter layer 6, the P base layer 5 and the upper surface portion of the N⁻ semiconductor layer 4 with the gate insulating film 9 interposed therebetween. The voltage is applied to the gate electrode 10 and then an N channel is formed in the P base layer 5. That is, the region of the P base layer 5 facing the gate electrode 10 serves as a channel region 8. A drain electrode 13 is formed on the lower main surface of the semiconductor base body 20, i.e., on the lower main surface of the N⁺ semiconductor layer 1. A source electrode 12 is formed over part of the exposed N⁺ emitter layer 6 and the exposed P base layer 5 in the upper main surface of the semiconductor base body 20.

FIG. 41 is a plan view of the UMOS 40 shown in FIG. 40. The upper main surface of the UMOS 40 with the source electrode 12 removed therefrom, i.e., the upper main surface of the semiconductor base body 20 is shown in FIG. 41. As shown in FIG. 41, the gate electrode 10 is formed in a lattice-like form, and the N⁺ emitter layer 6 is exposed in the upper main surface of the semiconductor base body 20 in the form like rectangular rings adjacent to the rectangular gate electrode 10. Further, the P base layer 5 is exposed on the upper main surface of the semiconductor base body 20 in the rectangular areas surrounded by the ring-like N⁺ emitter layer 6. In FIG. 41, the outlines of the regions in which the source electrode 12 is in contact with the upper main surface of the semiconductor base body 20 are represented by the dotted lines. That is, the source electrode 12 is electrically connected to the entire surface of the P base layer 5 exposed in the rectangular regions and part of the N⁺ emitter layer 6 adjacent to the periphery thereof.

When using this UMOS 40, the external power source is first connected to apply a drain voltage $V_{DS}$ in the positive direction between the drain electrode 13 and the source electrode 12. In this condition, a gate voltage $V_{GS}$ exceeding a predetermined gate threshold voltage $V_{GS(th)}$ is applied in the positive direction between the gate electrode 10 and the source electrode 12 (i.e., the gate is turned on), and then the P-type channel region 8 which is a part of the P-type P base layer 5 is inverted to the N-type to form an N-type channel in the channel region 8. This channel implements a conductive state between the p base layer 5 and the N⁻ semiconductor layer 4. As a result, the main current flows from the drain electrode 13 to the source electrode 12. That is, the UMOS 40 goes into the conductive state. The resistance between the drain electrode 13 and the source electrode 12 at this time is called ON resistance $R_{ON}$. It is desirable that the ON resistance $R_{ON}$ is as low as possible to decrease the loss when the UMOS 40 becomes conductive.

Next, when the gate voltage $V_{GS}$ is returned to a value of zero or minus (backward bias), (that is, the gate is turned off), the channel formed in the channel region 8 disappears and the channel region 8 returns to the original P-type conductivity form. As a result, it is cut off between the P base layer 5 and N⁻ semiconductor layer 4, so that the main current does not flow. That is to say, the UMOS 40 becomes non-conductive.

<Second Conventional Example>

Next, another example of conventional device is considered. FIG. 42 is a fragmentary cross-section perspective view of the IGBT (referred to as UMOS-IBGT hereinafter) having trench gate disclosed in U.S. Pat. No. 4,994,871. Three unit cells are shown in FIG. 42. In this UMOS-IGBT 80, an N⁺ buffer layer 63 containing N-type impurity of a high concentration is formed on a semiconductor substrate constituting a P+ collector layer 62 containing P-type impurity of a high concentration, and an N− semiconductor layer 64 containing N-type impurity of a low concentration is formed on the N+ buffer layer 63. On the N− semiconductor layer 64, a P base layer 65 is formed by diffusing P-type impurity, and on the upper main surface of the P base layer 65, an N+ emitter layer 66 is formed in a stripe form by selectively diffusing N-type impurity of a high concentration. That is, the N+ emitter layer 66 and the P base layer 65 are exposed on the upper main surface of the semiconductor base body 60 alternately in the stripe form. These five semiconductor layers form the flat board like semiconductor base body 60.

Trenches 67 are formed on the upper main surface of this semiconductor base body 60. The trenches 67 are formed in the stripe shape, and are arranged in the direction perpendicular to the stripe-like N+ emitter layer 66. The trench 67 is formed extending from the upper main surface of the semiconductor base body 60 through the N+ emitter layer 66 and the P base layer 65 to reach the N− semiconductor layer 64. A gate insulating film 69 is formed on the inner wall surface of the trench 67, and a gate electrode 70 is buried inside of it. The region of the P base layer 65 facing the gate electrode 70 and is interposed between the N+ emitter layer 66 and the N− semiconductor layer 64 serves as a channel region 68.

A collector electrode 73 is formed on the lower main surface of the semiconductor base body 60, that is, on the lower main surface of the P+ collector layer 62. An emitter electrode 72 is formed in the portion in which the N+ emitter layer 66 is exposed and the portion in which the P base layer 65 is exposed on the upper main surface of the semiconductor base body 60.

When using this UMOS-IGBT 80, first, an external power source is connected to apply a collector voltage $V_{CE}$ in the positive direction between the collector electrode 73 and the emitter electrode 72. In this condition, a gate voltage $V_{GE}$ exceeding a predetermined gate threshold voltage $V_{GE(th)}$ is applied in the positive direction between the gate electrode 70 and the emitter electrode 72 (that is, the gate is turned on), and then the P-type channel region 68 is inverted to the N-type to form an N-type channel in the channel region 68. Electrons are injected from the emitter electrode 72 via the N+ emitter layer 66 to the N− semiconductor layer 64. These injected electrons cause forward bias between the P+ collector layer 62 and the N− semiconductor layer 64 (including the N+ buffer layer 63), and holes are injected from the P+ collector layer 62 to the N− semiconductor layer 64. As a result, the resistance of the N− semiconductor layer 64 largely decreases so that large main current flows from the collector electrode 73 to the emitter electrode 72. The voltage produced between the collector electrode 73 and the emitter electrode 72 at this time is called ON voltage $V_{CE(sat)}$. The ON voltage $V_{CE(sat)}$ is converted into resistance to be the ON resistance $R_{ON}$ described above. It is desirable that the ON voltage $V_{CE(sat)}$ or the ON resistance $R_{ON}$ is as low as possible to decrease the loss when the UMOS-IGBT 80 becomes conductive. As described above, the IGBT is formed so that the injection of holes from the P+ collector layer 62 causes the resistance of the N− semiconductor layer 64 to be decreased.

Next, when the gate voltage $V_{GE}$ is returned to a value of zero or minus (backward bias), (that is, the gate is turned off), the channel formed in the channel region 68 disappears and the channel region 68 returns to the original P-type conductivity form. As a result, the injection of electrons from the emitter electrode 72 stops and then the injection of holes from the P+ collector layer 62 also stops. After that, the electrons and holes remaining in the N− semiconductor layer 64 (and the N+ buffer layer 63) are recovered to the collector electrode 73 and the emitter electrode 72, respectively, or they are bonded again. At this time, since the holes decrease slower than the electrons decrease, the current flowing until the holes are recovered to the emitter electrode 72 causes so-called "tail current" . In the UMOS-IGBT, the injection of holes from the emitter electrode 72 has an important role, which is different from the UMOS.

Generally, it is said that making the unit cells smaller, that is, the miniaturization is effective to decrease the ON voltage $V_{CE(sat)}$ in the UMOS or UMOS-IGBT. In the first conventional example, however, the ring-like exposure surface of the N+ emitter layer 6 must have a certain or larger width to certainly realize the electric contact between the source electrode 12 and the N+ emitter layer 6. This is due to the fact that redundant design is required because there is a certain limit in accurately positioning the contact plane of the source electrode 12 and the semiconductor base body 20 so as to cover the inner portion of the ring-like N+ emitter layer 6.

In the second conventional example, since the stripe-like N+ emitter layer 66 and the stripe-like gate electrode 70 are arranged perpendicularly, the electric contact between the N+ emitter layer 66, the P base layer 65 and the emitter electrode 72 is ensured even if the position of the contact plane of the emitter electrode 72 and the upper main surface of the semiconductor base body 60 is shifted. Accordingly, the redundant design required in the first conventional example is not needed, which is therefore advantageous in that the miniaturization is easy. In the second conventional example, however, since the stripe-like N+ emitter layer 66 is perpendicular to the gate electrode 70 in contrast to the first conventional example in which the N+ emitter layer 6 is formed along the gate electrode 10, the N+ emitter layer 66 does not face to the gate electrode 70 in the portion in which the P base layer 65 is exposed on the upper main surface of the semiconductor base body 60. That is, the channel region 68 is not continuously formed along the gate electrode 70 but it discontinues at the portion where the P base layer 65 is exposed. Accordingly, in the second conventional example, the width of the channel region 68 is shorter as compared with the first conventional example. This works to increase the ON voltage $V_{CE(sat)}$. That is, in the second conventional example, though the miniaturization is realized, there is a problem that it does not effectively contribute to decrease the ON voltage $V_{CE(sat)}$.

Also, both of the first and second conventional examples involve a problem that the ON voltage $V_{CE(sat.)}$ increases if the unit cells are miniaturized over a certain level. This is caused because the contact area (area in contact) between the N+ emitter layer 6 (N+ emitter layer 66) and the source electrode 12 (emitter electrode 72) which is a main path of the main current becomes excessively small with miniaturization, resulting in an increase in the contact resistance therebetween. The increase of the contact resistance causes the ON voltage $V_{CE(sat)}$ (ON resistance $R_{ON}$) to increase.

Furthermore, with the miniaturization, the contact area between the P base layer 5 (P base layer 65) and the source electrode 12 (emitter electrode 72) also becomes too small. This induces conduction of a parasitic transistor in both the UMOS-IGBT and the UMOS. As shown in FIG. 42, a bipolar transistor is parasitically formed with the N+ emitter layer 66, the P base layer 65 and the N− semiconductor layer 64 in the UMOS-IGBT 80. This parasitic transistor becomes conductive when the potential of the N⁻ semiconductor layer 64 exceeds built-in potential between the P base layer 65 and the N⁺ emitter layer 66. This parasitic transistor parasitically forms a thyristor together with the original transistor existing in the UMOS-IGBT 80. Therefore, the parasitic thyristor is triggered if the parasitic transistor once becomes conductive. As a result, in the UMOS-IGBT 80, the main current can not be controlled by the gate voltage $V_{GE}$ applied to the gate electrode 70 any more. That is to say, the main current continuously flows irrespective of the gate voltage $V_{GE}$. Accordingly, the parasitic transistor becomes conductive to result in breakdown of the UMOS-IGBT 80. This can be generally said for the IGBTs.

Moreover, the same can be said for the UMOS. As shown in FIG. 40, a bipolar transistor is parasitically formed with the N⁺ emitter layer 6, the P base layer 5 and the N⁻ semiconductor layer 4 in the UMOS 40. This parasitic transistor becomes conductive when the potential of the N⁻ semiconductor layer 4 exceeds the built-in potential between the P base layer 5 and the N⁺ emitter layer 6. When this parasitic transistor becomes conductive, the main current can not be controlled by the gate voltage $V_{GE}$ applied to the gate electrode 10 any more. Accordingly, having the parasitic transistor become conductive will result in breakdown of the UMOS 40. This is common in UMOSs in general.

If the contact area between the P base layer 65 and the emitter electrode 72 decreases excessively, the contact resistance therebetween increases so that the potential of the P base layer 65 is apt to exceed the potential of the N⁺ emitter layer 66. That is, the parasitic transistor will become conductive easily. That is, the UMOS-IGBT and the UMOS have a problem that the effect of decreasing the ON voltage $V_{CE(sat)}$ can not be expected and the breakdown tolerance (which can be estimated with the magnitude of an upper limit of the main current which can be caused to flow while conduction of the parasitic transistor is avoided, for example) decreases if they are excessively miniaturized.

In the UMOS-IGBT 80 which is the second conventional example, to prevent breakdown due to the conduction of the parasitic transistor, the ratio of the contact area with the N⁺ emitter layer 66 in the entire contact area of the emitter electrode 72 is controlled to 40% or below. However, this is accompanied with a decrease in the channel region 68 because the N⁺ emitter layer 66 is in the stripe form perpendicular to the gate electrode 70 in the UMOS-IGBT 80. As a result, an increase of the ON voltage $V_{CE(sat)}$ is caused. That is, in the conventional devices, only adjusting the ratios of the contact areas with the emitter electrode 72 between the N⁺ emitter layer 66 and the P base layer 65 will not consistently realize the decrease in the ON voltage $V_{CE(sat)}$ and the enhancement of the breakdown tolerance.

Furthermore, with the UMOS-IGBT 80 as an example, quantitative evaluation on the breakdown tolerance shows the result of only 12 A/cm². This means that it is not sufficient to prevent breakdown due to conduction of the parasitic transistor to control the ratio of the contact area with the N⁺ emitter layer 66 in the entire contact area of the emitter electrode 72 to 40% or below. The procedure of this evaluation is shown below.

FIG. 43 shows a plan view of the UMOS-IGBT 80. FIG. 43 shows the upper main surface of the UMOS-IGBT 80 with the emitter electrode 72 removed therefrom, that is, the upper main surface of the semiconductor base body 60. As shown in FIG. 43, the unit cell width Wcel, the interval of the gate electrode 70, i.e., the trench interval Wt, the stripe width Wn of the N⁺ emitter layer 66 and the stripe width Wp of the P base layer 65 are defined, respectively. Furthermore, the maximum distance Lmax is defined as the distance from the exposure surface of the P base layer 65 to the farthest one of the points on an intersection of the boundary of the N⁺ emitter layer 66 and the P base layer 65 and the trench 67. This maximum distance Lmax is one factor which defines the lateral resistance in the P base layer 65 right under the N⁺ emitter layer 66. In the UMOS-IGBT 80, the maximum distance Lmax corresponds to a half of the stripe width Wn.

Also, the electric resistance Rpn of the P base layer 65 along the path defining the maximum distance Lmax is defined. The electric resistance Rpn corresponds to one which is obtained by integrating the resistivity ρ in the depth direction of the P base layer 65 in the depth direction D, the width direction W (FIG. 43) and further integrating it from zero to the maximum distance Lmax along the length direction L (FIG. 43). That is, the electric resistance $R_0$pn is given by the expression 1.

$$R_0pn = \int dL \{ \int dD \cdot \rho(L, D, W) \} \quad (1)$$

If the electric resistance and the resistivity per unit width along the width direction W is represented by Rpn, ρ(L,D), respectively, then the electric resistance Rpn is given by the expression 2.

$$R_0pn = \int dL \{ \int dD \cdot \rho(L, D) \} \quad (2)$$

Furthermore, if the integration value in the depth D direction of the resistivity ρ(L,D) is represented by the resistivity $\rho_{pn}$, then the electric resistance Rpn is given by the expression 3.

$$Rpn = \int dL \cdot \rho_{pn} \quad (3)$$

Accordingly, the electric resistance Rpn is given by the expression 4.

$$Rpn = Lmax \cdot \rho_{pn} \quad (4)$$

The hole current density Jp in the P base layer 65 right under the N⁺ emitter layer 66 causes a voltage determined by the resistivity $\rho_{pn}$ and the maximum distance Lmax at the junction portion of the P base layer 65 and the N⁺ emitter layer 66. If this voltage exceeds the built-in potential Vpn peculiar to this junction portion, the parasitic transistor becomes conductive. Therefore, the current density Jp must satisfy the condition given by the expression 5 to avoid conduction of the parasitic transistor.

$$Vpn > Jp \cdot \rho_{pn} \cdot Lmax \quad (5)$$

The resistivity $\rho_{pn}$ defines the gate threshold voltage $V_{GE(th)}$, therefore it is set to an almost constant value in semiconductor elements for electric power. The gate threshold voltage $V_{GE(th)}$ is usually set in the range of 1V to 5V, so that the impurity concentration in the P base layer 65 is about $1 \times 10^{16}$ to $1 \times 10^{17}$ cm⁻³. In this range of concentration, the resistivity $\rho_{pn}$ is in inverse proportion to the impurity concentration in the range of 50 Ωcm to 0.5 Ωcm.

If the gate threshold voltage $V_{GE(th)}$ is selected to 4 V which is a typical value, the value of the resistivity $\rho_{pn}$ is given by the expression 6.

$$\rho_{pn} \approx 25 \text{ k}\Omega\mu\text{m} = 2.5 \text{ }\Omega\text{cm} \quad (6)$$

In the UMOS-IGBT 80, as described above, the ratio of the contact area with the N⁺ emitter layer 66 in the entire contact area of the emitter electrode 72 is controlled to 40% or below. This corresponds to that the ratio of stripe width Wn and the stripe width Wp is given by the expression 7.

$$\frac{Wn}{Wn + Wp} = 0.40 \quad (7)$$

As typical and adequate values, 12 μm is given as the stripe width Wn, 18 μm is given as the stripe width Wp, and 3 μm is given as the trench interval Wt, respectively, and typically 0.6 V is given as the built-in potential Vpn, then the magnitude of the current density Jp which can be passed without having the parasitic transistor conductive is given by the expression 8.

$$Jp < \frac{0.6 \, V}{25 \, k\Omega \mu m \times 6 \times 3 \mu m} = 12 \, A/cm^2 \quad (8)$$

The current given by the current density Jp flows through the unit cell. The ratio of the hole current flowing in the P base layer 65 in the main current (collector current) flowing through the device is about 0.3. Accordingly, the magnitude J of the main current which can be caused to flow without allowing the parasitic transistor to be conductive is given by the expression 9.

$$J = 12 \, A/cm^2 \times \frac{Wn \times Wp}{(Wn + Wp) \times Wcel} \times \frac{1}{3} \quad (9)$$

$$= 12 \, A/cm^2 \times \frac{12 \times 3}{30 \times 4} \times \frac{1}{3}$$

$$= 12 \, A/cm^2$$

That is to say, in the UMOS-IGBT 80, the magnitude of the main current which can be passed while preventing conduction of the parasitic transistor is only 12 A/cm². As the rated current of IGBT for large electric power is 50 through 200 A/cm², this UMOS-IGBT 80 can not be used for the large electric power with its structure as it is.

The UMOS-IGBT 80 also has a problem that formation of the trench 67 in the semiconductor base body 60 causes internal defects of the semiconductor base body 60. This is the same in the UMOS 40, too. FIG. 44 shows such a defect. FIG. 44 is a front section view of the UMOS 40, where the defect is shown on the basis of an image obtained by using a scanning electron microscope (SEM). Similar defects are observed in the UMOS-IGBT 80, too. As shown in FIG. 44, the defect 15 is observed in the part of the semiconductor base body 20 interposed between the trenches 7. This defect 15 extends along a plane inclined by 45° from the upper main surface of the semiconductor base body 20 starting from the opening portion of the trenches 7. That is, it is considered that the defect 15 occurs along the <111> plane of the semiconductor base body 20. It is also considered that a defect is not caused from the bottom portion of the trench 7 because the bottom portion has a relatively round shape.

This defect 15 does not cause problems in practical use in the UMOS, but it causes an increase in the ON voltage $V_{CE(sat)}$ in the UMOS-IGBT. That is, if the defect 15 reaches the N⁻ semiconductor layer 64, the N⁻ semiconductor layer 64 deteriorates. In the UMOS-IGBT, as the bipolar transistor plays an important role, advance of the deterioration of the N⁻ semiconductor layer 64 will increase the ON voltage $V_{CE(sat)}$. That is, in the conventional UMOS-IGBT, it has been a problem that the decrease of the ON voltage $V_{CE(sat)}$ is hindered also by the defects caused due to the trench 67.

Further, in the UMOS, the UMOS-IGBT for electric power, to prevent excessive increase of temperature or to control overcurrent, a sense region for sensing them is often provided on the upper main surface of the semiconductor base body 60. FIG. 45 is a plan view showing the vicinity of the sense region in the UMOS-IGBT 80. FIG. 45 shows the upper main surface of the UMOS-IGBT 80 with the emitter electrode 72 removed therefrom, that is, the upper main surface of the semiconductor base body 60. As shown in FIG. 45, a sense pad 79 and a sense region 78 are formed on the upper main surface of the semiconductor base body 60 in addition to a cell region 77 in which unit cells 76 are arranged. The sense region 78 is formed of a line of unit cell. Accordingly, miniaturization of unit cells will cause signal detectable in the sense region 78 to be so small that the sensing function can not be effected sufficiently. That is, it has been a problem that it is difficult to decrease the ON voltage $V_{CE(sat)}$ maintaining the sensing function.

Furthermore, in the UMOS 40 and the UMOS-IGBT 80, even if the decrease in the ON voltage $V_{CE(sat)}$ of the element itself is realized by miniaturizing unit cells, there remains a problem that it does not contribute sufficiently to the decrease in the ON voltage $V_{CE(sat)}$ for the entire device due to the voltage drop occurring in the wire electrically connecting the emitter electrode 72 and the like and the external electrode to serve as a path of the main current.

Also, in the UMOS 40, as the trench is formed in the lattice-like form, portions where it intersects in the "+" form exist in the trenches 7. There has been a problem that it is difficult to bury the gate electrode 10 at these "+"-shaped intersections. In a device having the trench 7 formed in the stripe form such as the UMOS-IGBT 80 also has portions where it intersects in the "T" shape or "L" shape at end portions of the stripes. At these T-shaped or L-shaped intersections, it is also difficult to bury the gate electrode 70. That is, the conventional UMOS and UMOS-IGBT had a problem that it is not easy. to bury the gate electrodes 10, 70. This problem becomes more serious as the unit cells are miniaturized more.

As described above, the conventional UMOS and UMOS-IGBT have involved the problem that there exist factors for hindering a decrease in the ON voltage (ON resistance), and that it is difficult to increase the breakdown tolerance. Furthermore, they have involved the problem that it becomes more difficult to bury the gate electrodes in trenches as the unit cells are miniaturized more.

SUMMARY OF THE INVENTION

The present invention is directed to an insulated gate semiconductor device comprising a semiconductor base body having a first semiconductor layer of a first conductivity type, a second semiconductor layer of a second conductivity type provided on the first semiconductor layer and a third semiconductor layer of the first conductivity type selectively formed in an upper surface of the second semiconductor layer, the semiconductor base body having a plurality of trenches arranged substantially in the form of stripes along an upper main surface and formed from the upper main surface to the first semiconductor layer, the second semiconductor layer and the third semiconductor layer being selectively exposed on the upper main surface interposed between adjacent trenches, the trench having a gate electrode buried therein with a gate insulating film formed so as to cover an inner wall of the trench and interposed therebetween, and further comprising a first main electrode electrically connected to both of the second and third semiconductor layers selectively exposed on the upper main surface and insulated from the gate electrode and a second main electrode electrically connected to a lower main surface of the semiconductor base body. According to the present invention, in the insulated gate semiconductor device, the first main electrode is electrically connected to the upper main surface in a first region defined substantially in a zonal form along the trench in the upper main surface interposed between adjacent trenches, and the third semiconductor layer is exposed in a second region and a third region defined in the upper main surface interposed between the adjacent trenches, the third region being defined substantially in the zonal form without interruption adjacently to an inner side of the adjacent trenches and along the trench, the second region being selectively defined in a part of a region interposed between adjacent third regions.

According to the device of the present invention, since the third semiconductor layer is exposed in the second region defined in a part of the region interposed between the substantially zonal third regions, the positioning accuracy of the first region required to ensure electric connection between the third semiconductor layer and the first main electrode is relaxed. That is to say, the accuracy of positioning of mask defining the first region is relaxed. In addition, the miniaturization can be easily accomplished while the electric connection between the first main electrode and the third semiconductor layer is maintained. Furthermore, since the third semiconductor layer is formed so as to be exposed in the third region defined without interruption adjacently to the trench and along the trench, the channel region which is a part of the second semiconductor layer facing the gate electrode is formed without discontinuance along the trench. Accordingly, the device of the invention has the effect that the miniaturization is effectively utilized to decrease the ON voltage.

Preferably, in the insulated gate semiconductor device according to the present invention, the second region is defined in a bridge-like form laid between adjacent third regions.

According to the device of the present invention, the second region is defined like a bridge laid over adjacent third regions. That is, the second region is connected to both of the adjacent third regions. Accordingly, even if the position of the first region is shifted, the electric connection between the third semiconductor layer and the first main electrode is ensured. Accordingly, as the miniaturization can be further advanced while electric connection between the first main electrode and the third semiconductor layer is maintained, the ON voltage can be further decreased.

In another aspect of the present invention, in an insulated gate semiconductor device comprising a semiconductor base body having a first semiconductor layer of a first conductivity type, a second semiconductor layer of a second conductivity type provided on the first semiconductor layer and a third semiconductor layer of the first conductivity type selectively formed in an upper surface of the second semiconductor layer, the semiconductor base body having a plurality of trenches arranged substantially in the form of stripes along an upper main surface and formed from the upper main surface to the first semiconductor layer, the second semiconductor layer and the third semiconductor layer being selectively exposed on the upper main surface interposed between adjacent trenches, the trench having a gate electrode buried therein with a gate insulating film formed so as to cover an inner wall of the trench and interposed therebetween, and further comprising a first main electrode electrically connected to both of the second and third semiconductor layers selectively exposed on the upper main surface and insulated from the gate electrode and a second main electrode electrically connected to a lower main surface of the semiconductor base body, the first main electrode and the second and third semiconductors are electrically connected with a conductive layer having platinum silicide interposed therebetween.

According to the device of the present invention, since the first main electrode and the second and third semiconductor layers are electrically connected with the conductive layer having platinum silicide interposed therebetween, contact resistance therebetween is decreased. As the contact resistance of the third semiconductor and the first main electrode is decreased, ON voltage does not increase even if the contact area of the third semiconductor layer and the first main electrode is decreased due to miniaturization. That is to say, the device of the present invention has the effect of effectively making use of miniaturization to decrease the ON voltage.

Also, as the contact resistance of the second semiconductor layer and the first main electrode is decreased, a parasitic transistor does not become conductive easily. That is, it has the effect of consistently realizing the decrease in ON voltage and enhancement of breakdown tolerance.

Preferably, in the insulated gate semiconductor device according to the present invention, a contact surface between the first main electrode and the second semiconductor layer and a contact surface between the first main electrode and the third semiconductor layer are both rectangular, and a width of a side of those is in the range of 0.5 $\mu$m to 3 $\mu$m.

According to the device of the present invention, since the width of the contact surface is optimized, the effect of decreasing the contact resistance by the conductive layer having platinum silicide is considerable. Accordingly, it has the effect of consistently realizing a further decrease in On voltage and further enhancement of breakdown tolerance.

In another aspect of the present invention, in an insulated gate semiconductor device comprising a semiconductor base body having a first semiconductor layer of a first conductivity type, a second semiconductor layer of a second conductivity type provided on the first semiconductor layer and a third semiconductor layer of the first conductivity type selectively formed in an upper surface of the second semiconductor layer, the semiconductor base body having a plurality of trenches arranged substantially in the form of stripes along the upper main surface and formed from the upper main surface to the first semiconductor layer, the second semiconductor layer and the third semiconductor layer being selectively exposed on the upper main surface interposed between adjacent trenches, the trench having a gate electrode buried therein with a gate insulating film formed so as to cover an inner wall of the trench and interposed therebetween, and further comprising a first main electrode electrically connected to both of the second and third semiconductor layers selectively exposed on the upper main surface and insulated from the gate electrode and a second main electrode electrically connected to a lower main surface of the semiconductor base body, shape of the third semiconductor layer is set so that a maximum distance Lmax defined as a distance to an imaginary point which is farthest from the exposure surface of the second semiconductor layer in the upper main surface among imaginary points on an intersection of a boundary plane of the third semiconductor layer and the second semiconductor layer, and the trench is given by Vpn>Jpr×$\rho_{pn}$×Lmax for built-in potential Vpn peculiar to a junction portion of the second semiconductor layer and the third semiconductor layer, density Jpr of current flowing in the second semiconductor layer right under the third semiconductor layer when main current with a magnitude corresponding to rated current of the device is passed between the first main electrode and the second main electrode, and resistivity $\rho_{pn}$ of the second semiconductor layer right under the third semiconductor layer.

According to the device of the present invention, since the shape of the third semiconductor layer is set so that the relation Vpn>Jpr×$\rho_{pn}$×Lmax is satisfied, a bias voltage occurring at a junction portion between the second semiconductor layer and the third semiconductor layer does not exceed the built-in potential Vpn when the main current with the magnitude corresponding to the rated current is caused to flow to the device. Accordingly, it has the effect of being capable of passing the rated current to the device without incurring conduction of the parasitic transistor.

In another aspect of the present invention, in an insulated gate semiconductor device comprising a semiconductor base body having a first semiconductor layer of a first conductivity type, a second semiconductor layer of a second conductivity type provided on the first semiconductor layer and a third semiconductor layer of the first conductivity type selectively formed in an upper surface of the second semiconductor layer, the semiconductor base body having a plurality of trenches arranged substantially in the form of stripes along an upper main surface and formed from the upper main surface to the first semiconductor layer, the second semiconductor layer and the third semiconductor layer being selectively exposed on the upper main surface interposed between adjacent trenches, the trench having a gate electrode buried therein with a gate insulating film formed so as to cover an inner wall of the trench and interposed therebetween, and further comprising a first main electrode electrically connected to both of the second and third semiconductor layers selectively exposed on the upper main surface and insulated from the gate electrode and a second main electrode electrically connected to a lower main surface of the semiconductor base body, shape of the third semiconductor layer is set so that a maximum distance Lmax defined as a distance to an imaginary point which is farthest from the exposure surface of the second semiconductor layer in the upper main surface among imaginary points on an intersection of a boundary plane of the third semiconductor layer and the second semiconductor layer, and the trench is given by Vpn>n×Jpr×$\rho_{pn}$×Lmax for built-in potential Vpn peculiar to a junction portion of the second semiconductor layer and the third semiconductor layer, density Jpr of current flowing in the second semiconductor layer right under the third semiconductor layer when main current with a magnitude corresponding to rated current of the device is passed between the first main electrode and the second main electrode, a ratio n of the rated current and a magnitude of the main current when short-circuit load is connected between the first main electrode and the second main electrode, and resistivity $\rho_{pn}$ of the second semiconductor layer right under the third semiconductor layer.

According to the device of the present invention, since the shape of the third semiconductor layer is set so that the relation Vpn>n×Jpr×$\rho_{pn}$×Lmax is satisfied, a bias voltage occurring at the junction portion between the second semiconductor layer and the third semiconductor layer does not exceed the built-in potential Vpn when the main current is caused to flow with load of the device shorted. Accordingly, the device of the invention has the effect of being capable of passing short-circuit current to the device without incurring conduction of the parasitic transistor.

In another aspect of the present invention, in an insulated gate semiconductor device comprising a semiconductor base body having a first semiconductor layer of a first conductivity type, a second semiconductor layer of a second conductivity type provided on the first semiconductor layer and a third semiconductor layer of the first conductivity type selectively formed in an upper surface of the second semiconductor layer, the semiconductor base body having a plurality of trenches arranged substantially in the form of stripes along an upper main surface and formed from the upper main surface to the first semiconductor layer, the second semiconductor layer and the third semiconductor layer being selectively exposed on the upper main surface interposed between adjacent trenches, the trench having a gate electrode buried therein with a gate insulating film formed so as to cover an inner wall of the trench and interposed therebetween, and further comprising a first main electrode electrically connected to both of the second and third semiconductor layers selectively exposed on the upper main surface and insulated from the gate electrode and a second main electrode electrically connected to a lower main surface of the semiconductor base body, it further comprises overcurrent protection means for limiting magnitude of main current flowing between the first main electrode and the second main electrode so as not to exceed a predetermined limit current value, and shape of the third semiconductor layer is set so that a maximum distance Lmax defined as a distance to an imaginary point which is farthest from the exposure surface of the second semiconductor layer in the upper main surface among imaginary points on an intersection of a boundary plane of the third semiconductor layer and the second semiconductor layer, and the trench is given by Vpn>n×Jpr×$\rho_{pn}$×Lmax for built-in potential Vpn peculiar to a junction portion of the second semiconductor layer and the third semiconductor layer, density Jpr of current flowing in the second semiconductor layer right under the third semiconductor layer when main current with a magnitude corresponding to rated current of the device is passed between the first main electrode and the second main electrode, a ratio m of the limit current value and the rated current, and resistivity $\rho_{pn}$ of the second semiconductor layer right under the third semiconductor layer.

According to the device of the present invention, as the overcurrent protection means is provided, the magnitude of the main current does not exceed the limit current value if the main current is caused to flow with the load of the device shorted. Furthermore, since the shape of the third semiconductor layer is set so that the relation Vpn>m×Jpr×$\rho_{pn}$×Lmax is satisfied, a bias voltage occurring at the junction portion between the second semiconductor layer and the third semiconductor layer does not exceed the built-in potential Vpn when the main current is caused to flow with the load of the device shorted. Accordingly, the device of the invention has the effect of being capable of passing the short-circuit current to the device without incurring conduction of the parasitic transistor. Furthermore, since the short-circuit current is limited by the overcurrent protection means, it has the effect that conditions for the maximum distance Lmax are relaxed as compared with devices having no overcurrent protection circuit.

In another aspect of the present invention, in an insulated gate semiconductor device comprising a semiconductor base body having a first semiconductor layer of a first conductivity type, a second semiconductor layer of a second conductivity type provided on the first semiconductor layer and a third semiconductor layer of the first conductivity type selectively formed in an upper surface of the second semiconductor layer, the semiconductor base body having a plurality of trenches arranged substantially in the form of stripes along an upper main surface and formed from the upper main surface to the first semiconductor layer, the second semiconductor layer and the third semiconductor layer being selectively exposed on the upper main surface interposed between adjacent trenches, the trench having a gate electrode buried therein with a gate insulating film formed so as to cover an inner wall of the trench and interposed therebetween, and further comprising a first main electrode electrically connected to both of the second and third semiconductor layers selectively exposed on the upper main surface and insulated from the gate electrode and a second main electrode electrically connected to a lower main surface of the semiconductor base body, the upper main surface of the semiconductor base body is along a <100> crystal plane, and a thickness of the second semiconductor layer and shape of the plurality of trenches are set so that a boundary of the first semiconductor layer and the second semiconductor layer is located below an intersection of an imaginary plane including an opening end of the trench in the upper main surface and inclined by an inclination angle of 45° with respect to the upper main surface and a wall surface of the trench adjacent to that trench.

According to the device of the present invention, since the upper main surface of the semiconductor base body is along the <100> crystal plane, a defect starting from the opening end of the trench is transmitted along the <111> crystal plane, i.e., an imaginary plane inclined by an inclination angle of 45° with respect to the upper main surface and the transmission stops at the intersection of this imaginary plane and the wall surface of a trench adjacent to it. Furthermore, since the boundary of the first semiconductor layer and the second semiconductor layer is located below this intersection, the transmission of defect does not reach the first semiconductor layer. That is, even if a defect occurs in the semiconductor base body, it does not invade the first semiconductor layer. Accordingly, the device of the invention has the effect of suppressing the increase in ON voltage due to deterioration of the first semiconductor layer because deterioration of the first semiconductor layer is not promoted by the defect.

In another aspect of the present invention, an insulated gate semiconductor device in which a plurality of insulated gate semiconductor elements having trench.gate are arranged substantially in a stripe form in a single semiconductor base body comprises sensing means for detecting magnitude of main current of the device or temperature of the semiconductor base body, the sensing means having a plurality of the insulated gate semiconductor elements.

According to the device of the present invention, since the sensing means has a plurality of elements, an output signal of the entire sensing means can be maintained high even if the strength of the output signal of a single element is decreased with miniaturization of the elements. That is, the device of the invention has the effect that ensured sensing function and the decrease of ON voltage with miniaturization can be realized consistently.

In another aspect of the present invention, in an insulated gate semiconductor device in which a plurality of insulated gate semiconductor elements having trench.gate and having the same structure are arranged substantially in a stripe form in a single semiconductor base body, a plurality of interconnections for electrically coupling a main electrode connected to one main surface of the semiconductor base body and an external electrode are connected to the main electrode, and each of the interconnections is connected per each of a plurality of unit regions imaginarily defined by nearly equally dividing along the main surface a region occupied by the plurality of insulated gate semiconductor elements in the semiconductor base body.

According to the present invention, since the plurality of insulated gate semiconductor elements with the same structure are arranged at equal intervals, main current with a magnitude equal to each other flows to a unit region imaginarily defined by equally dividing the region occupied by the insulated gate semiconductor elements. Further, since each of the interconnections is connected for each unit region defined by nearly equal imaginary division, the longest distance of a path of the main current from the connection portion of each interconnection to the insulated gate semiconductor element becomes almost the minimum. As a result, the voltage drop caused in the main electrode by the main current becomes almost the lowest under condition of constant number of interconnections. Accordingly, it has the effect that the effect of decreasing the ON voltage of the element itself with miniaturization of the insulated gate semiconductor element effectively serves for decrease of ON voltage in the entire device.

Preferably, in the insulated gate semiconductor device according to the present invention, each of the plurality of interconnections is connected per unit region with an area in the range of 2 mm$^2$ to 4 mm$^2$.

According to the device of the present invention, the area of the unit region where the main current is allotted to a single interconnection is optimized. That is, the number of the interconnections is optimized, so that the voltage drop in the interconnection and the main electrode is low enough as compared with the ON voltage of the insulated gate semiconductor element itself. Accordingly, it has the effect that decreasing the ON voltage of the element itself with miniaturization of the insulated gate semiconductor element can be effectively utilized in decreasing the ON voltage in the entire device.

In another aspect of the present invention, in an insulated gate semiconductor device in which a plurality of insulated gate semiconductor elements having trench.gate are arranged substantially in a linear stripe form in a single semiconductor base body, an interconnection for electrically coupling a main electrode connected to a main surface on a side where the trench.gate is formed in the semiconductor base body and an external electrode is connected to the main electrode, and the interconnection is connected so that a direction of the interconnection and a direction of the insulated gate semiconductor element intersect at an angle in the range of 20° to 160°.

According to the device of the present invention, since the direction of the interconnection and the direction of the insulated gate semiconductor elements intersect at the most suitable angle, there is an effect that the trouble of short-circuit between the interconnection and the gate electrode does not take place easily.

In another aspect of the present invention, in an insulated gate semiconductor device in which a plurality of insulated gate semiconductor elements having trench.gate are arranged substantially in a stripe form in a single semiconductor base body, each of the insulated gate semiconductor elements is formed in a linear form or in a smooth curve-like form, and accordingly the trench.gate which belongs to the element is formed in the linear or smooth curve-like form along the element and is formed so as not to intersect the trench.gate which belongs to another insulated gate semiconductor element.

According to the device of the present invention, since the trench gate which belongs to each insulated gate semiconductor element is formed in a linear or smooth curve-like form and does not intersect a trench gate which belongs to another element, there exist no bending portions of "L"-form and no intersecting portions of forms of "+", "T" or the like in the trench gate. Accordingly, it has the effect that the gate electrode can be buried in the trench easily.

The present invention is also directed to a method of manufacturing an insulated gate semiconductor device in which a plurality of insulated gate semiconductor elements having trench.gate are arranged substantially in a stripe form in a single semiconductor base body. According to the present invention, the method comprises the steps of (a) preparing a semiconductor base body defining an upper main surface and a lower main surface and having a first semiconductor layer of a first conductivity type exposed on the upper main surface, (b) forming a second semiconductor layer of a second conductivity type exposed on the upper main surface of the semiconductor base body in an upper surface portion of the first semiconductor layer by introducing impurity of the second conductivity type in the upper main surface of the semiconductor base body, (c) forming a first mask selectively covering the upper surface so that the upper main surface of the semiconductor base body is exposed in a lattice-like form, (d) selectively introducing impurity of the first conductivity type in the upper main surface of the semiconductor base body using the first mask as a shield to selectively form a third semiconductor layer of the first conductivity type exposed on the upper main surface in the lattice-like form in the upper surface portion of the second semiconductor layer, (e) removing the first mask, (f) after the step (e), forming a second mask which opens in a stripe form along the lattice-like exposed surface of the third semiconductor layer and opens inside a width direction end portion of the lattice-like exposed surface on the upper main surface of the semiconductor base body, (g) selectively carrying out etching from the upper main surface of the semiconductor base body using the second mask as a shield to form a stripe-like trench reaching the first semiconductor layer right under an opening of the second mask, (h) removing the second mask, (i) after the step (h), forming a first insulating film covering an inner wall of the trench and the upper main surface of the semiconductor base body, (j) burying a gate electrode in the trench covered with the first insulating film, (k) forming a second insulating film on the first insulating film and the gate electrode, (l) forming a third mask opening substantially in a zonal form separately from the trench and along the trench on the upper main surface of the semiconductor base body interposed between adjacent stripe-like trenches, (m) selectively carrying out etching of the second insulating film using the third mask as a shield to selectively remove the second insulating film, (n) removing the third mask, (o) after the step (n), forming a first conductor to cover the second insulating film and the portion from where it is removed, and (p) forming a second conductor on the lower main surface of the semiconductor base body.

According to the manufacturing method of the present invention, it has the effect that an insulated gate semiconductor device in which the third semiconductor layer is exposed in the ladder-like form adjacent to the trench gate in the upper main surface of the semiconductor base body interposed between trench gates arranged in the stripe form can be manufactured easily.

In another aspect of the present invention, a method of manufacturing an insulated gate semiconductor device in which a plurality of insulated gate semiconductor elements having trench.gate are arranged substantially in a stripe form in a single semiconductor base body comprises the steps of (a) preparing a semiconductor base body defining an upper main surface and a lower main surface and having a first semiconductor layer of a first conductivity type exposed on the upper main surface, (b) forming a second semiconductor layer of a second conductivity type exposed on the upper main surface of the semiconductor base body in an upper surface portion of the first semiconductor layer by introducing impurity of the second conductivity type in the upper main surface of the semiconductor base body, (c) forming a first mask selectively covering the upper main surface of the semiconductor base body, (d) selectively introducing impurity of the first conductivity type in the upper main surface of the semiconductor base body using the first mask as a shield to selectively form a third semiconductor layer of the first conductivity type selectively exposed on the upper main surface in the upper surface portion of the second semiconductor layer, (e) removing the first mask, (f) after the step (e), forming a second mask which opens in a stripe form on the upper main surface of the semiconductor base body, (g) selectively carrying out etching from the upper main surface of the semiconductor base body using the second mask as a shield to form a stripe-like trench reaching the first semiconductor layer right under an opening of the second mask, (h) removing the second mask, (i) after the step (h), forming a first insulating film covering an inner wall of the trench and the upper main surface of the semiconductor base body, (j) burying a gate electrode in the trench covered with the first insulating film, (k) forming a second insulating film on the first insulating film and the gate electrode, (l) forming a third mask opening substantially in a zonal form separately from the trench and along the trench on the upper main surface of the semiconductor base body interposed between adjacent stripe-like trenches, (m) selectively carrying out etching of the second insulating film using the third mask as a shield to selectively remove the second insulating film, (n) removing the third mask, (o) after the step (n), selectively introducing element containing platinum into the upper main surface of the semiconductor base body using the second insulating film as a shield to selectively form a conductive layer having platinum silicide on the upper main surface potion of the semiconductor base body, (p) forming a first conductor to cover the second insulating film and the portion from where it is removed, and (q) forming a second conductor on the lower main surface of the semiconductor base body.

According to the manufacturing method of the present invention, it has the effect that the insulated gate semiconductor device having a conductive layer of platinum silicide between the semiconductor base body and the main electrode can be manufactured easily.

In another aspect of the present invention, a method of manufacturing an insulated gate semiconductor device in which a plurality of insulated gate semiconductor elements having trench.gate are arranged substantially in a stripe form in a single semiconductor base body comprises the steps of (a) preparing a semiconductor base body defining an upper main surface and a lower main surface and having a first semiconductor layer of a first conductivity type exposed on the upper main surface, (b) forming, in the upper surface portion of the first semiconductor layer, a second semiconductor layer of a second conductivity type exposed on the upper main surface of the semiconductor base body by introducing impurity of the second conductivity type in the upper main surface of the semiconductor base body, (c) forming a first mask selectively covering the upper main surface of the semiconductor base body, (d) selectively introducing impurity of the first conductivity type in the upper main surface of the semiconductor base body using the first mask as a shield to selectively form a third semiconductor layer of the first conductivity type selectively exposed on the upper main surface in the upper surface portion of the second semiconductor layer, (e) removing the first mask, (f) after the step (e), forming a second mask which opens in the stripe form on the upper main surface of the semiconductor base body, (g) selectively carrying out etching from the upper main surface of the semiconductor base body using the second mask as a shield to form a stripe-like trench reaching the first semiconductor layer right under an opening of the second mask, (h) removing the second mask, (i) after the step (h), forming a first insulating film covering an inner wall of the trench and the upper main surface of the semiconductor base body, (j) providing a polysilicon layer so as to fill the trench covered with the first insulating film and to have a predetermined or larger thickness above the upper main surface of the semiconductor base body covered with the first insulating film, (k) applying etching to the upper surface of the polysilicon layer to adjust the thickness from the upper main surface of the semiconductor base body to a predetermined magnitude, (l) forming a third mask having a predetermined pattern on the upper surface of the polysilicon layer with the adjusted thickness, (m) selectively applying etching to the polysilicon layer using the third mask as a shield to remove the polysilicon layer except a portion buried in the trench which functions as a gate electrode and a portion covered with the third mask which functions as a gate interconnection, (n) removing the third mask, (o) after the step (n), forming a second insulating film on the first insulating film and the gate electrode, (p) forming a fourth mask opening substantially in a zonal form separated from the trench and along the trench on the upper main surface of the semiconductor base body interposed between adjacent stripe-like trenches, (q) selectively applying etching to the second insulating film using the fourth mask as a shield to selectively remove the second insulating film, (r) removing the fourth mask, (s) after the step (r), forming a first conductor to cover the second insulating film and a portion from where it is removed, and (t) forming a second conductor on the lower main surface of the semiconductor base body.

According to the manufacturing method of the present invention, the insulated gate semiconductor device in which the gate interconnection is formed of polysilicon together with the gate electrode can be manufactured easily.

In another aspect of the present invention, a method of manufacturing an insulated gate semiconductor device in which a plurality of insulated gate semiconductor elements having trench.gate are arranged substantially in a stripe form in a single semiconductor base body comprises the steps of (a) preparing a semiconductor base body defining an upper main surface and a lower main surface and having a first semiconductor layer of a first conductivity type exposed on the upper main surface, (b) forming, on the upper surface portion of the first semiconductor layer, a second semiconductor layer of a second conductivity type exposed on the upper main surface of the semiconductor base body by introducing impurity of the second conductivity type in the upper main surface of the semiconductor base body, (c) forming a first mask selectively covering the upper main surface of the semiconductor base body, (d) selectively introducing impurity of the first conductivity type in the upper main surface of the semiconductor base body using the first mask as a shield to selectively form a third semiconductor layer of the first conductivity type selectively exposed on the upper main surface in the upper surface portion of the second semiconductor layer, (e) removing the first mask, (f) after the step (e), forming a second mask which opens in the stripe form on the upper main surface of the semiconductor base body, (g) selectively carrying out etching from the upper main surface of the semiconductor base body using the second mask as a shield to form a stripe-like trench reaching the first semiconductor layer right under an opening of the second mask, (h) removing the second mask, (i) after the step (h), forming a first insulating film covering an inner wall of the trench and the upper main surface of the semiconductor base body, (j) providing a polysilicon layer so as to fill the trench covered with the first insulating film and to have a predetermined or larger thickness above the upper main surface of the semiconductor base body covered with the first insulating film, (k) forming a third mask having a predetermined pattern on the upper surface of the polysilicon layer, (l) selectively applying etching to the polysilicon layer using the third mask as a shield to remove the polysilicon layer except a portion buried in the trench which functions as a gate electrode and a portion covered with the third mask which functions as a gate interconnection, (m) removing the third mask, (n) after the step (m), forming a second insulating film on the first insulating film and the gate electrode, (o) forming a fourth mask opening substantially in a zonal form separated from the trench and along the trench on the upper main surface of the semiconductor base body interposed between the adjacent stripe-like trenches, (p) selectively applying etching to the second insulating film using the fourth mask as a shield to selectively remove the second insulating film, (q) removing the fourth mask, (r) after the step (q), forming a first conductor to cover the second insulating film and a portion from where it is removed, and (s) forming a second conductor on the lower main surface of the semiconductor base body.

According to the manufacturing method of the present invention, it has the effect that the insulated gate semiconductor device in which the gate interconnection is formed of polysilicon together with the gate electrode can be formed easily.

Accordingly, it is an object of the present invention to obtain an insulated gate transistor with low ON voltage and high breakdown tolerance in which the gate can be buried easily, and further to provide a method suitable for manufacturing this insulated gate transistor.

These and other objects, features, aspects and advantages of the present invention will become more apparent from the following detailed description of the present invention when taken in conjunction with the accompanying drawings.

DESCRIPTION OF THE PREFERRED EMBODIMENTS

<Entire Structure of Device of Preferred Embodiment>

First, the entire structure of the UMOS-IGBTs and the UMOSs considered in the preferred embodiments and the entire structure of the products incorporating these devices will be described.

Figure 2:
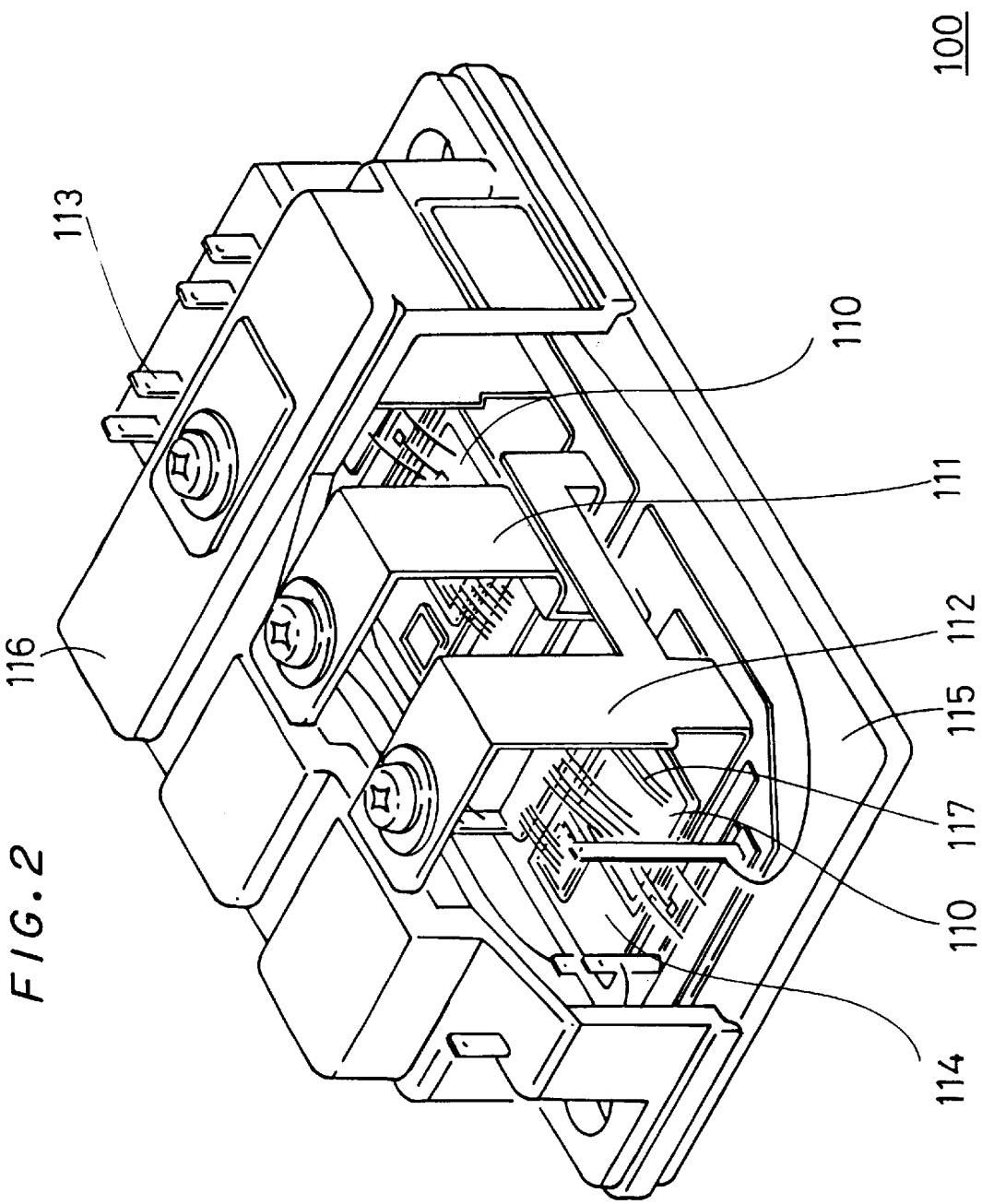
FIG. 2 is a fragmentary perspective view of a product incorporating the UMOS-IGBT of the preferred embodiment of the present invention.

FIG. 2 is a fragmentary perspective view showing an example of the entire structure of a product incorporating a device of the preferred embodiment. This device 100 incorporates a UMOS-IGBT 110 for electric power as a semiconductor chip. This device 100 is made for large electric power. The UMOS-IGBT 110 is fixed on a board 114, which is fixed on a radiation board 115. The UMOS-IGBT 110 is accommodated in a frame 116. One ends of an external collector electrode 111, an external emitter electrode 112 and an external gate electrode 113 are exposed outside the frame 116. These electrodes are electrically connected to a collector electrode, an emitter electrode and a gate electrode (not shown) of the UMOS-IGBT 110, respectively. The collector electrode and the gate electrode and the external electrodes thereof are electrically connected through aluminum wire 117, for example.

Figure 3:
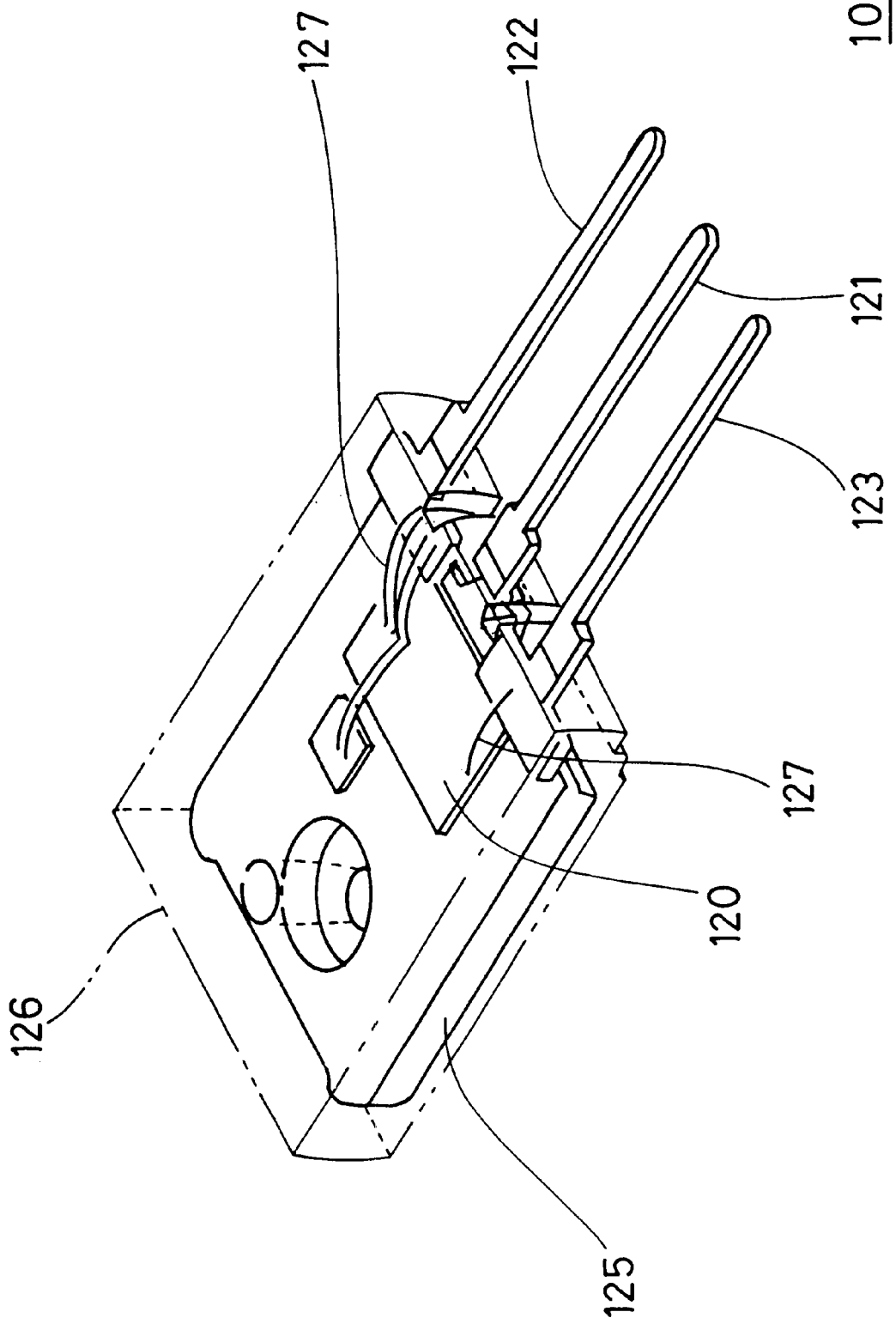
FIG. 3 is a perspective view of a product incorporating the UMOS-IGBT of the preferred embodiment of the present invention.

FIG. 3 is a perspective view showing an example of a device incorporating a UMOS-IGBT 120 for intermediate electric power with rated power lower than that of the device of FIG. 2. FIG. 3 is depicted with the mold resin removed, where the mold resin is shown with the chain double-dashed line. In this device 101, the UMOS-IGBT 120 is fixed on a copper frame 125 which serves as a reinforce material and radiation board. The UMOS-IGBT 120 is sealed with mold resin 126. One ends of an external collector electrode 121, an external emitter electrode 122 and an external gate electrode 123 are exposed outside the mode resin 126. These electrodes are electrically connected to a collector electrode, an emitter electrode and a gate electrode (not shown) of the UMOS-IGBT 120, respectively. The collector electrode and the gate electrode are electrically connected to these external electrodes through aluminum wires 127, for example.

Figure 4:
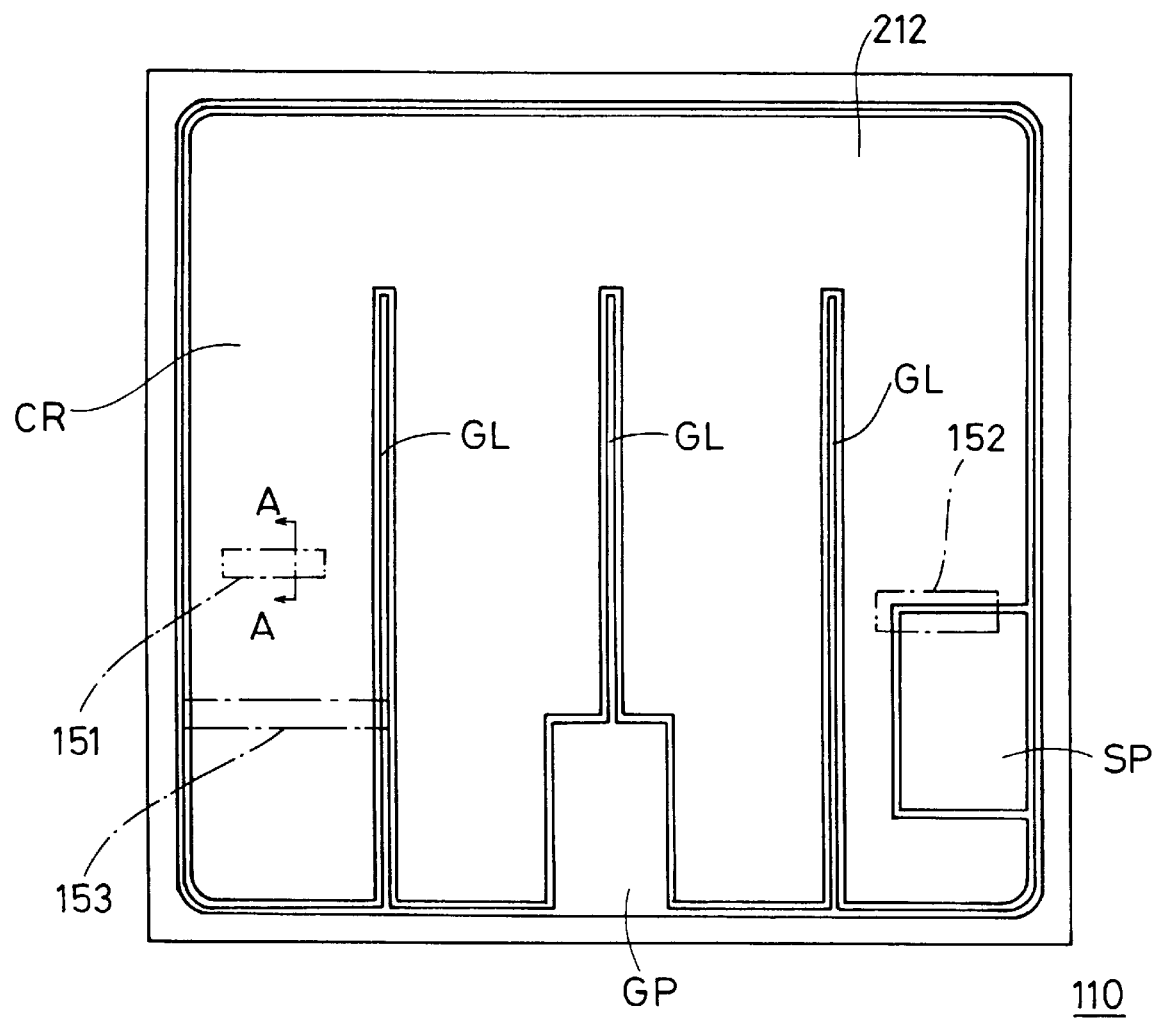
FIG. 4 is a top view of the UMOS-IGBT of the preferred embodiment of the present invention.

FIG. 4 is a plan view of the UMOS-IGBT 110. The UMOS-IGBT 120 can also have the same structure. As shown in FIG. 4, a rectangular gate pad GP is provided so as to be adjacent to the center of one side on the upper surface of the UMOS-IGBT 110, and an integrally formed gate interconnection GL is connected to the gate pad GP. The gate interconnection GL is provided along the periphery of the upper surface of the UMOS-IGBT 110 protruding like a comb from one side toward the opposite side.

A sense pad SP is provided in a part of the region surrounded by the gate interconnection GL. An emitter electrode 212 is formed all over the region surrounded by the gate interconnection GL except the sense pad SP. Though not shown in the figure, a large number of unit cells comprised of IGBT elements are arranged in the stripe form perpendicular to the comb-like gate interconnection GL under the emitter electrode 212 (the deeper side in FIG. 4). The region where these unit cells are arranged is referred to as a "cell region CR". The gate interconnection GL, the gate pad GP and the sense pad SP are formed of conductor such as aluminum.

In the description above, though the UMOS-IGBTs were considered as examples, it is the same in the UMOSs.

<First Preferred Embodiment>

Figure 1:
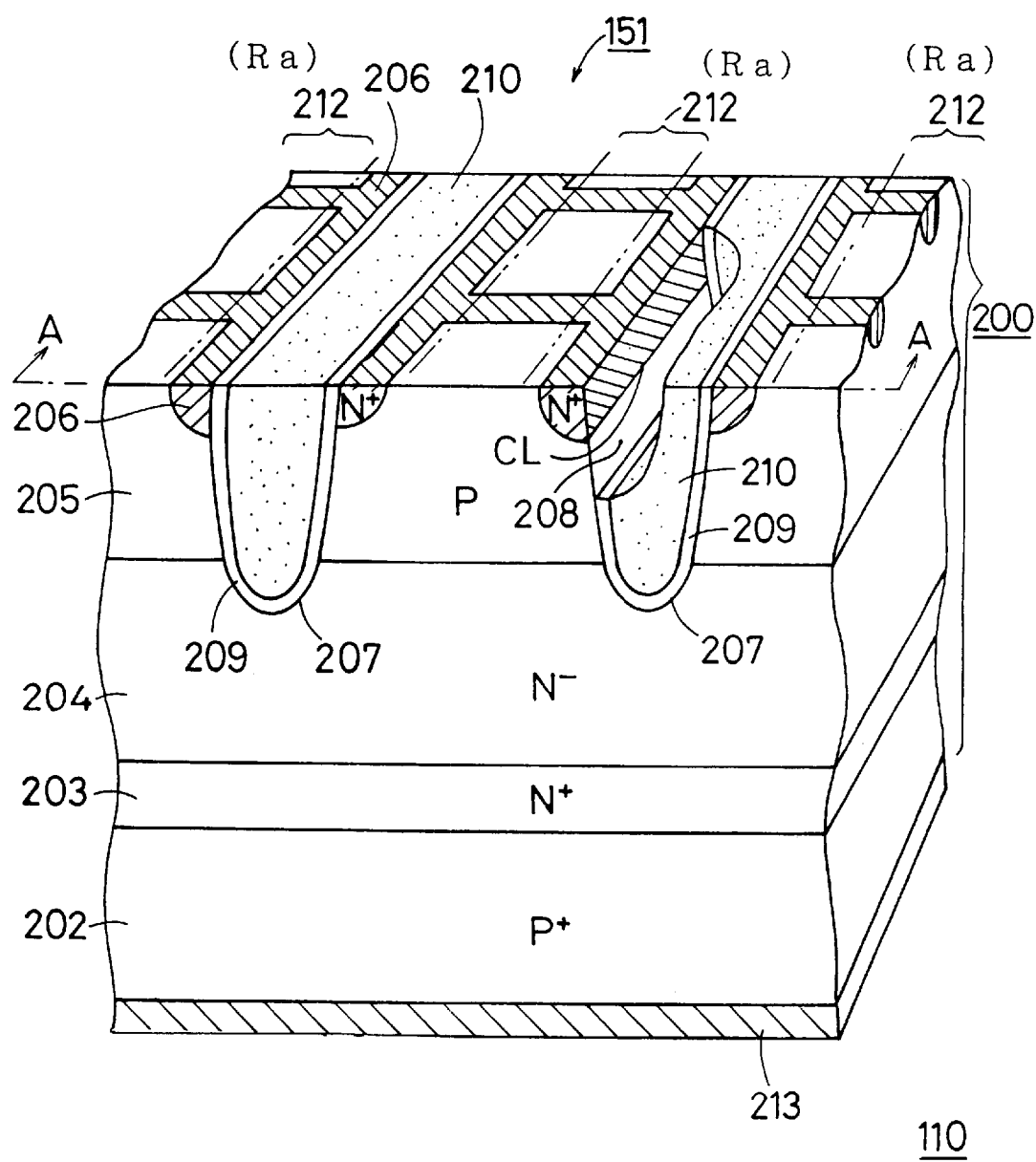
FIG. 1 is a cross-sectional perspective view of a UMOS-IGBT of a preferred embodiment of the present invention.
Figure 5:
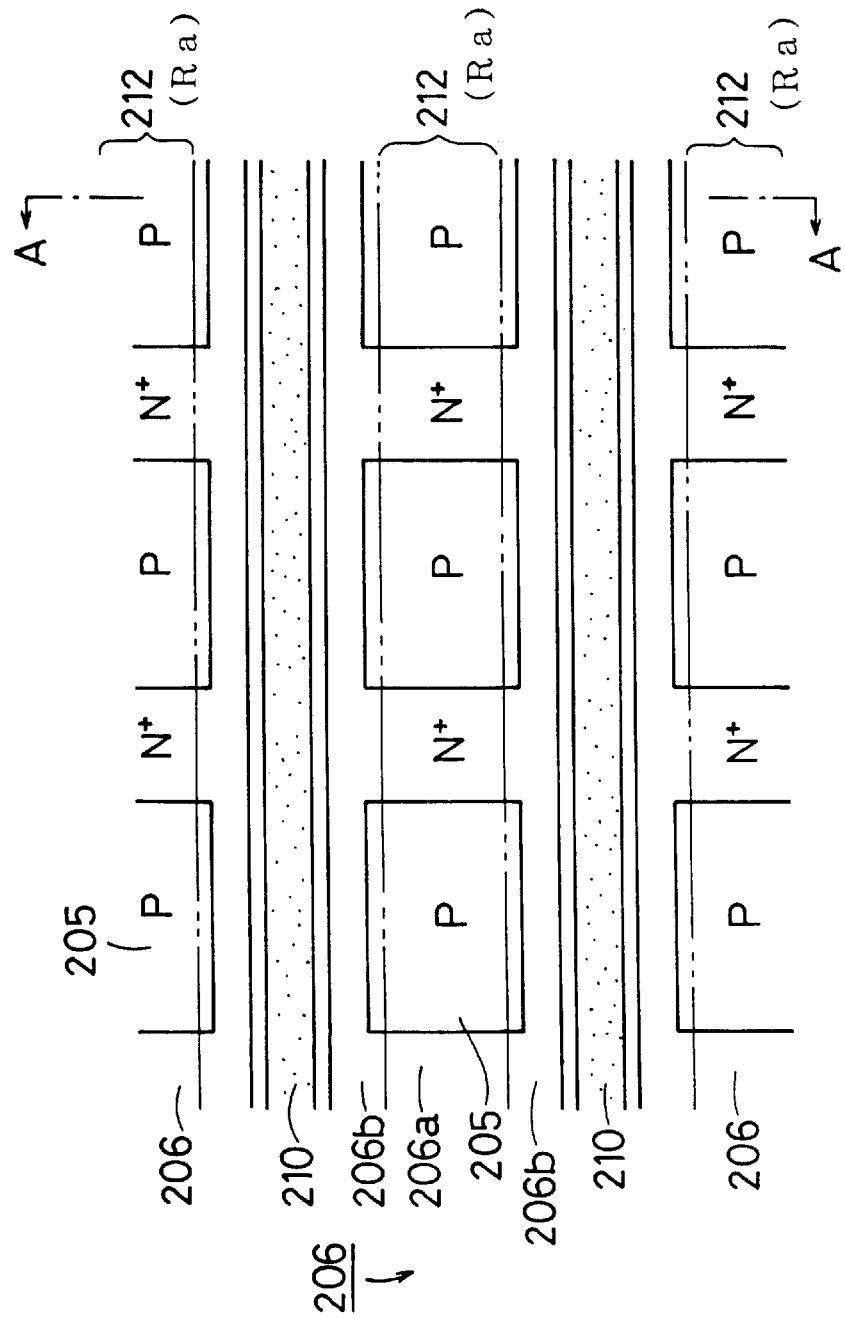
FIG. 5 is a fragmentary plan view of the UMOS-IGBT of the preferred embodiment of the present invention.

Next, the first preferred embodiment of the present invention will be described. FIG. 1 is a cross-sectional perspective view showing a part corresponding to right under the partial region 151 (FIG. 4) of the cell region CR in the UMOS-IGBT 110 in an enlarged form. FIG. 5 is a plan view of the region 151. The line A—A (FIG. 4) across the region 151 is shown in FIG. 1 and FIG. 5, too.

These FIG. 1 and FIG. 5 show two lines of unit cells. As shown in FIG. 1, in the UMOS-IGBT 110, an N$^+$ buffer layer 203 containing N-type impurity of a high concentration is formed on a semiconductor substrate constituting a P$^+$ collector layer 202 containing P-type impurity of a high concentration, and an N$^-$ semiconductor layer (first semiconductor layer) 204 containing N-type impurity of a low concentration is formed on the N$^+$ layer 203. On the N$^-$ semiconductor layer 204, a P base layer (second semiconductor layer) 205 is formed by diffusing P-type impurity. Further, an N$^+$ emitter layer (third semiconductor layer) 206 is selectively formed by selectively diffusing N-type impurity of a high concentration on the upper main surface of the P base layer 205. These five semiconductor layers form the flat board like semiconductor base body 200.

Trenches 207 are formed in the upper main surface of the semiconductor base body 200. The trenches 207 are formed in the stripe form perpendicular to the comb-like gate interconnection GL (FIG. 4). The N$^+$ emitter layer 206 is formed so as to be exposed in the ladder-like form on the upper main surface of the P base layer 205 interposed by the trenches 207. The trench 207 passes through the N$^+$ emitter layer 206 and the P base layer 205 from the upper main surface of the semiconductor base body 200 to reach the N$^-$ semiconductor layer 204. A gate insulating film 209 is formed on the inner wall of the trench 207, and a gate electrode (trench gate) 210 formed of polysilicon is buried therein. The region of the P base layer 205 facing the gate electrode 210 and interposed between the N$^+$ emitter layer 206 and the N$^-$ semiconductor layer 204 functions as a channel region 208.

A collector electrode 213 is formed on the lower main surface of the semiconductor base body 200, that is, on the lower main surface of the P$^+$ collector layer 202. On the upper main surface of the semiconductor base body 200, an emitter electrode (first main electrode) 212 is connected to the N$^+$ emitter layer 206 and the P base layer 205. In FIG. 1 and FIG. 5, the boundary lines of the zonal region (first region) Ra to which the emitter electrode 212 is connected are represented by the chain double-dashed lines.

When using this UMOS-IGBT 110, first, an external power source is connected to apply a collector voltage $V_{CE}$ in the positive direction between the collector electrode 213 and the emitter electrode 212. In this condition, a gate voltage $V_{GE}$ exceeding a predetermined gate threshold voltage $V_{GE(th)}$ is applied in the positive direction between the gate electrode 210 and the emitter electrode 212 (that is, the gate is turned on), and then the P-type channel region 208 is inverted into the N-type to form an N-type channel in the channel region 208. Electrons are injected into the N$^-$ semiconductor layer 204 from the emitter electrode 212 via the N$^+$ emitter layer 206. These injected electrons cause forward bias between the P$^+$ collector layer 202 and the N$^-$ semiconductor layer 204 (including the N$^+$ buffer layer 203) and then holes are injected from the P$^+$ collector layer 202 to the N$^-$ semiconductor layer 204. As a result, the resistance of the N$^-$ semiconductor layer 204 largely decreases and then large main current (collector current) flows from the collector electrode 213 to the emitter electrode 212.

Next, the gate voltage $V_{GE}$ is returned to zero or a minus (backward bias) value (i.e., the gate is turned off), and then the channel formed in the channel region 208 disappears and the channel region 208 returns to the original P-type conductivity type. As a result, the injection of electrons from the emitter electrode 212 is stopped, and then the injection of holes from the P$^+$ collector layer 202 is also stopped. Subsequently, the electrons and holes remaining in the N$^-$ semiconductor layer 204 (and the N$^+$ buffer layer 203) are recovered to the collector electrode 213 and the emitter electrode 212, respectively, or are bonded with each other again.

In the UMOS-IGBT 110, as the N$^+$ emitter layer 206 is exposed in the ladder-like form on the upper main surface of the semiconductor base body 200 interposed between the trenches 207, the electric contact between the N$^+$ emitter layer 206 and the emitter electrode 212 is ensured even if the position of the zonal region Ra (the chain double-dashed line in the figure) which is a contact surface between the emitter electrode 212 and the upper main surface of the semiconductor base body 200 is shifted. This is because the overlapping portion with the "cross-bar region" (second region) 206a corresponding to the cross-bars of the N$^+$ emitter layer 206 exposed in the ladder-like form exists in the zonal region Ra irrespective of the position.

Also, electric contact with the emitter electrode 212 is similarly ensured for the exposed rectangular surface of the P base layer 205 surrounded by the exposed surface of the ladder-like N+ emitter layer 206. Accordingly, the redundant designing is not required, resulting in the advantage that the miniaturization of unit cells is easy to be accomplished.

Furthermore, as the "zonal region" (third region) 206b of the N+ emitter layer 206 constituting the "ladder" with the cross-bar region 206a is formed along the trench 207, the channel region 208 is continuously formed along the gate electrode 210. Accordingly, the UMOS-IGBT 110 is advantageous in that the miniaturization of unit cells can effectively be utilized for decrease of the ON voltage $V_{CE(sat)}$.

The exposed surface of the N+ emitter layer 206 does not necessarily have to be "ladder"-shaped. For example, if it is formed so as to be exposed in the region along both sides of the trench 207 such as the zonal region 206b and a part of the region interposed therebetween, the accuracy of position of the zonal region Ra is relaxed. Also, the shape of the exposed surface of the N+ emitter layer 206 described in this preferred embodiment has the same effect in the UMOS, for example.

<Second Preferred Embodiment>

Figure 6:
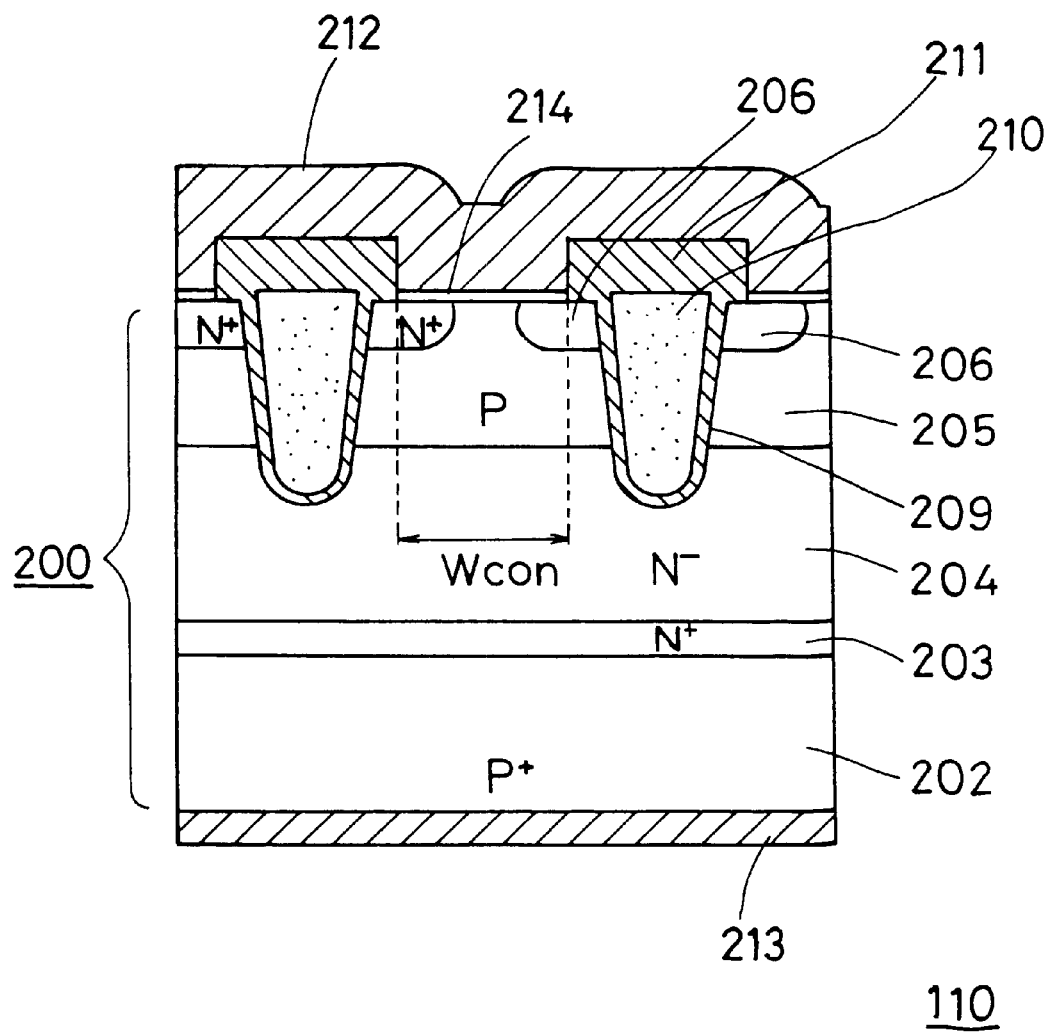
FIG. 6 is a front sectional view of the UMOS IGBT of the preferred embodiment of the present invention.

In this second preferred embodiment, the structure of the contact portion between the emitter electrode 212 and the semiconductor base body 200 in the UMOS-IGBT 110 will be described. FIG. 6 is a cross sectional view taken along the line A—A in the UMOS-IGBT 110.

As shown in FIG. 6, the insulating layer 211 covers the upper surface of the gate electrode 210, where the insulating layer 211 maintains the insulation between the emitter electrode 212 and the gate electrode 210. A platinum silicide layer (conductive layer) 214 is formed in the contact plane of the emitter electrode 212 and the upper main surface of the semiconductor base body 200. That is, the emitter electrode 212 and the exposed surface of the P base layer 205, and the emitter electrode 212 and the exposed surface of the N+ emitter layer 206 are in electric contact through the platinum silicide layer 214, respectively. This platinum silicide layer 214 decreases the contact resistance between the emitter electrode 212 and the two semiconductor layers. Preferably, the width of the contact surface of the emitter electrode 212 and the semiconductor base body 200, i.e., the contact width Wcon is set 0.5 μm to 3 μm.

A corroborating experiment was conducted to confirm the effect of decreasing the contact resistance. FIGS. 7 to 10 are graphs showing the results of the corroborating experiment. This corroborating experiment was carried out using samples which equivalently reproduce the contact surface of the emitter electrode 212 and the semiconductor base body 200. The shape of the contact surface is set to be rectangular and the length of one side, the contact length, is set to 5 μm. Two kinds of platinum silicide, i.e., PtSi/AlSi and PtSi/TiW/AlSi were selected as materials of the platinum silicide layer 214.

Figure 7:
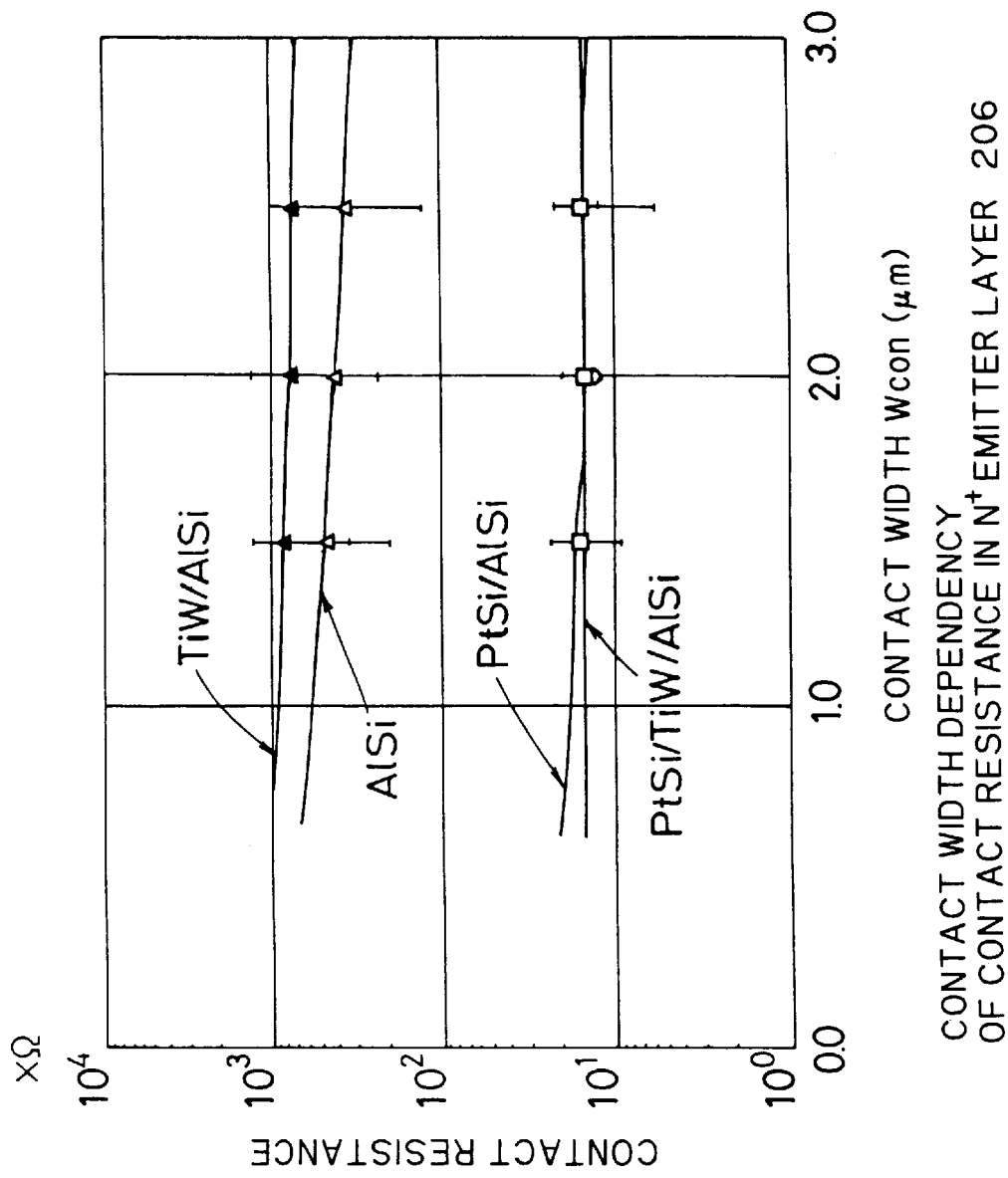
FIG. 7 is a graph showing the results of a corroborating test about the UMOS-IGBT of the preferred embodiment of the present invention.
Figure 8:
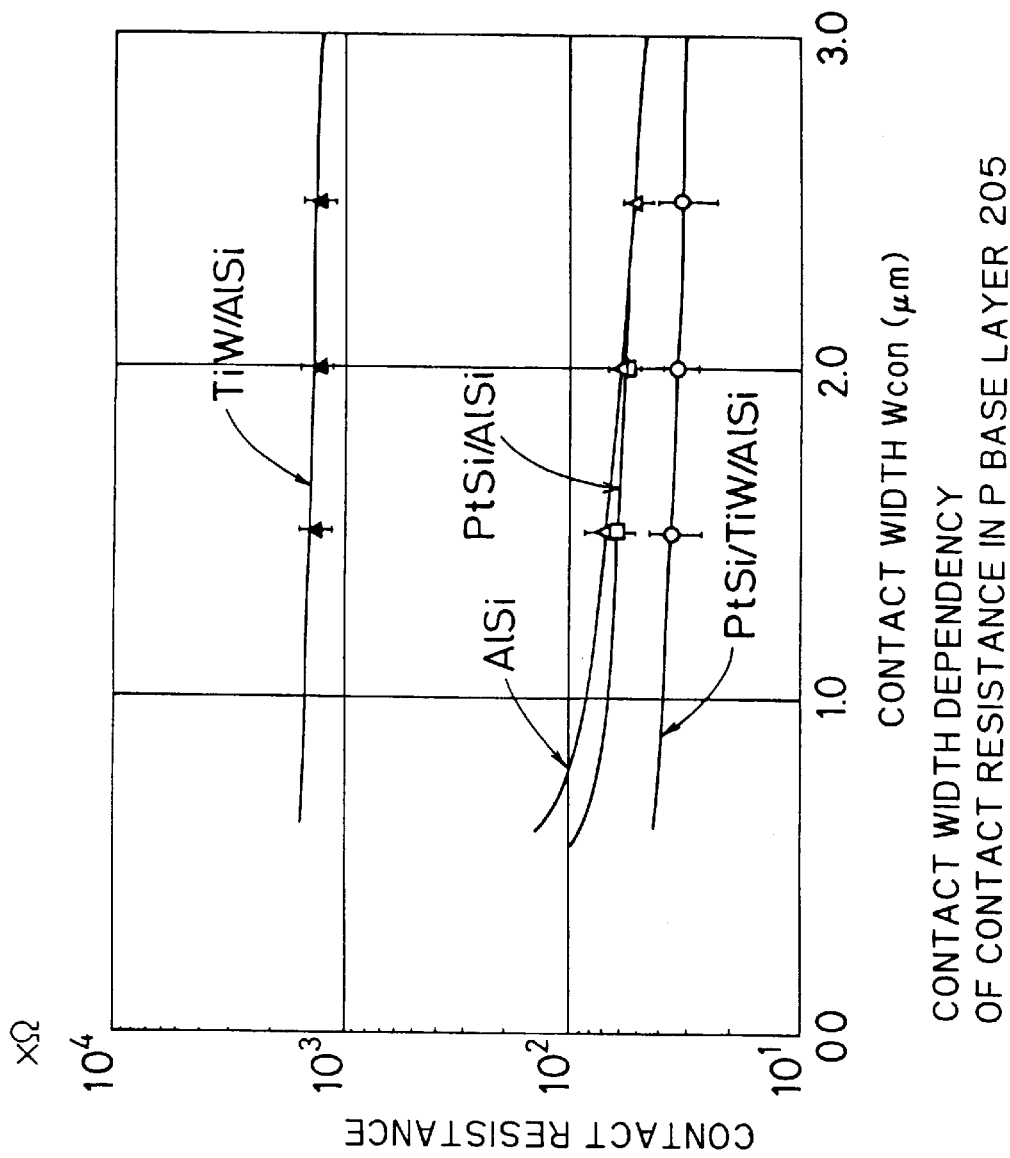
FIG. 8 is a graph showing the results of a corroborating test about the UMOS-IGBT of the preferred embodiment of the present invention.

FIG. 7 and FIG. 8 show measured values of the contact resistance when the length of another side, i.e., the contact width Wcon was varied. In FIG. 7 and FIG. 8, measured values of samples having a layer formed of AlSi or TiW/AlSi which are conventionally common in place of the platinum silicide layer 214 are also shown for comparison. FIG. 7 shows the results about the contact resistance in the N+ emitter layer 206 and FIG. 8 shows those about the P base layer 205.

As shown in FIG. 7, in any samples using PtSi/AlSi or PtSi/TiW/AlSi, the contact resistance in the N+ emitter layer 206 is decreased to one-tenth or below in the range of the contact width Wcon 0.5 μm–3 μm as compared with any of the conventional specifications, i.e., AlSi or TiW/AlSi.

Also, as shown in FIG. 8, as to the contact resistance in the P base layer 205, in any of the samples using PtSi/AlSi or PtSi/TiW/AlSi, it is decreased to one-tenth or below in the range of contact width Wcon 0.5 μm to 3 μm as compared with the conventional specification using TiW/AlSi. As compared with the conventional specification using AlSi, it is almost equivalent in the sample using PtSi/AlSi, and it is decreased to about one-half in the sample using PtSi/TiW/AlSi.

Figure 9:
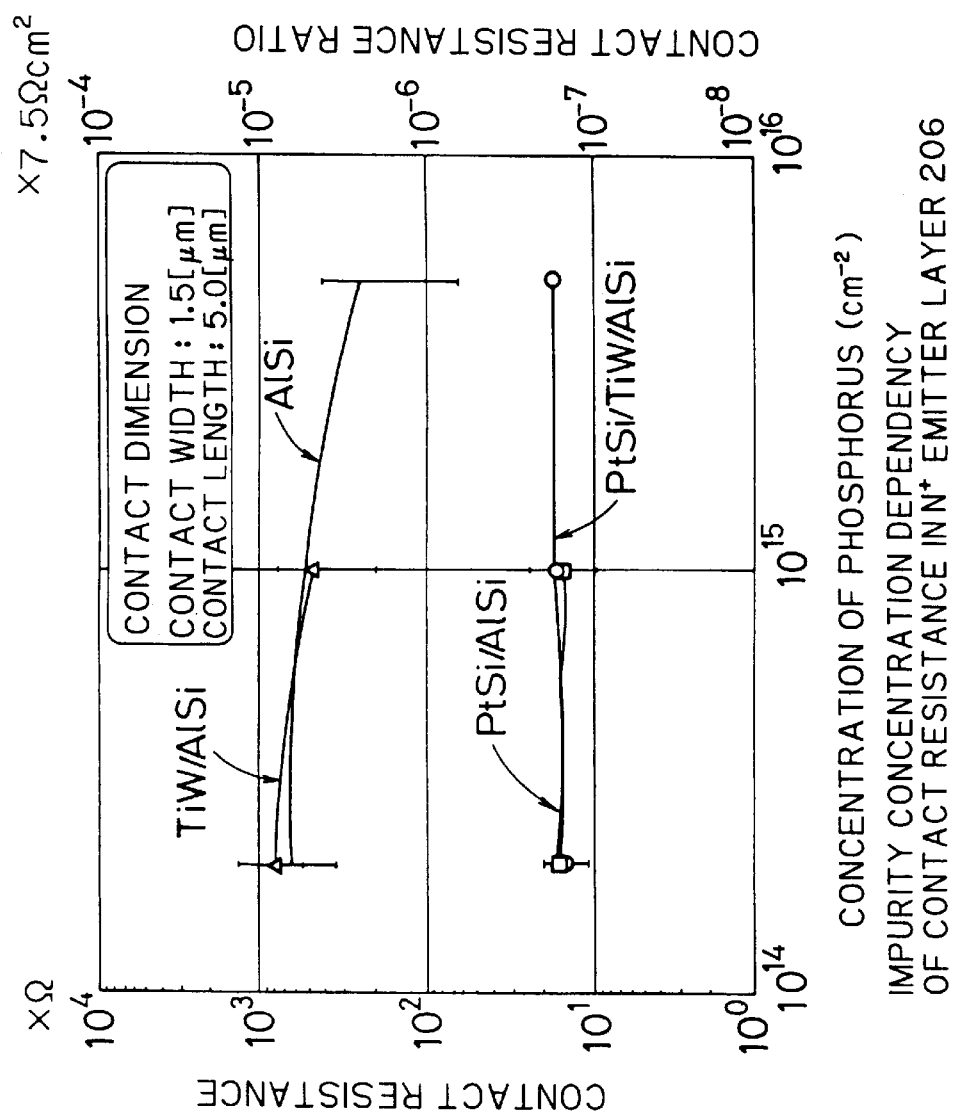
FIG. 9 is a graph showing the results of a corroborating test about the UMOS-IGBT of the preferred embodiment of the present invention.
Figure 10:
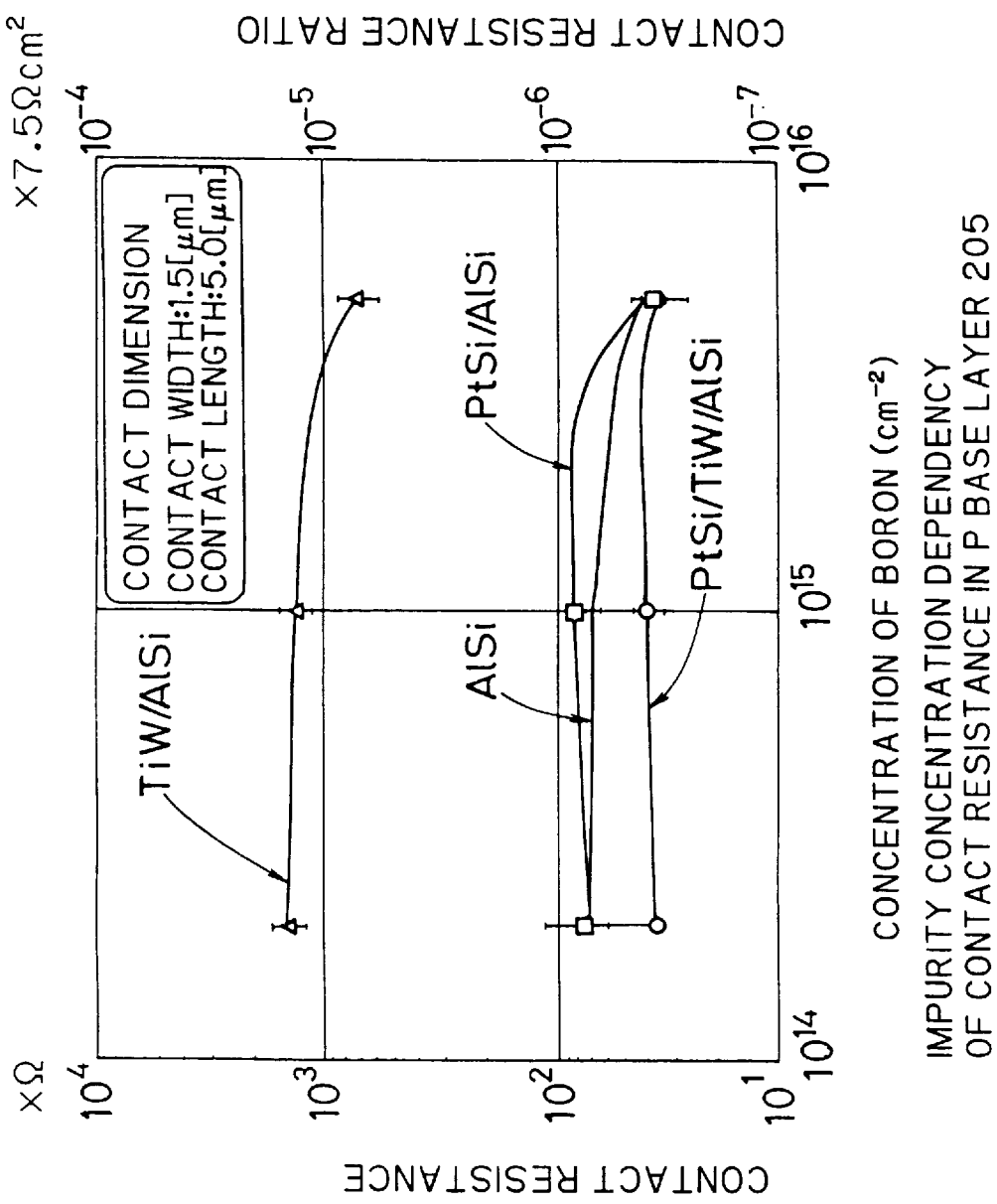
FIG. 10 is a graph showing the results of a corroborating test about the UMOS-IGBT of the preferred embodiment of the present invention.

FIG. 9 and FIG. 10 show measured values of the contact resistance when the concentration of impurity was variously changed. In FIG. 9 and FIG. 10, measured values in samples of conventional specification using AlSi or TiW/AlSi are also shown. FIG. 9 shows the results about the contact resistance in the N+ emitter layer 206 and FIG. 10 shows those about the P base layer 205.

As shown in FIG. 9, in any of the samples using PtSi/AlSi or PtSi/TiW/AlSi, the contact resistance in the N+ emitter layer 206 is decreased to one-tenth or below at least in the practical range where the concentration of phosphorus is $10^{14}$ cm$^2$ to $10^{16}$ cm$^2$ as compared with the conventional specification, that is, using AlSi or TiW/AlSi. Furthermore, the samples using any of PtSi/AlSi or PtSi/TiW/AlSi have a feature that they do not depend on the concentration of impurity almost at all. In the samples of the conventional specification, the contact resistance decreases as the impurity concentration increases, which contrasts the feature of the samples of the preferred embodiment.

As shown in FIG. 10, in the samples using any of PtSi/AlSi or PtSi/TiW/AlSi, the contact resistance in the P base layer 205 is one-tenth or below as compared with the conventional specification using TiW/AlSi at least in the range of concentration of boron $10^{14}$cm$^2$–$10^{16}$cm$^2$. As compared with the conventional specification using AlSi, it is almost equivalent in the sample using PtSi/AlSi, and it is somewhat lower in the sample using PtSi/TiW/AlSi.

From the results of the corroborating experiments above, as the platinum silicide layer 214 is formed in the UMOS-IGBT 110, the contact resistance between the N+ emitter layer 206 and the emitter electrode 212 is first decreased. Accordingly, the ON voltage $V_{CE(sat)}$ is decreased. Further, since the contact resistance between the N+ emitter layer 206 and the emitter electrode 212 is decreased, the ON voltage $V_{CE(sat)}$ does not rise even if the contact area between the N+ emitter layer 206 and the emitter electrode 212 becomes excessively small due to miniaturization of unit cell. That is, the miniaturization of unit cells is effectively utilized in decreasing the ON voltage $V_{CE(sat)}$.

Furthermore, since the contact resistance between the P base layer 205 and the emitter electrode 212 is also decreased, parasitic transistor will not easily become conductive. That is, the breakdown tolerance is enhanced. Also, the breakdown tolerance does not deteriorate even if the contact area between the P base layer 205 and the emitter electrode 212 becomes too small due to the miniaturization of unit cells. That is, improvement of ON voltage $V_{CE(sat)}$ and improvement of breakdown tolerance are consistently realized.

The effect of improving the ON voltage $V_{CE(sat)}$ and the breakdown tolerance by the platinum silicide layer 214 can also be produced by providing the platinum silicide layer 214 as it is in the conventional device not only in the device where the shape of exposed surfaces of the P base layer 205 and the N+ emitter layer 206 are like ladders as described in the first preferred embodiment. Also, the platinum silicide layer 214 produces the effect of decreasing the ON resistance $R_{ON}$ not only in the UMOS-IGBT but also in the UMOS, for example.

<Third Preferred Embodiment>

Figure 11:
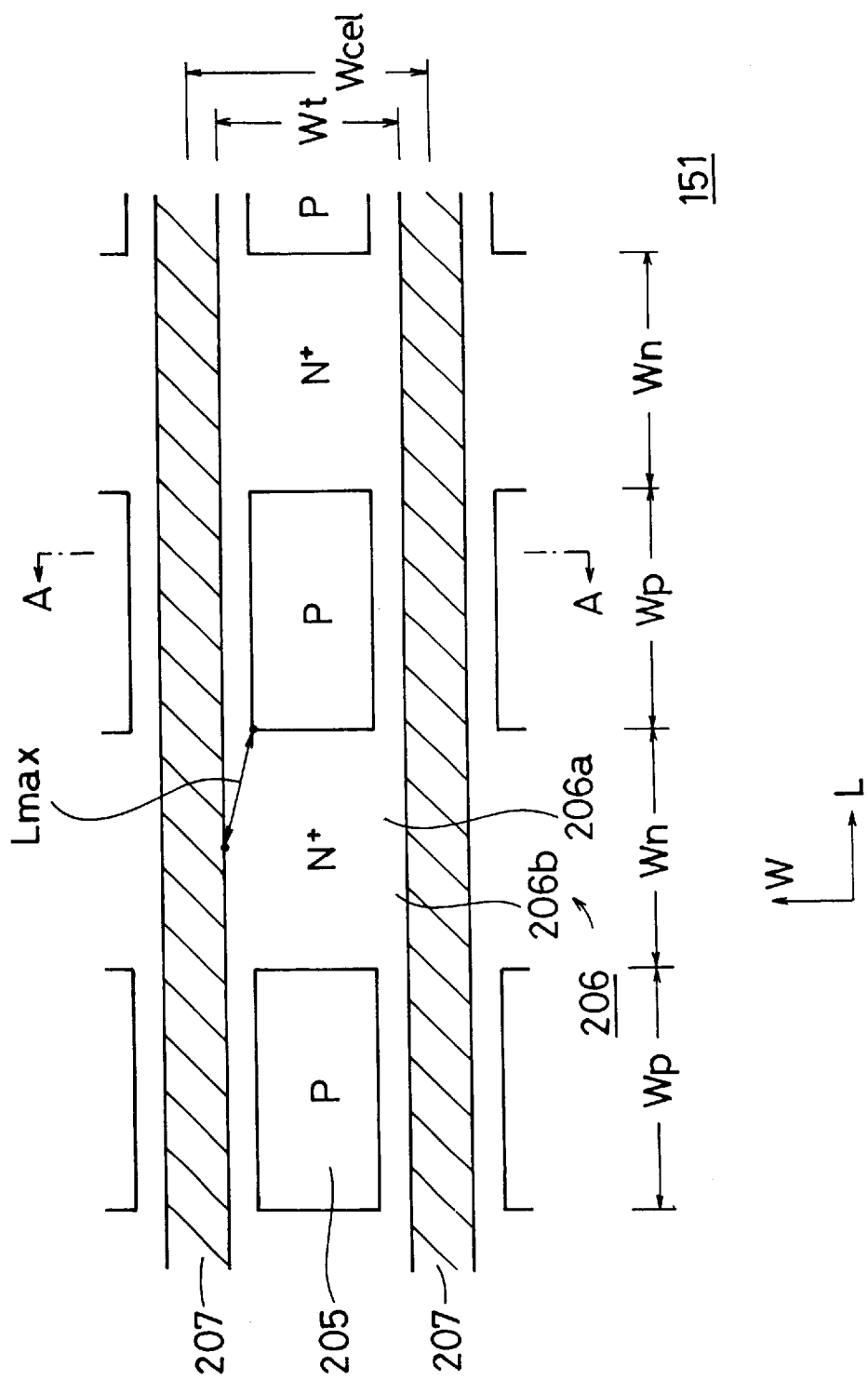
FIG. 11 is a fragmentary plan view of the UMOS-IGBT of the preferred embodiment of the present invention.

The optimization of the shape of the exposed surface of the N$^+$ emitter layer 206 will be described in the third preferred embodiment to the fifth preferred embodiment. FIG. 11 is a plan view which schematically represents the structure of the upper main surface of the semiconductor base body 200 corresponding to the partial region 151 of the cell region CR. In FIG. 11, the line A—A is also indicated.

As shown in FIG. 11, the stripe width Wn, the stripe width Wp, the trench interval Wt and the unit cell width Wcel are defined. Also, the direction along the trench 207 is defined as the L direction and the direction perpendicular to this, that is, the direction in which the trenches 207 are arranged is defined as the W direction. That is, the stripe width Wn is the width in the L direction of the cross-bar region 206a, and the stripe width Wp is a width in the L direction in the rectangular exposed surface of the P base layer 205. Further, in the points on the interconnection CL (refer to FIG. 1) of the boundary of the N$^+$ emitter layer 206 and the P base layer 205 and the trench 207, the maximum distance Lmax is defined as a distance to a point the farthest from the exposed surface of the P base layer 205. This maximum distance Lmax is a factor which defines the lateral resistance in the P base layer 205 right under the N$^+$ emitter layer 206. In the UMOS-IGBT 110, the maximum distance Lmax approximately corresponds to a half of the stripe width Wn. That is, the maximum distance Lmax is given by the expression 10.

$$L \text{ max} \approx \frac{1}{2} \times Wn \tag{10}$$

If the maximum distance Lmax is set so as to satisfy the expression 11 about the built-in potential Vpn peculiar to the junction portion of the P base layer 205 and the N$^+$ emitter layer 206 and the current density Jpr of the hole current flowing to the P base layer 205 right under the N$^+$ emitter layer 206 when the rated current is caused to flow to the UMOS-IGBT 110, the rated current can be caused to flow to the UMOS-IGBT 110 while conduction of parasitic transistor is avoided.

$$Vpn > Jpr \times \rho_{pn} \times L \text{ max} \tag{11}$$

Now, the resistivity $\rho_{pn}$ is the resistivity of the P base layer 205 right under the N$^+$ emitter layer 206. The ratio of the hole current flowing in the P base layer 205 in the main current flowing through the device is about 0.3 as mentioned above. Considering margin about this ratio, if it is set to 0.5, on the safe side, and the maximum distance Lmax is set so that the expression 12 is satisfied about the rated current density Jr of the device, the rated current can be passed through the UMOS-IGBT 110 with margin while avoiding conduction of parasitic transistor.

$$Vpn > 0.5 \times Jpr \times \rho pn \times Lmax \times \frac{Wn \times Wp}{Wcel \times Wt}. \tag{12}$$

For example, if the shape of the N$^+$ emitter layer 206 or the stripe width Wn is set so that the maximum distance Lmax takes the magnitude given by the expression 11 or the expression 12 for the rated current of 200 A, this rated current as large as 200 A can be flowed to the UMOS-IGBT 100 with conduction of parasitic transistor prevented.

Figure 43:
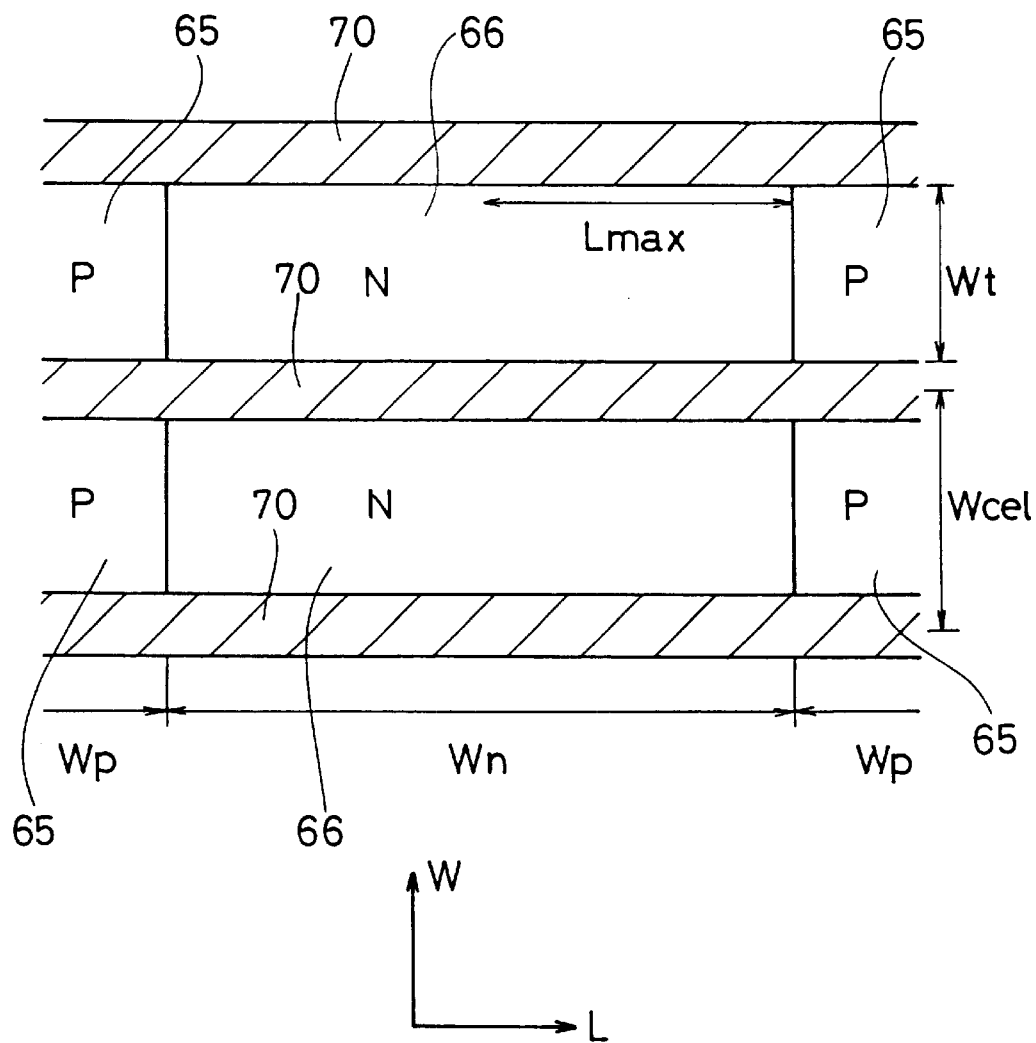
FIG. 43 is a plan view of the conventional UMOS-IGBT.
Figure 44:
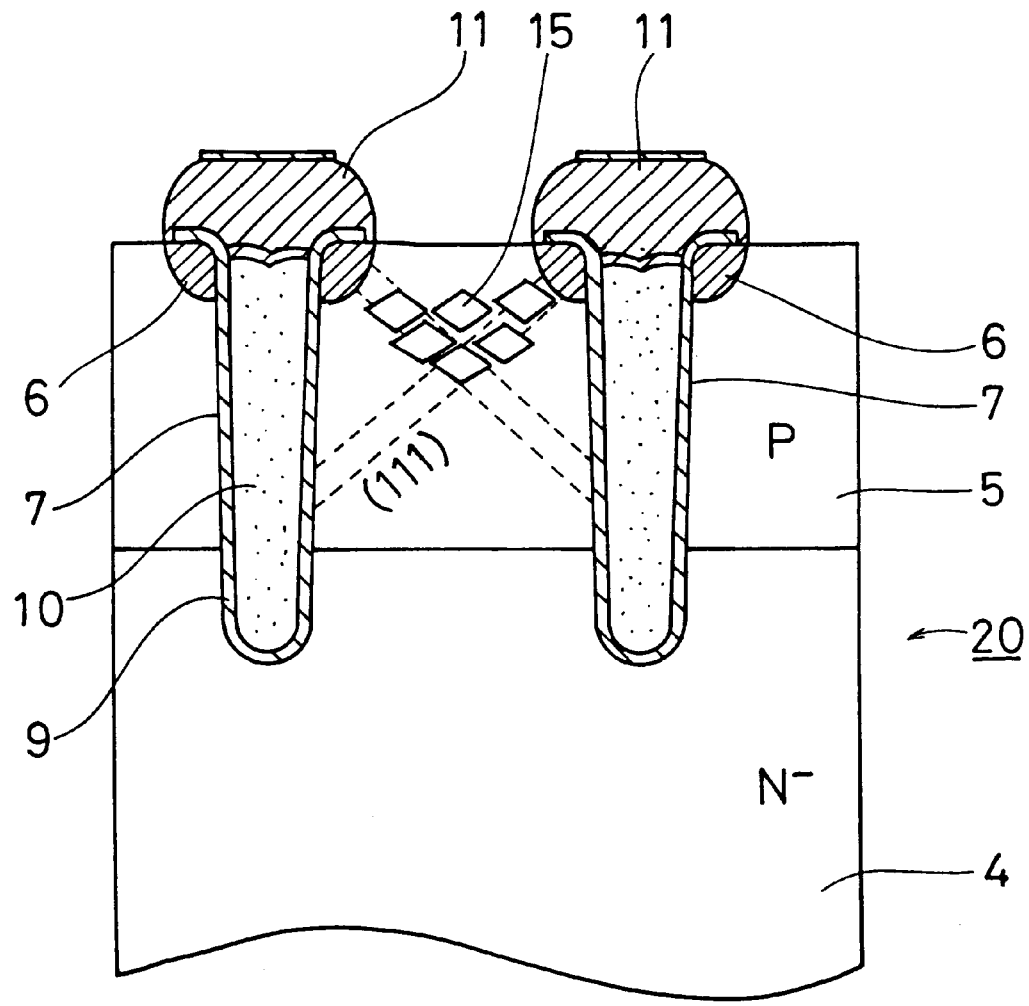
FIG. 44 is a front section view of the conventional UMOS.
Figure 45:
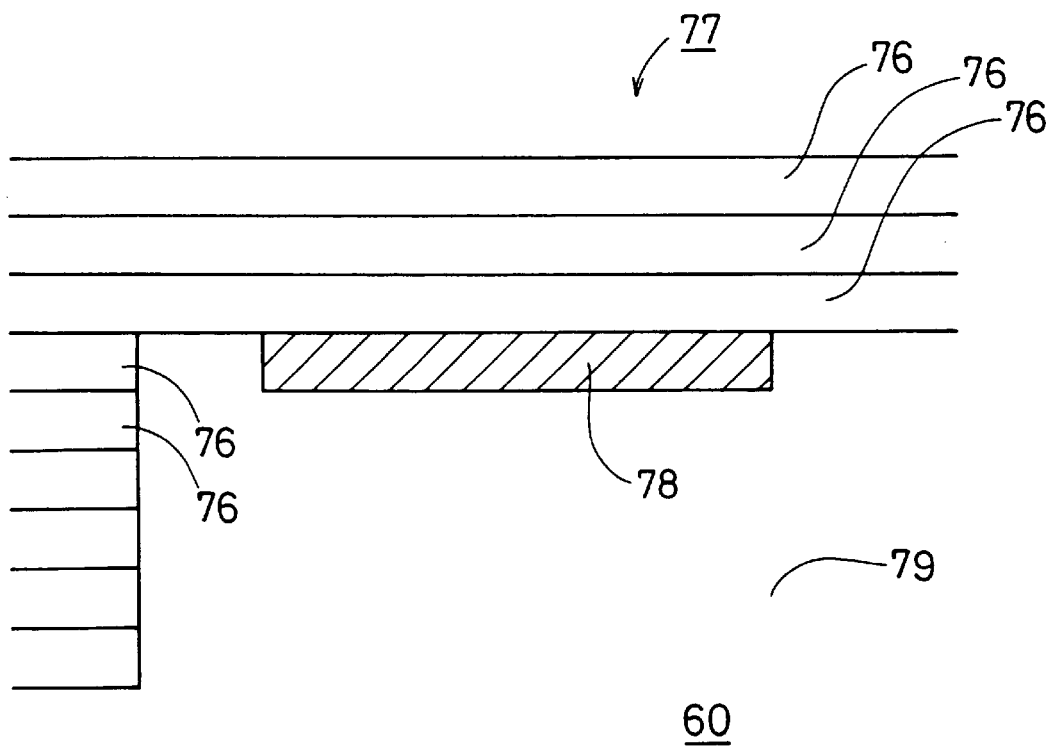
FIG. 45 is a fragmentary plan view of the conventional UMOS-IGBT.

Now, although the description has been made on the case where the form of the exposed surface of the N$^+$ emitter layer 206 is of the ladder type, the same is true in the case where the form of the exposed surface of the N$^+$ emitter layer 206 is like stripes as shown in FIG. 43. That is, if the shape of the exposed surface of the N$^+$ emitter layer 206 is like stripes, the rated current can be flowed with margin to the UMOS-IGBT 110 while avoiding conduction of parasitic transistor by selecting the maximum distance Lmax to the magnitude given by the expression 11 or the expression 12. When the shape of the exposed surface of the N$^+$ emitter layer 206 is the form of stripes, the relation between the maximum distance Lmax and the stripe width Wn is given by the expression 13.

$$L \text{ max} = \frac{1}{2} \times Wn \tag{13}$$

The optimum value of the maximum distance Lmax shown in this preferred embodiment can be adapted not only to the UMOS-IGBT but also to the UMOS, for example, to produce the same effect as the UMOS-IGBT.

<Fourth Preferred Embodiment>

In this fourth preferred embodiment, another optimization about the shape of the exposed surface of the N$^+$ emitter layer 206 will be described.

For the built-in potential Vpn peculiar to the junction portion of the P base layer 205 and the N$^+$ emitter layer 206, the current density Jpr of the hole current flowing through the P base layer 205 right under the N$^+$ emitter layer 206 when rated current is caused to flow to the UMOS-IGBT 110, and the ratio n of the main current when the UMOS-IGBT 110 is in the short-circuit state, i.e., n is the ratio of the main current when short-circuit load is connected across the first and second main electrodes to the rated current, if the maximum distance Lmax is set so as to satisfy the expression 14, the short-circuit current can be caused to flow to the UMOS-IGBT 110 while conduction of the parasitic transistor is avoided.

$$Vpn > n \times Jpr \times \rho_{pn} \times L \text{ max} \tag{14}$$

Now, the resistivity $\rho_{pn}$ is the resistivity of the P base layer 205 right under the N$^+$ emitter layer 206. The ratio of the hole current flowing in the P base layer 205 in the main current flowing in the device is about 0.3 as described above. If the ratio n is set to 0.5 considering margin on the safe side and the maximum distance Lmax is set so that the expression 15 is satisfied for the rated current density Jr of the device, the short-circuit current can be passed in the UMOS-IGBT 110 with margin while avoiding conduction of the parasitic transistor.

$$Vpn > n \times 0.5 \times Jpr \times \rho pn \times Lmax \times \frac{Wn \times Wp}{Wcel \times Wt}. \tag{15}$$

That is to say, setting the maximum distance Lmax to a magnitude given by the expression 14 or the expression 15 enables prevention of conduction of the parasitic transistor even if load connected to the UMOS-IGBT 110 is shorted.

Though the case where the shape of the exposed surface of the N$^+$ emitter layer 206 is a ladder-like shape has been described, the same is true in the case where the shape of the exposed surface of the N$^+$ emitter layer 206 is the stripe-like shape shown in FIG. 43. That is, even if the shape of the exposed surface of the N$^+$ emitter layer 206 is stripe, conduction of the parasitic transistor can be avoided even if load of the UMOS-IGBT 110 is shorted by selecting the maximum distance Lmax to the magnitude given by the expression 14 or the expression 15.

The optimum value of the maximum distance Lmax shown in this preferred embodiment can be applied not only to the UMOS-IGBT but also to the UMOS, for example, and it produces the same effects as those in the case of the UMOS-IGBT.

<Fifth Preferred Embodiment>

In this fifth preferred embodiment, sill another optimization for the shape of the exposed surface of the N$^+$ emitter layer 206 will be described. Though not shown in FIG. 4, a RTC (Real Time Clamp) circuit which functions as a overcurrent protection circuit for preventing the main current exceeding a predetermined magnitude is provided in a part of the semiconductor base body 200. The RTC circuit works to control the main current to certain factor m (<1) times the rated current, where m is a ratio of a limit current value of the main current to the rated current.

For the built-in potential Vpn peculiar to the junction portion of the P base layer 205 and the N$^+$ emitter layer 206, the current density Jpr of the hole current flowing through the P base layer 205 right under the N$^+$ emitter layer 206 when rated current is caused to flow to the UMOS-IGBT 110, and the factor m, if the maximum distance Lmax is set so that the expression 16 is satisfied, the parasitic transistor does not become conductive even if load of the UMOS-IGBT 110 is shorted.

$$Vpn > m \times Jpr \times \rho_{pn} \times L \text{ max} \quad (16)$$

Now, the resistivity $\rho_{pn}$ is the resistivity of the P base layer 205 right under the N$^+$ emitter layer 206. The ratio of the hole current flowing in the P base layer 205 in the main current flowing in the device is about 0.3 as described above. If the ratio m is set to 0.5 considering margin on the safe side and the maximum distance Lmax is set so that the expression 17 is satisfied for the rated current density Jr of the device, the load of the UMOS-IGBT 110 can be shorted with margin while avoiding conduction of the parasitic transistor.

$$Vpn > m \times 0.5 \times Jpr \times \rho pn \times Lmax \times \frac{Wn \times Wp}{Wcel \times Wt}. \quad (17)$$

That is to say, setting the maximum distance Lmax to a magnitude given by the expression 16 or the expression 17 enables prevention of conduction of the parasitic transistor even if load connected to the UMOS-IGBT 110 is shorted. The factor m is smaller than the ratio n in the fourth preferred embodiment. That is, the relation of the factor m and the ratio n in magnitude is given by the expression 18.

$$m < n \quad (18)$$

In other words, the expression 16 or the expression 17 indicate a condition not to have the parasitic transistor conductive even if the load of the UMOS-IGBT 110 is shorted in the same way as the expression 14 or 15, and the condition for the maximum distance Lmax is relaxed in the expression 16 or the expression 17 than in the expression 14 or the expression 15. This is because it is considered in the expression 16 and 17 that the short-circuit current is controlled by the RTC circuit. The expression 14 and the expression 15 give the condition for preventing a parasitic thyristor from becoming conductive under short load even if the UMOS-IGBT 110 is not provided with the RTC circuit, or when the RTC circuit does not operate normally.

Though the case where the shape of the exposed surface of the N$^+$ emitter layer 206 is of a ladder type has been described, the same is true in the case where the shape of the exposed surface of the N$^+$ emitter layer 206 is of the stripe type shown in FIG. 43. That is, if the shape of the exposed surface of the N$^+$ emitter layer 206 is stripe, conduction of the parasitic transistor can be avoided even if load of the UMOS-IGBT 110 having the RTC circuit is shorted by selecting the maximum distance Lmax to the magnitude given by the expression 16 or the expression 17.

The optimum value of the maximum distance Lmax shown in this preferred embodiment can be applied not only to the UMOS-IGBT but also to the UMOS, for example, and it produces the same effects as those in the case of the UMOS-IGBT.

<Sixth Preferred Embodiment>

Figure 12:
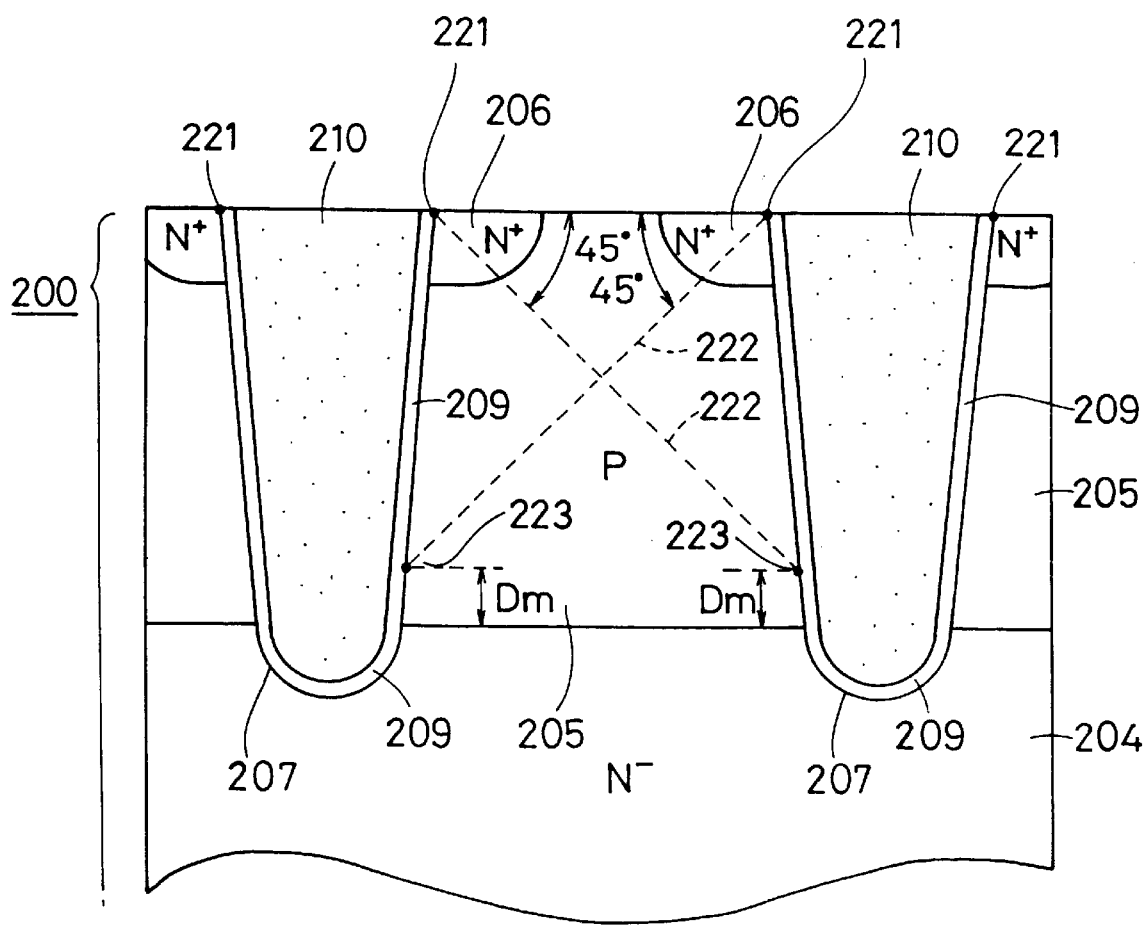
FIG. 12 is a front sectional view of the UMOS-IGBT of the preferred embodiment of the present invention.

Next, in the sixth preferred embodiment, it will be described that the relation of the interval and depth of the stripe-like trench 207 and the depth of the P base layer 205 is set most suitably. FIG. 12 is a front section view in the vicinity of the upper main surface of the semiconductor base body 200 in the UMOS-IGBT 110, which shows the section along the line A—A in FIG. 4. The upper main surface of the semiconductor base body 200 is along the <100> plane. An imaginary plane 222 including the linear opening end 221 of the trench 207 on the upper main surface of the semiconductor base body 200 and inclined by an inclination angle 45° with respect to the upper main surface is defined and the intersection 223 of the imaginary plane 222 and the wall of the trench 207 provided next to it is further defined. In the UMOS-IGBT 110, the P base layer 205 is deeper than the intersection 223 thus defined. That is, the shape of the trench 207 and the depth of the P base layer 205 are optimized so that the boundary plane of the P base layer 205 and the N$^-$ semiconductor layer 204 is positioned below the intersection 223 at a certain interval Dm.

Therefore, in the UMOS-IGBT 110 constituted as described above, even if a defect occurring starting from the opening end 221 is transmitted along the <111> plane of the semiconductor base body 200, i.e., along the imaginary plane 222, the transmission is stopped at the intersection 223. Then, since the upper surface of the N$^-$ semiconductor layer 204 is located below the intersection 223, the defect does not reach the N$^-$ semiconductor layer 204. That is, if a defect occurs in the semiconductor base body 200, it is limited in the P base layer 205 and never invade the N$^-$ semiconductor layer 204. Accordingly, deterioration of the N$^-$ semiconductor layer 204 is not promoted by the defect, so that the rise of the ON voltage $V_{CE(sat)}$ due to deterioration of the N$^-$ semiconductor layer 204 is suppressed. The shape of the bottom portion of the trench 207 is set to be rounded. Accordingly, defect will not likely to occur in the bottom portion.

<Seventh Preferred Embodiment>

Figure 13:
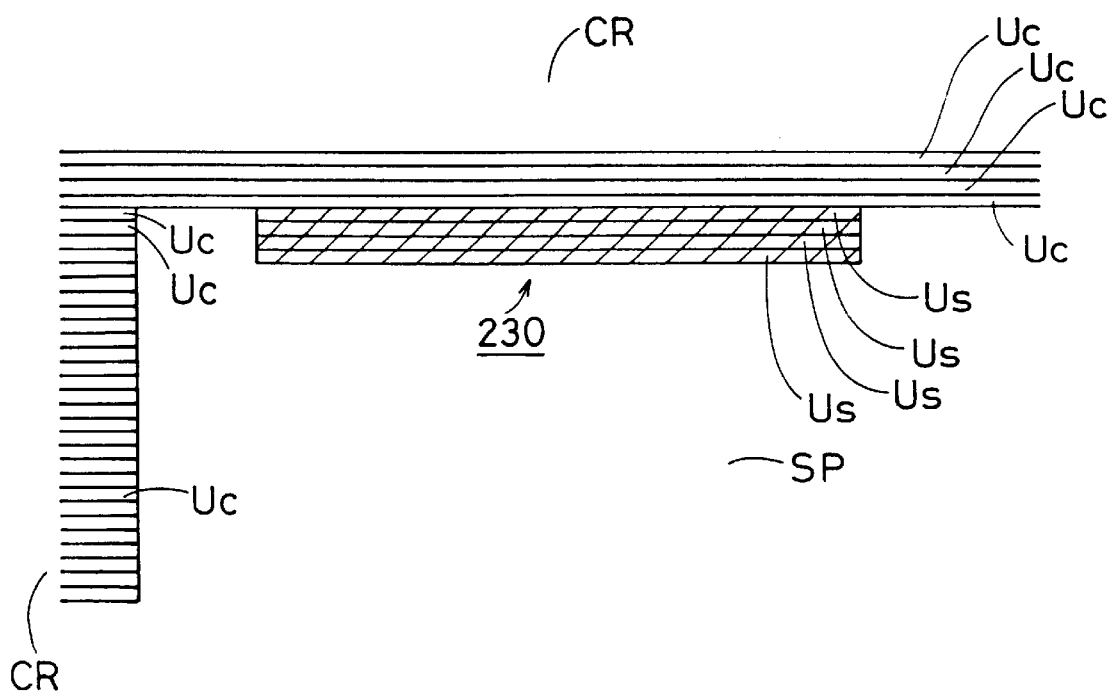
FIG. 13 is a fragmentary plan view of the UMOS-IGBT of the preferred embodiment of the present invention.

In the seventh preferred embodiment, the structure of the sense region will be described. FIG. 13 is an enlarged plan view showing the region 152 (FIG. 4) in the vicinity of the boundary of the sense pad SP and the cell region CR on the upper main surface of the semiconductor base body 200 of the UMOS-IGBT 110.

As shown in FIG. 13, In the UMOS-IGBT 110, a sense region (sensing means) 230 comprised of a plurality of unit cells Us is formed in the boundary portion of the sense pad SP and the cell region CR. The sense region 230 is provided to sense excessive rise in temperature or overcurrent to prevent or control them. The unit cell (insulated gate semiconductor element) Us has the same structure as the unit cell (insulated gate semiconductor element) Uc provided in the cell region CR.

As described above, as the sense region 230 is formed of a plurality of lines of unit cells Us in the UMOS-IGBT 110, even if the miniaturization of the Us is advanced, the magnitude of signal detectable in the sense region 230 can be maintained above a predetermined magnitude by increasing the number of lines of Us corresponding to the degree of miniaturization. That is, the miniaturization can be advanced while the sensing function is maintained to produce the advantage of consistently realizing the ensured sensing function and the decrease in the ON voltage $V_{CE(sat)}$.

Now, although the description has been made on the UMOS-IGBT, the sense region can be formed of a plurality of unit cells in the UMOS, too, which enables consistent realization of the ensured sensing function and the decrease in the ON voltage $V_{CE(sat)}$.

<Eighth Preferred Embodiment>

Figure 14:
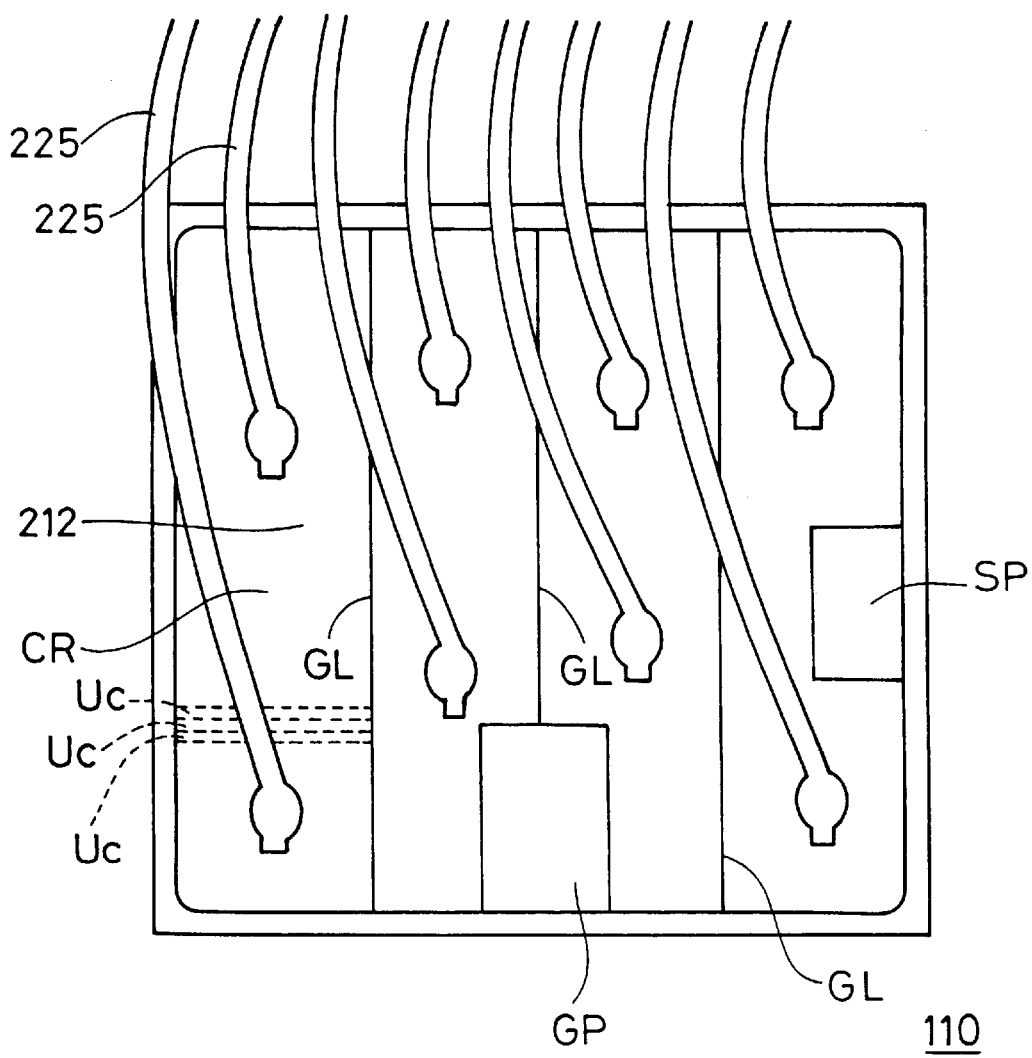
FIG. 14 is a plan view of the UMOS-IGBT of the preferred embodiment of the present invention.

In the eighth through tenth preferred embodiments, the connection portion of wires 117 and 127 (FIG. 2, FIG. 3) on the upper surface of the UMOS-IGBT 110 will be described. FIG. 14 is a plan view showing the upper surface of the UMOS-IGBT 110 with the emitter wires. FIG. 14 shows a part of the unit cells Uc (dotted line) arranged below the emitter electrode 212.

As shown in FIG. 14, one ends of emitter wires (interconnections) 225 for making connection with the external emitter electrode 112, 122 are connected (driven) to the emitter electrode 212. The emitter wires 225 are driven almost uniformly in the cell region CR partitioned by the comb-like gate interconnection GL. That is, a region with nearly equal area in the cell region CR is allotted to each of the emitter wires 225. Accordingly, the longest distance of a path of main current from the connection portion of each emitter wire 225 and the emitter electrode 212 to the unit cell Uc becomes almost minimum, so that the voltage drop in the emitter electrode 212 becomes almost the lowest. Accordingly, the effect of decreasing the ON voltage $V_{CE(sat)}$ of element itself of the UMOS-IGBT 110 which is realized by miniaturization of unit cells Uc or the like is effectively utilized for the decrease in the ON voltage $V_{CE(sat)}$ for the entire device.

Now, although the description has been made on the UMOS-IGBT here, it can be applied to the UMOS in the same way, too, which produces the same effects.

<Ninth Preferred Embodiment>

In this preferred embodiment, FIG. 14 is also referred to. As shown in FIG. 14, eight emitter wires 225 are driven in two rows on the cell region CR. The number is larger than that of the conventional UMOS-IGBT where six emitter wires are driven in a single row. Then, the area in the cell region CR allotted to one emitter wire 225 is 4 mm² or smaller. Accordingly, the voltage drop in the emitter wire 225 caused by the main current is sufficiently decreased.

Figure 15:
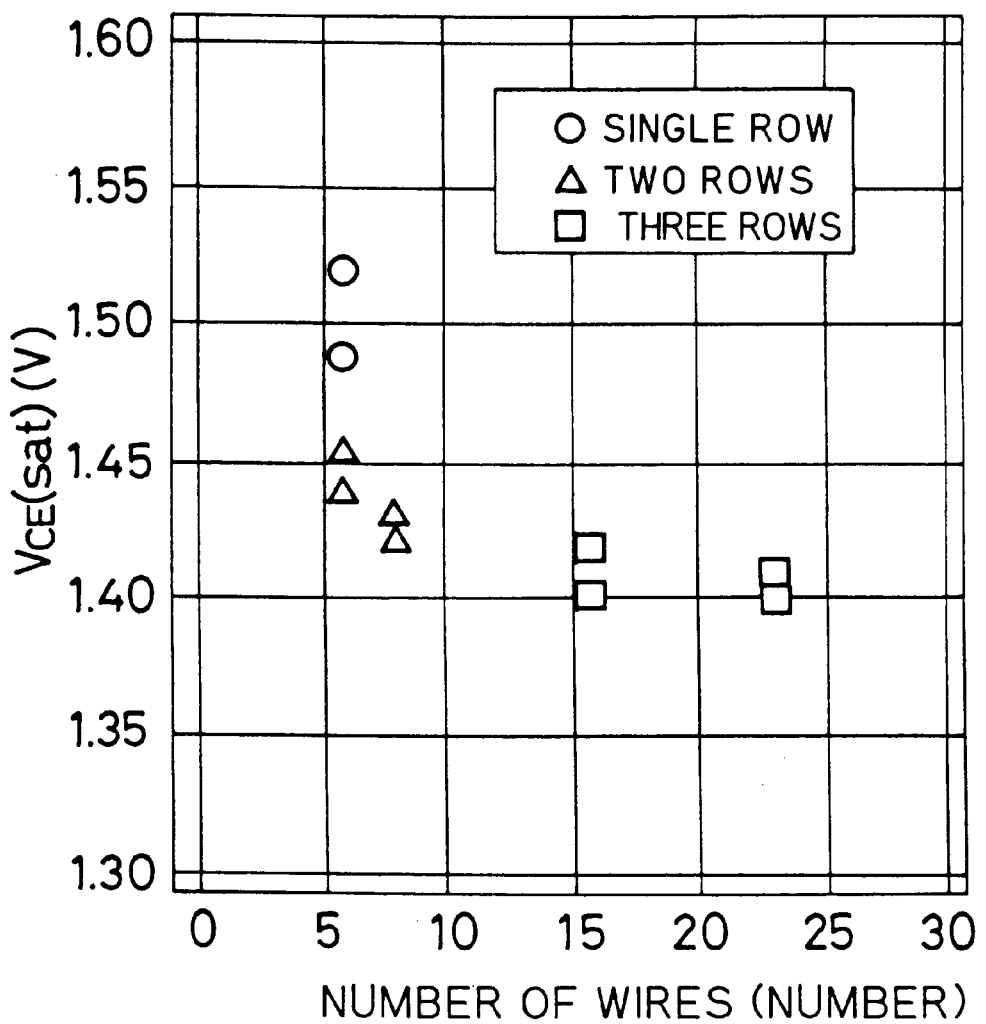
FIG. 15 is a graph showing the results of the corroborating test about the UMOS-IGBT of the preferred embodiment of the present invention.
Figure 16:
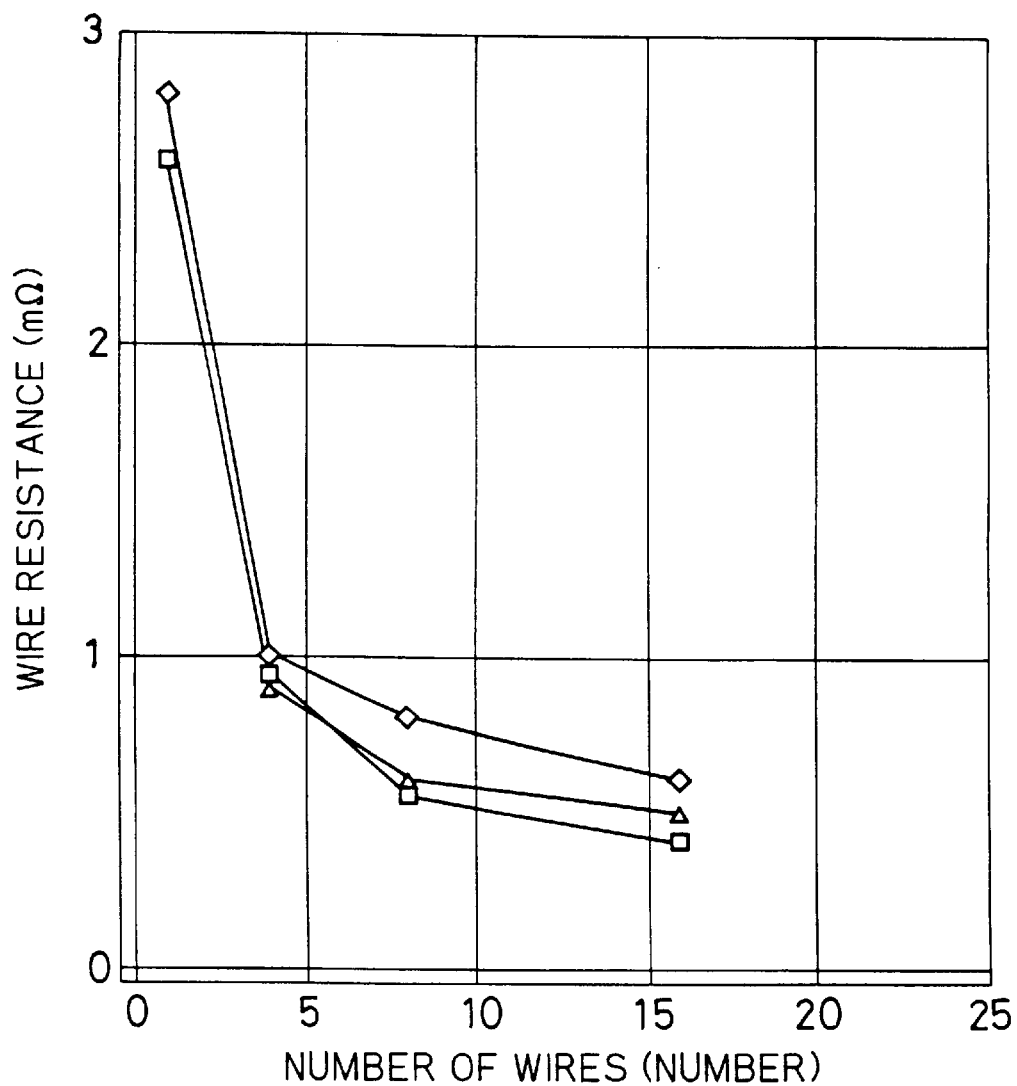
FIG. 16 is a graph showing the results of the corroborating test about the UMOS-IGBT of the preferred embodiment of the present invention.

A corroborating test carried out to prove the effect will be described below. In the UMOS-IGBT used in this corroborating test, the cell region CR is partitioned into four regions by the comb-like gate interconnection CL as in the UMOS-IGBT 110. However, the sense pad SP is not provided. FIG. 15 and FIG. 16 are graphs showing the results of the test.

FIG. 15 shows the relation between the ON voltage $V_{CE(sat)}$ including the emitter wire 225 and the number of the emitter wires 225. As can be seen from this graph, the ON voltage $V_{CE(sat)}$ is decreased by 0.15 V or more in the UMOS-IGBT having emitter wires of eight in two rows, sixteen in three rows, or twenty four in three rows as compared with the conventional UMOS-IGBT having six emitter wires in a single row (white points in FIG. 15). Even if the number of rows is increased than eight in two rows, the effect of decreasing the ON voltage $V_{CE(sat)}$ does not considerably change. This suggests that the voltage drop in the emitter wire is sufficiently lower as compared with the ON voltage $V_{CE(sat)}$ of the element itself if there are eight wires in two rows.

To prove this, the relation between resistance of the emitter wire itself used in the corroborating test and the number thereof was further examined. FIG. 16 is a graph showing the results. As can be seen from this graph, the resistance of the emitter wire itself is almost constant if there are six or more emitter wires. That is, it is seen that if there are eight emitter wires in two rows, the voltage drop in the emitter wire is sufficiently lower than the ON voltage $V_{CE(sat)}$ of the element itself. Also, as shown in FIG. 15, it is estimated that the ON voltage $V_{CE(sat)}$ slightly decreases if the number of the emitter wires is more than eight in two rows because the voltage drop in the emitter electrode decreases.

As discussed above, it is concluded that eight emitter wires 225 in two rows are enough to effectively make use of the decrease in the ON voltage $V_{CE(sat)}$ of element itself for the decrease in the ON voltage $V_{CE(sat)}$ as the entire device. In the UMOS-IGBT used in this corroborating test, since the area of the emitter electrode nearly corresponding to the area of the cell region CR is 25 mm², the area of the region allotted to a single emitter wire corresponds to 25/8=3.12 mm². That is, the decrease in the ON voltage $_{CE(sat)}$ of element itself can sufficiently serve for the decrease in the ON voltage $_{CE(sat)}$ for the entire device if the area of the cell region CR (nearly the same as the area of the emitter electrode) allotted to a single emitter wire is in the range of about 2 mm² to 4 mm² around 3.12 mm².

Now, although the description has been made on the UMOS-IGBT here, it can be applied to the UMOS in the same way, too, which produces the same effects.

<Tenth Preferred Embodiment>

Figure 17:
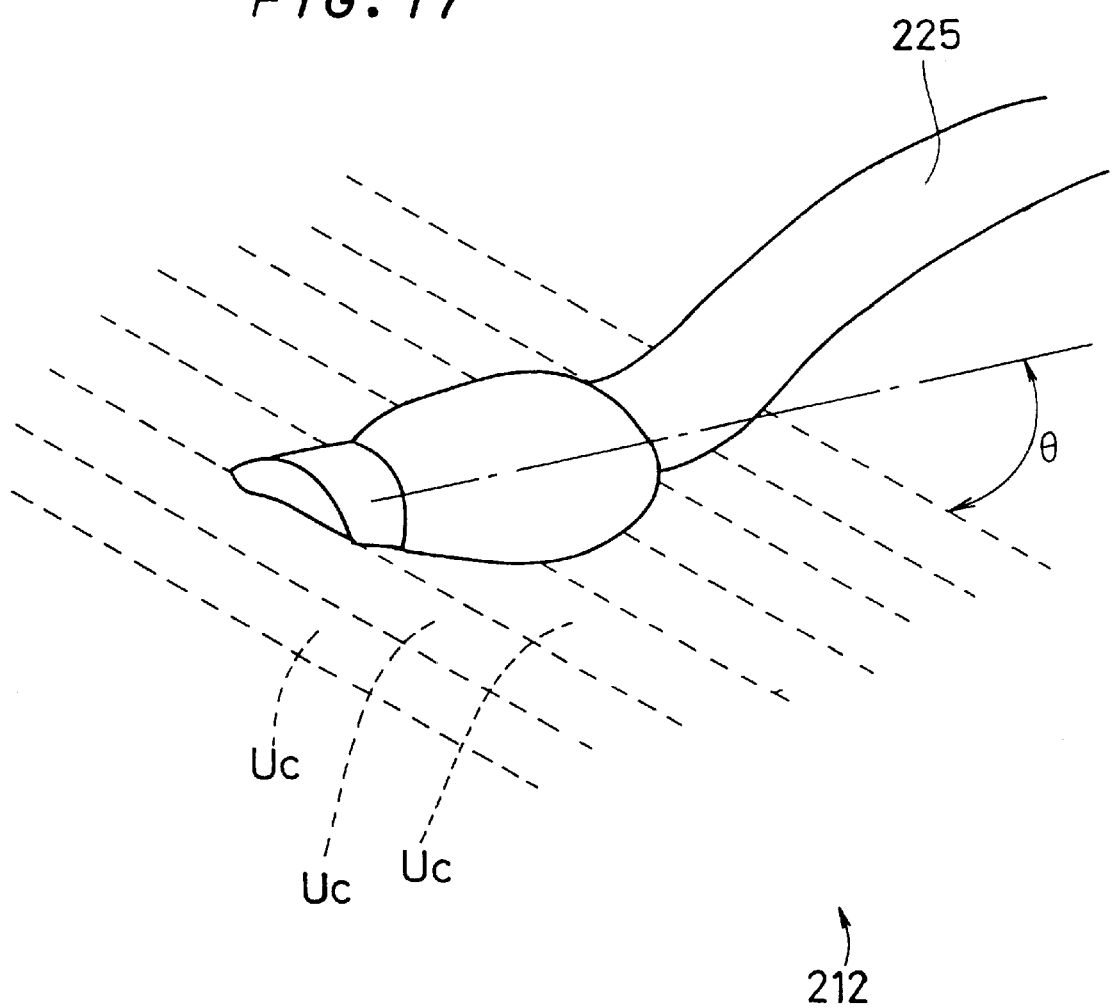
FIG. 17 is a fragmentary perspective view of the UMOS-IGBT of the preferred embodiment of the present invention.

In this preferred embodiment, a preferable angle between the emitter wire 225 and the gate electrode 210 will be described. FIG. 17 is an enlarged perspective view showing a connection portion of a single emitter wire 225 and the emitter electrode 212 in the UMOS-IGBT 110 in the enlarged form. In FIG. 17, unit cells Uc arranged below the emitter electrode 212 are indicated at the dotted lines. The gate electrodes 210 (not shown in FIG. 17. Refer to FIG. 5) are arranged along the unit cells Uc arranged in the stripe form. The emitter wire 225 is connected to the emitter electrode 212 at an angle in the range 20° to 160° with respect to the direction of the gate electrode 210, in other words, the direction of the unit cells Uc. That is, the angle θ in FIG. 17 is set in the range of 20° to 160°. If the angle θ is in this range, it is advantageous in that a short-circuit trouble will not likely to occur between the emitter electrode 212 and the gate electrode 210.

Figure 18:
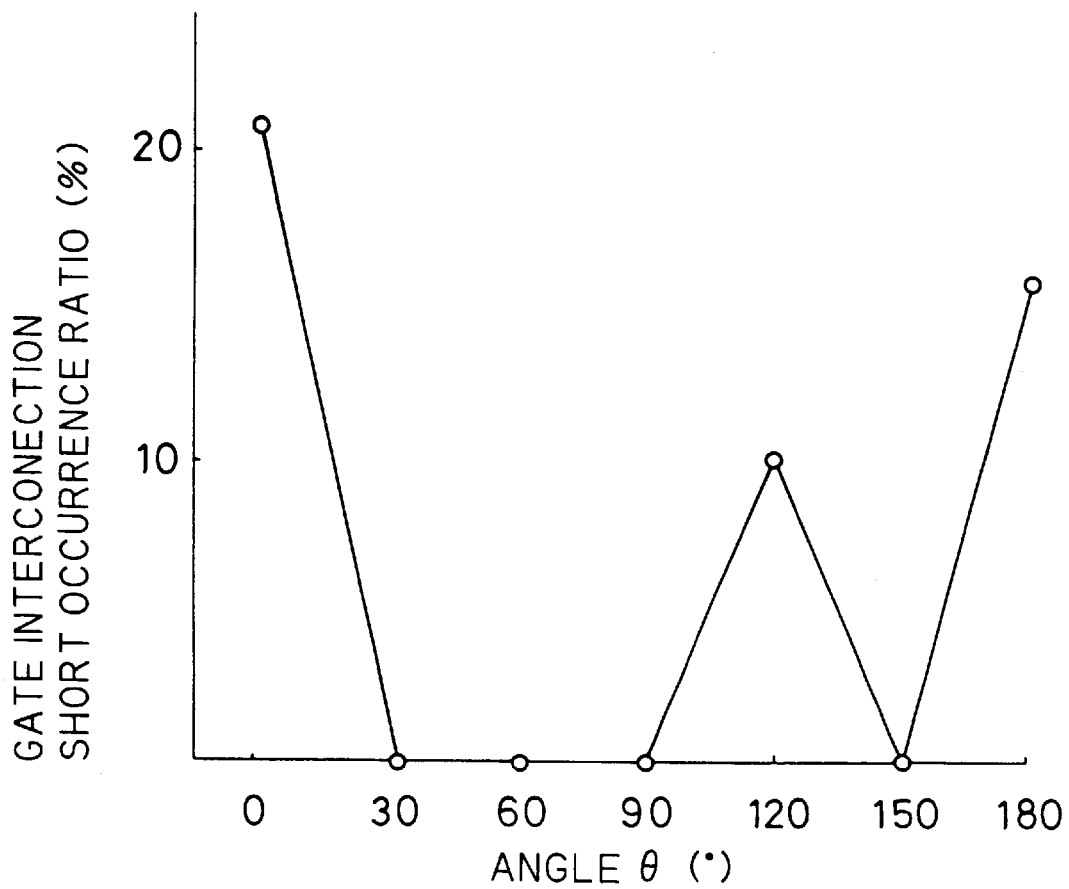
FIG. 18 is a graph showing the results of the corroborating test about the UMOS-IGBT of the preferred embodiment of the present invention.

FIG. 18 is a graph showing the results of the corroborating test carried out to prove this. FIG. 18 shows the relation between the percentage of occurrence of short-circuit trouble between the emitter wire 212 and the gate electrode 210, i.e., gate interconnection short, and the angle θ. As can be seen from this graph, it is the highest when the angle θ is 0 or 180°, that is, when the emitter wire 225 is driven in the same direction as the gate electrode 210. On the other hand, shifting the direction of driving the emitter wire 225 only by about 20° from the direction of the gate electrode 210 decreases the possibility of occurrence of gate interconnection short. That is, by setting the angle θ in the range 20° to 160°, the gate interconnection short can be decreased.

Now, although the description has been made on the UMOS-IGBT here, it can be applied to the UMOS in the same way, too, which produces the same effects.

<Eleventh Preferred Embodiment>

In this preferred embodiment, the shape of arrangement of the trenches 207 in the UMOS-IGBT 110 will be described.

Figure 19:
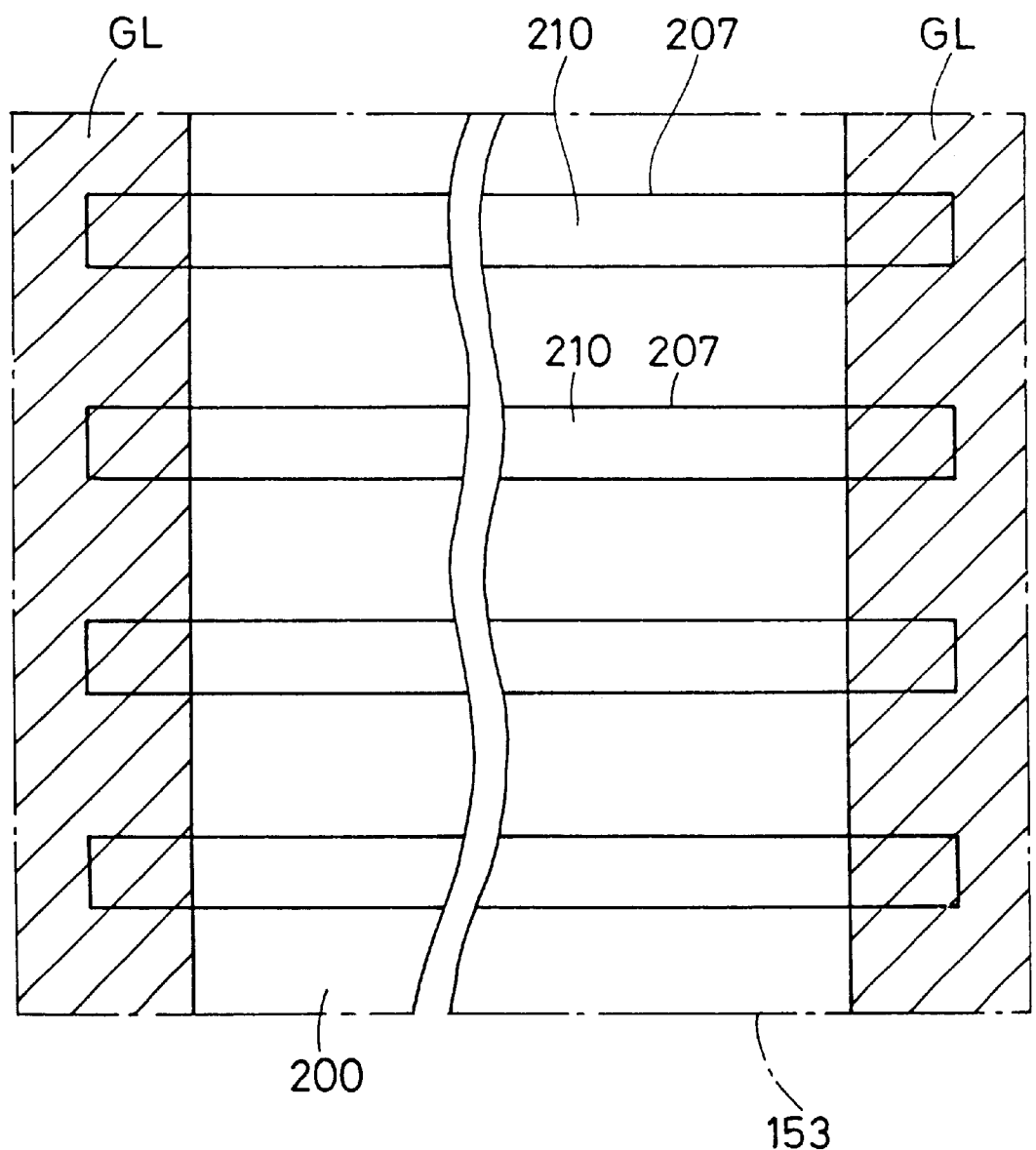
FIG. 19 is a fragmentary plan view of the UMOS-IGBT of the preferred embodiment of the present invention.

FIG. 19 is a plan view showing the upper main surface of the semiconductor base body 200 corresponding to right under the partial region 151 (FIG. 4) of the cell region CR in the UMOS-IGBT 110 in the enlarged form. As shown in FIG. 19, the trenches 207 are formed in the form of stripes arranged at equal intervals. The gate electrodes 210 buried in the trenches 207 are electrically connected to the gate interconnection GL formed on both ends of the stripe-like trenches 207. Each stripe is spaced apart from one another. That is, the gate electrode 210 buried in a single stripe is electrically coupled to the gate electrode 210 in another stripe only through the gate interconnection GL. That is, the trenches 207 do not otherwise have interconnecting intersections. Accordingly, in contrast to the conventional device, the UMOS-IGBT 110 has the advantage that the gate electrode 210 can be easily buried in the trench 207.

Although the example where the trenches 207 are formed in the linear stripe form has been described in this preferred embodiment, it may be the form of smooth curves in place of the linear form. As there exist no interconnecting intersections even if the trenches 207 are in the form of curve-like stripes, the same effects as those of this preferred embodiment are produced. Further, the structure in which the trenches 207 are formed in the form of stripes spaced from each other can be implemented in the same way in the UMOS, and it produces the same effects.

<Twelfth Preferred Embodiment>

A preferred method for producing the UMOS-IGBT 110 will now be described. FIG. 20 to FIG. 34 are diagrams of manufacturing processes showing the method of this preferred embodiment.

Figure 20:
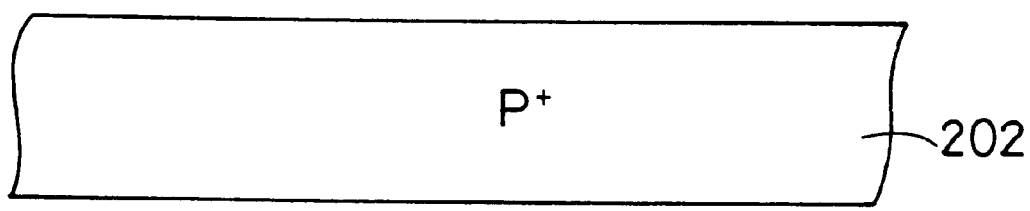
FIG. 20 is a process diagram about a method of manufacturing the UMOS-IGBT of the preferred embodiment of the present invention.

When manufacturing the UMOS-IGBT 110, as shown in FIG. 20, a silicon substrate containing P-type impurity at a high concentration is prepared first. This silicon substrate corresponds to the $P^+$ collector layer 202.

Figure 21:
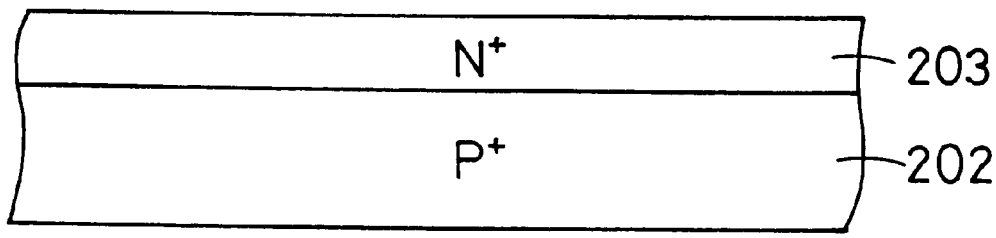
FIG. 21 is a process diagram about the method of manufacturing the UMOS-IGBT of the preferred embodiment of the present invention.

Next, as shown in FIG. 21, the $N^+$ buffer layer 203 containing N-type impurity at a high concentration is formed by the epitaxial growth on the $P^+$ collector layer 202.

Figure 22:
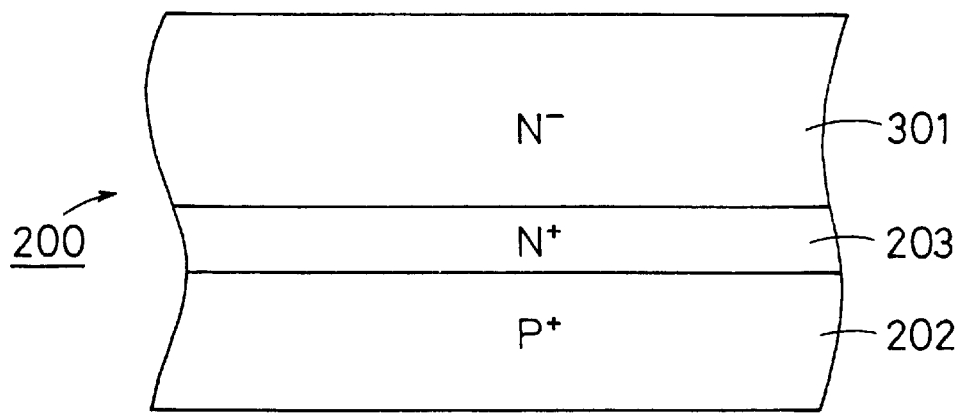
FIG. 22 is a process diagram about the method of manufacturing the UMOS-IGBT of the preferred embodiment of the present invention.

Subsequently, as shown in FIG. 22, an $N^-$ semiconductor layer 301 containing N-type impurity at a low concentration is formed on the $N^+$ buffer layer 203 by the epitaxial growth. This process forms the semiconductor base body 200.

Figure 23:
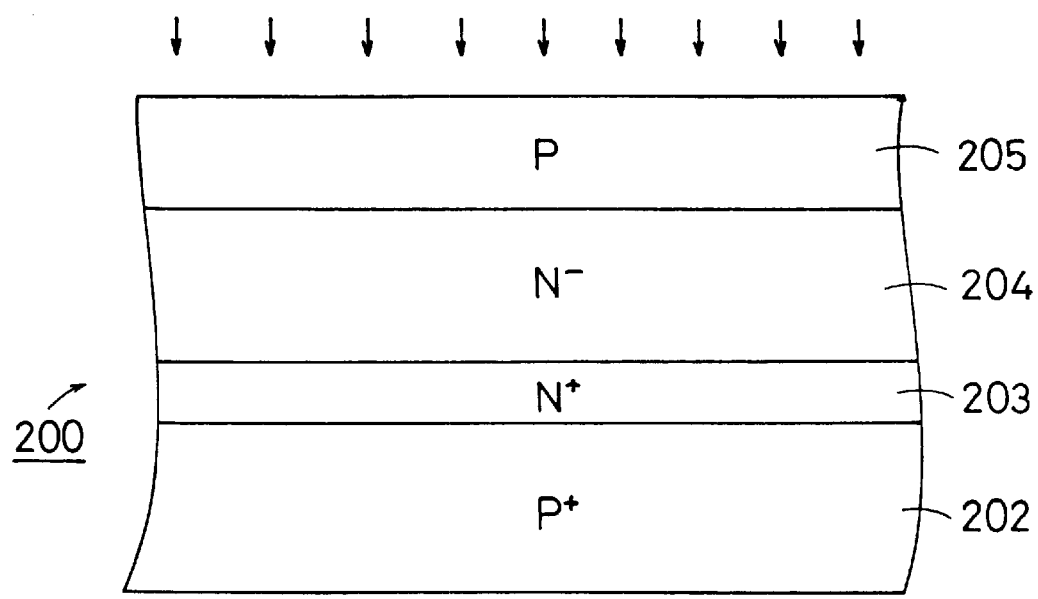
FIG. 23 is a process diagram about the method of manufacturing the UMOS-IGBT of the preferred embodiment of the present invention.

Next, as shown in FIG. 23, P-type impurity is implanted to the upper surface of the $N^-$ semiconductor layer 301, and then annealing is applied thereto to form the $N^-$ semiconductor layer 204 and the P base layer 205 provided thereon.

Figure 24:
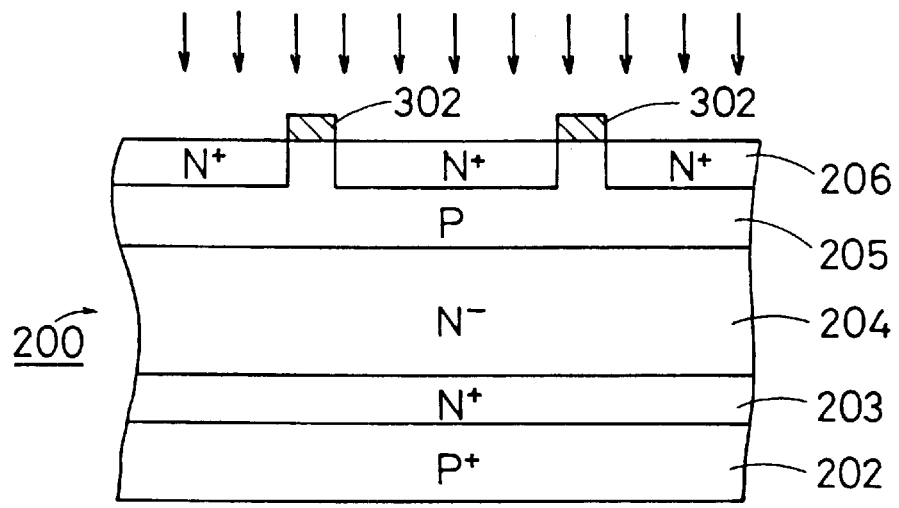
FIG. 24 is a process diagram about the method of manufacturing the UMOS-IGBT of the preferred embodiment of the present invention.

Next, as shown in FIG. 24, a mask (first mask) 302 having a predetermined pattern is formed on the upper surface of the P base layer 205 by the photolithography and then N-type impurity is selectively implanted to the upper surface of the P base layer 205 by using the mask 302 as a shield. Next, the mask 302 is removed and then annealing is applied to selectively form the $N^+$ emitter layer 206 on the upper surface of the P base layer 205.

Figure 25:
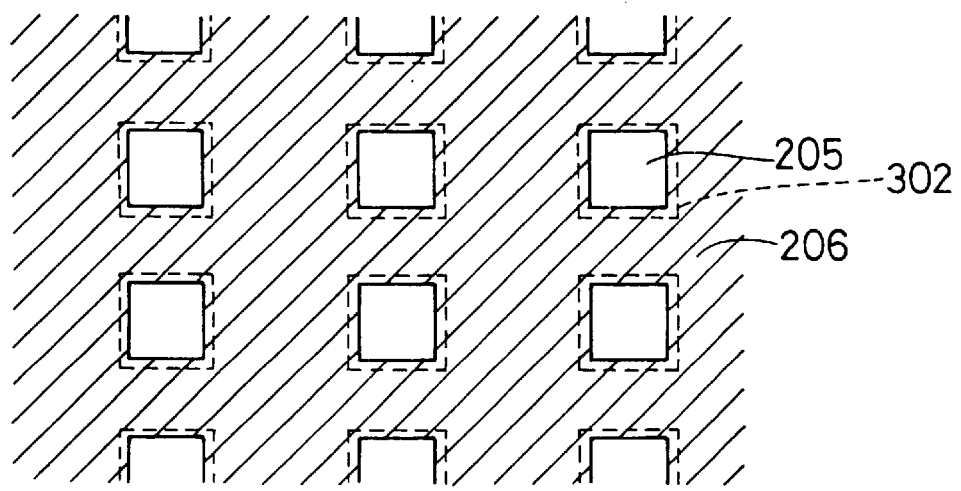
FIG. 25 is a process diagram about the method of manufacturing the UMOS-IGBT of the preferred embodiment of the present invention.

FIG. 25 shows the upper main surface of the semiconductor base body 200 after this step is finished. FIG. 25 also shows the outline of the mask 302. In the mask 302, rectangular regions are arranged in a matrix. Accordingly, the $N^+$ emitter layer 206 is formed so as to be exposed in the lattice-like form on the upper main surface of the semiconductor base body 200. After that, the mask 302 is removed.

Figure 26:
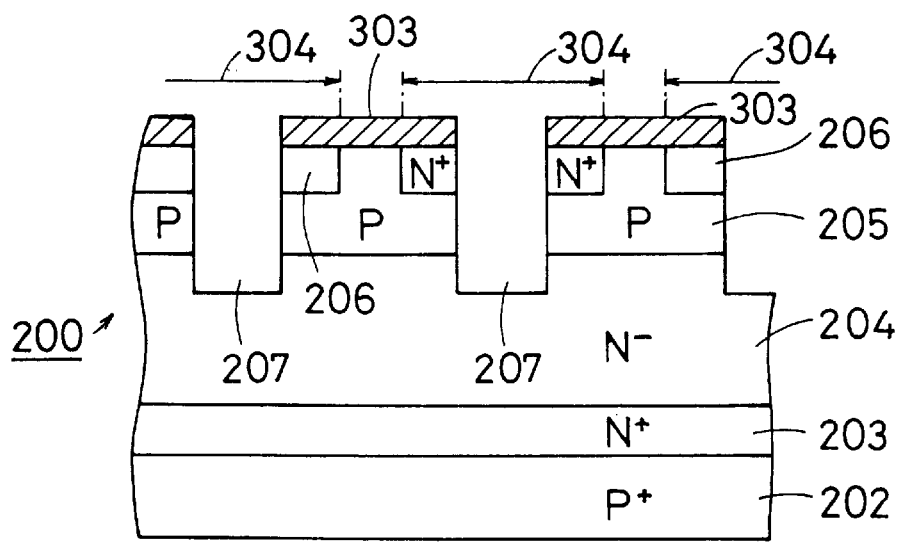
FIG. 26 is a process diagram about the method of manufacturing the UMOS-IGBT of the preferred embodiment of the present invention.
Figure 27:
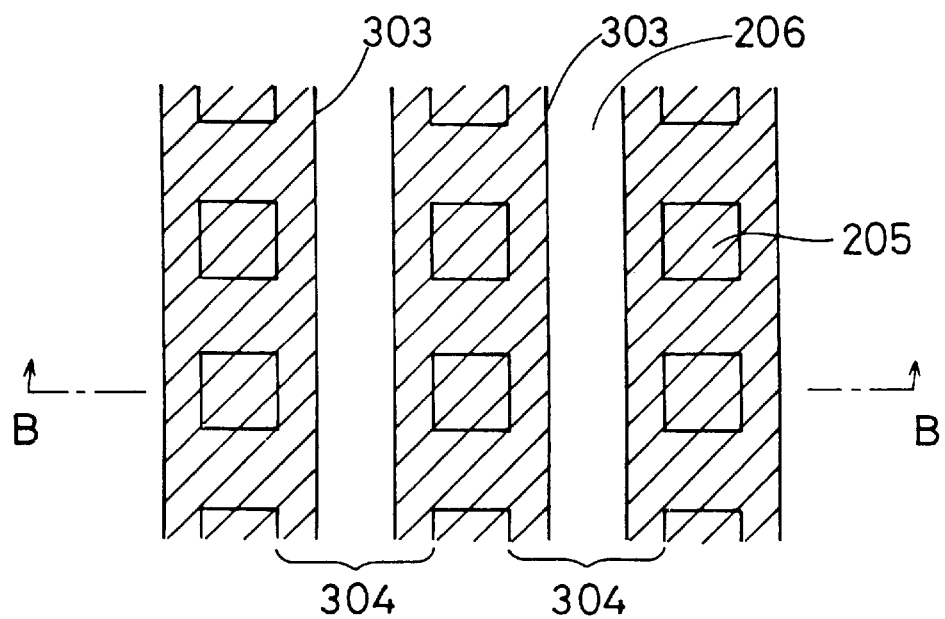
FIG. 27 is a process diagram about the method of manufacturing the UMOS-IGBT of the preferred embodiment of the present invention.

Next, as shown in FIG. 26, a mask (second mask) 303 having a predetermined pattern is formed by the photolithography on the upper main surface of the semiconductor base body 200. The mask 303 is formed so as to open along the zonal portions 304 of the $N^+$ emitter layer 206 exposed in the lattice-like form as shown in FIG. 26 and FIG. 27. This opening is located inside the ends in the width direction of the zonal portions 304. FIG. 27 is a plan view and FIG. 26 is a front section view taken along the line B—B shown in FIG. 27. The RIE (Reactive Ion Etching) is carried out onto the upper main surface of the semiconductor base body 200 by using this mask 303 as a shield. As a result, as shown in FIG. 26, the trenches 207 are formed along the zonal regions where the mask 303 opens. The depth of this trench 207 is controlled so that it passes through the P base layer 205 from the upper surface of the $N^+$ emitter layer 206 to reach the $N^-$ semiconductor layer 204. After that, the mask 303 is removed.

Figure 28:
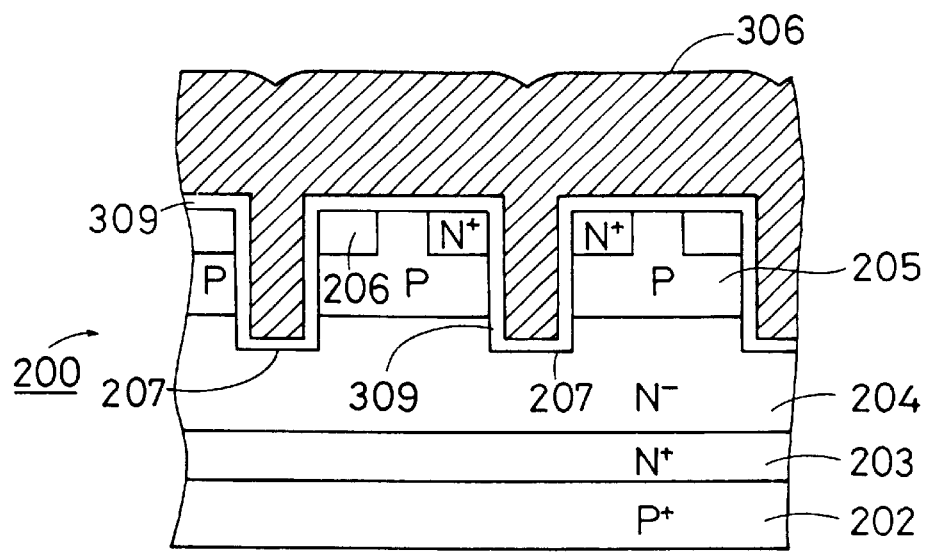
FIG. 28 is a process diagram about the method of manufacturing the UMOS-IGBT of the preferred embodiment of the present invention.

Next, as shown in FIG. 28, a thermal oxide film 309 is formed on the upper main surface of the semiconductor base body 200 and the inner walls of the trenches 207. Subsequently, a polysilicon layer 306 doped with impurity is deposited on the surface of the thermal oxide film 309. The polysilicon layer 306 is formed so as to fill the trenches 207 covered with the thermal oxide film 309 and to be provided on the entire upper main surface of the semiconductor base body 200 covered with the thermal oxide film 309.

Figure 29:
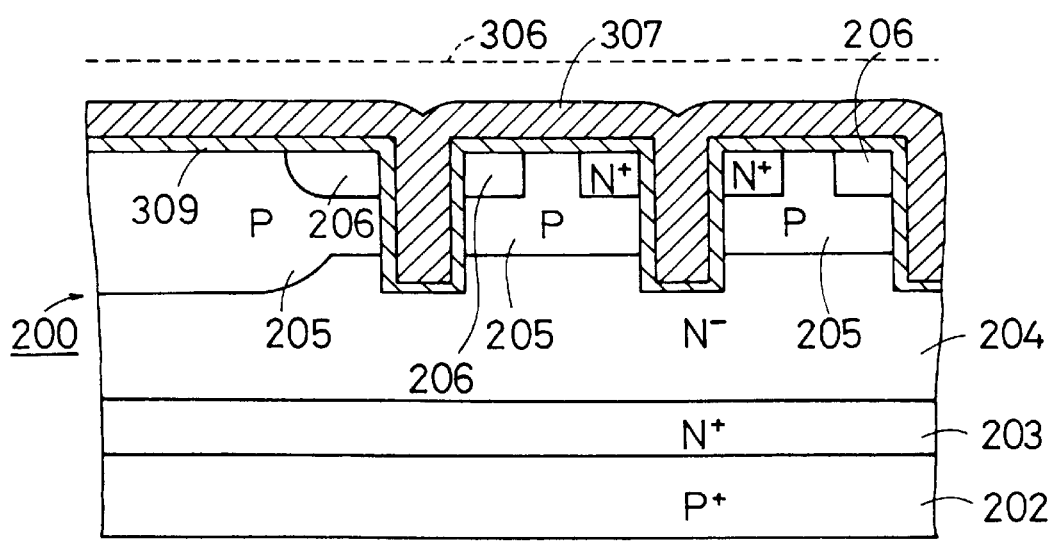
FIG. 29 is a process diagram about the method of manufacturing the UMOS-IGBT of the preferred embodiment of the present invention.

Next, as shown in FIG. 29, etching is appropriately applied onto the upper surface of the polysilicon layer 306 to remove the upper surface portion of the polysilicon layer 306 to form a polysilicon layer 307 having a thickness from the upper main surface of the semiconductor base body 200 corresponding to the thickness of the gate interconnection GL. FIG. 29 includes a region where the gate interconnection GL is to be provided (the left end portion in the figure).

Figure 30:
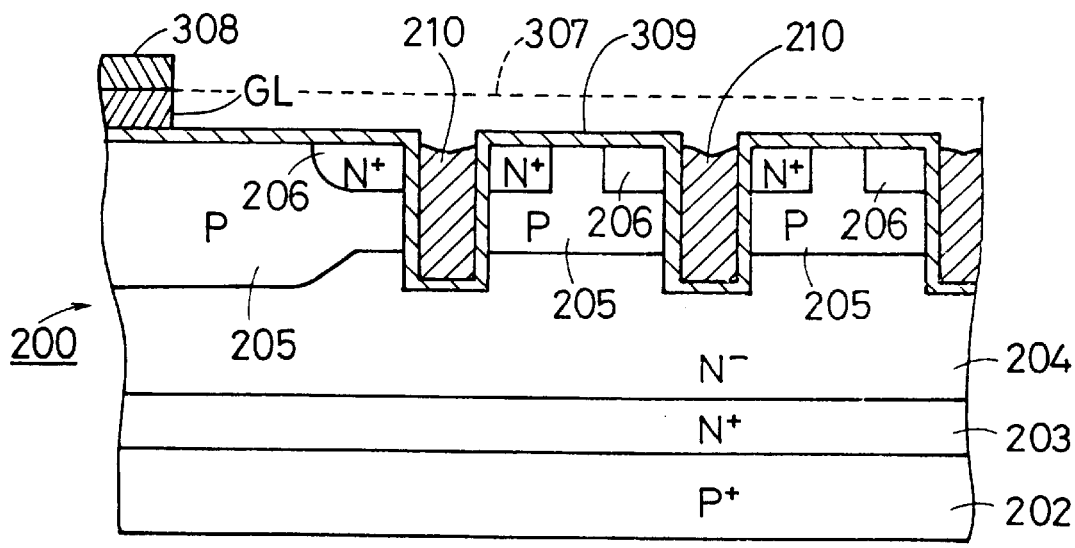
FIG. 30 is a process diagram about the method of manufacturing the UMOS-IGBT of the preferred embodiment of the present invention.

Next, as shown in FIG. 30, a mask 308 is formed on the polysilicon layer 307 so as to selectively cover the region where the gate interconnection GL is to be provided. After that, the polysilicon layer 307 is selectively etched back using the mask 308 as a shield to form the gate interconnection GL and the gate electrode 210 as shown in FIG. 30. That is, the polysilicon layer 307 is removed except the gate interconnection GL on the upper main surface of the semiconductor base body 200. After that, the mask 308 is removed.

Figure 31:
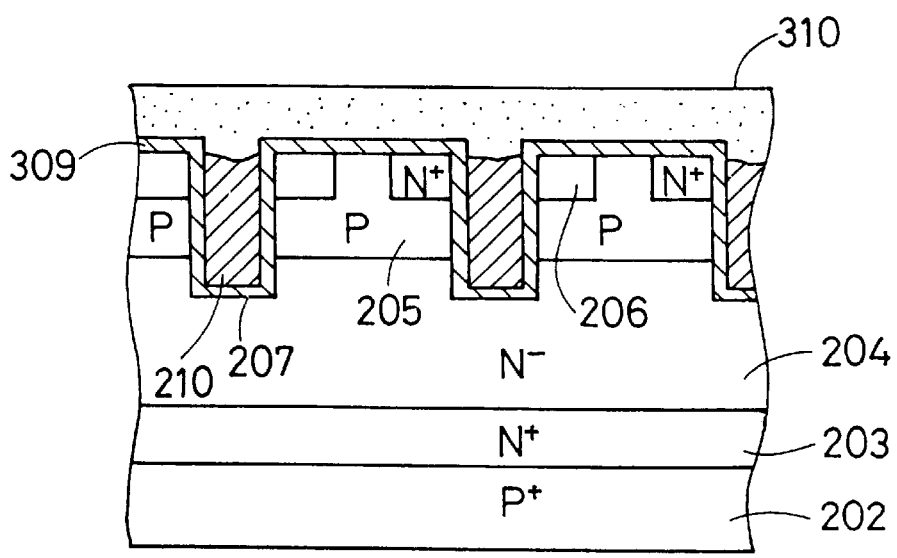
FIG. 31 is a process diagram about the method of manufacturing the UMOS-IGBT of the preferred embodiment of the present invention.
Figure 32:
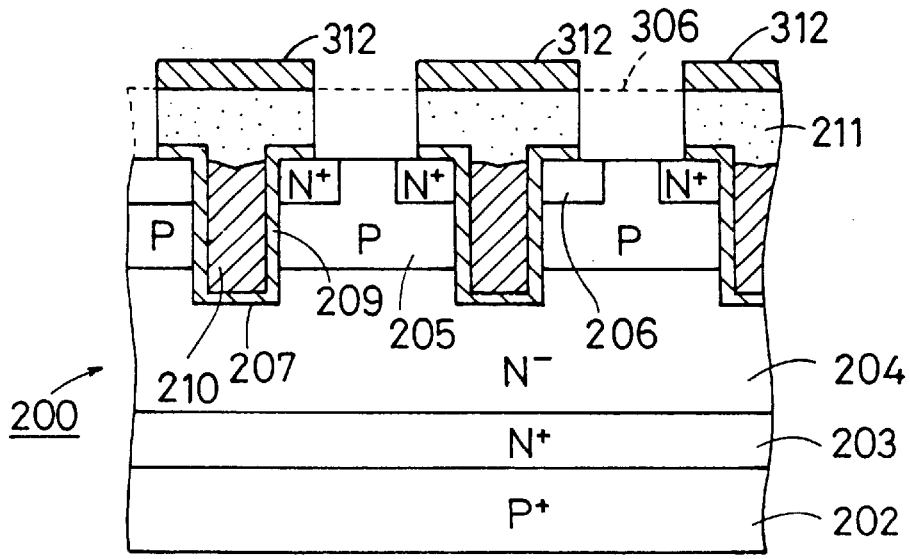
FIG. 32 is a process diagram about the method of manufacturing the UMOS-IGBT of the preferred embodiment of the present invention.

Next, as shown in FIG. 31, an insulating film 310 is deposited on the upper surface of the semiconductor base body 200 and the gate interconnection GL Subsequently, as shown in FIG. 32, a mask (third mask) 312 having a predetermined pattern is formed on the insulating film 310. This mask 312 zonally opens along the zonal regions forming the upper main surface of the semiconductor base body 200 interposed between the stripe-like trenches 207. After that, the insulating film 310 and the thermal oxide film 309 are selectively etched using the mask 312 as a shield. As a result, the insulating film 211 covering the gate electrode 210 is formed and the upper main surface of the semiconductor base body 200 is zonally exposed, and the gate insulating film 209 insulating the gate electrode 210 and the semiconductor base body 200 is formed with the remaining portion of the thermal oxide film 309. After that, the mask 312 is removed.

Figure 33:
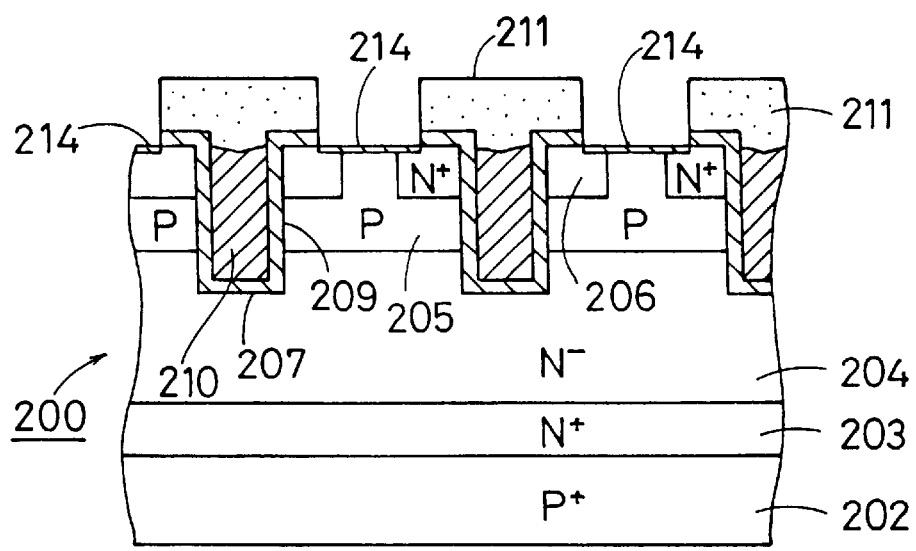
FIG. 33 is a process diagram about the method of manufacturing the UMOS-IGBT of the preferred embodiment of the present invention.

Subsequently, as shown in FIG. 33, platinum is selectively sputtered onto the zonal exposed surface in the upper main surface of the semiconductor base body 200, i.e., the portion corresponding to the opening of the insulating layer 211, and thermal processing is applied thereto, and then the platinum silicide layer 214 is formed on the zonal exposed surface.

Figure 34:
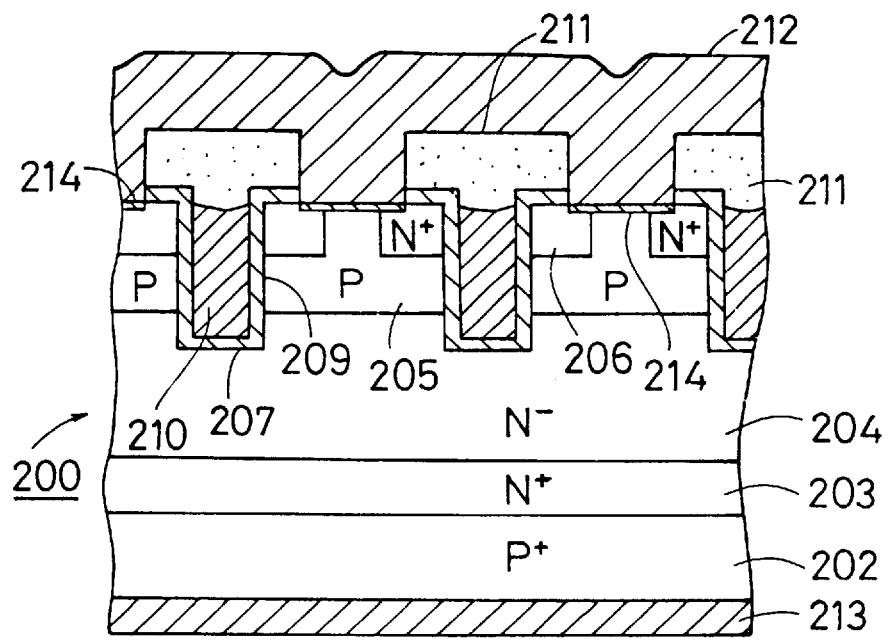
FIG. 34 is a process diagram about the method of manufacturing the UMOS-IGBT of the preferred embodiment of the present invention.

Next, as shown in FIG. 34, aluminum is deposited on the entire upper surface, i.e., on the insulating layer 211 and the platinum silicide layer 214 to form the emitter electrode 212 electrically connected to the platinum silicide layer 214. Also, a Ti—Ni—Al film, for example, is formed on the lower main surface of the semiconductor base body 200, i.e., on the lower surface of the P+ collector layer 202, and the collector electrode 213 electrically connected to the lower surface of the P+ collector layer 202 is then obtained.

With the above-described processes, the UMOS-IGBT 110 is obtained.

<Thirteenth Preferred Embodiment>

Now, a preferred method of manufacturing a UMOS-IGBT which is different from the UMOS-IGBT 110 only in that the platinum silicide layer 214 is not provided will be described. To manufacture this UMOS-IGBT, the process shown in FIG. 33, i.e., the process of sputtering platinum and then applying the thermal processing is omitted, the process shown in FIG. 32 is then carried out, and then directly the process shown in FIG. 34 is carried out. By thus carrying out the processes, the emitter electrode 212 is directly connected to the zonal exposed surface of the semiconductor base body 200 where the platinum silicide layer 214 does not exist.

<Fourteenth Preferred Embodiment>

Figure 35:
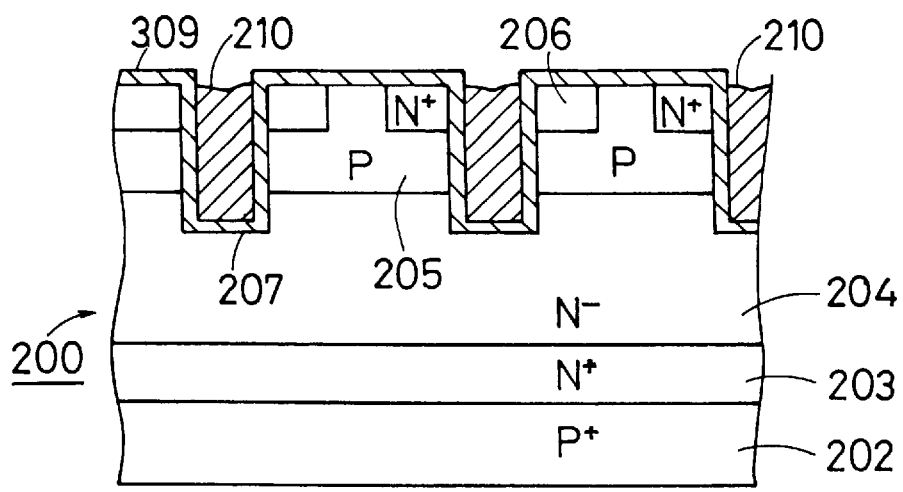
FIG. 35 is a process diagram about the method of manufacturing the UMOS-IGBT of the preferred embodiment of the present invention.

Now, a preferred method of manufacturing a UMOS-IGBT which is different from the UMOS-IGBT 110 only in that the gate interconnection GL is not formed of polysilicon which is the same as the gate electrode 210. When manufacturing this UMOS-IGBT, the processes shown in FIG. 20 to FIG. 28 are carried out, and without carrying out the processes shown in FIG. 29 and FIG. 30, and the polysilicon layer 306 is etched back at once to remove the polysilicon layer 306 from the upper main surface of the semiconductor base body 200 as shown in the process diagram of FIG. 35. As a result, the gate electrode 210 is formed. The gate interconnection GL is formed separately. Subsequently, the processes in and after FIG. 31 in the twelfth preferred embodiment are carried out.

<Fifteenth Preferred Embodiment>

Now, a preferable method of manufacturing a UMOS-IGBT which is different from the UMOS-IGBT 110 only in that the N+ emitter layer is exposed on the upper main surface of the semiconductor base body in the stripe form perpendicular to the trench 207 as in the UMOS-IGBT 80 which is the conventional device. When manufacturing this UMOS-IGBT, the processes shown in FIG. 20 to FIG. 23 are carried out and then a mask having a predetermined pattern is formed on the upper surface of the P base layer 205 by the photolithography in the same way as the process shown in FIG. 24. This mask is different from the mask 331 in that it has the stripe-like form. After that, N-type impurity is selectively implanted on the upper surface of the P base layer 205 by using this mask as a shield. Next, the mask is removed and then annealing is applied to selectively form the N+ emitter layer on the upper surface of the P base layer 205.

Figure 36:
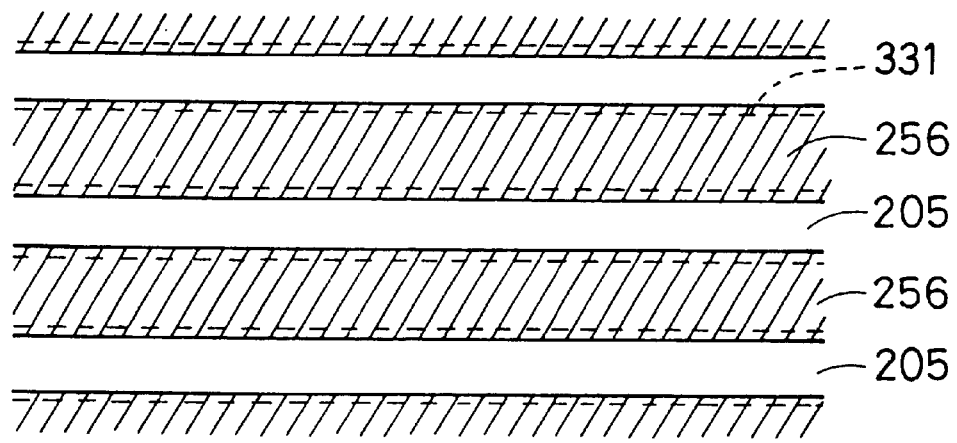
FIG. 36 is a process diagram about the method of manufacturing the UMOS-IGBT of the preferred embodiment of the present invention.

FIG. 36 shows the upper main surface of the semiconductor base body after this process is finished. FIG. 36 also shows the outline of the stripe-like mask 331 used in this process. The N+ emitter layer 256 and the P base layer 205 formed in this process are alternately exposed in the stripe form on the upper main surface of the semiconductor base body.

Figure 37:
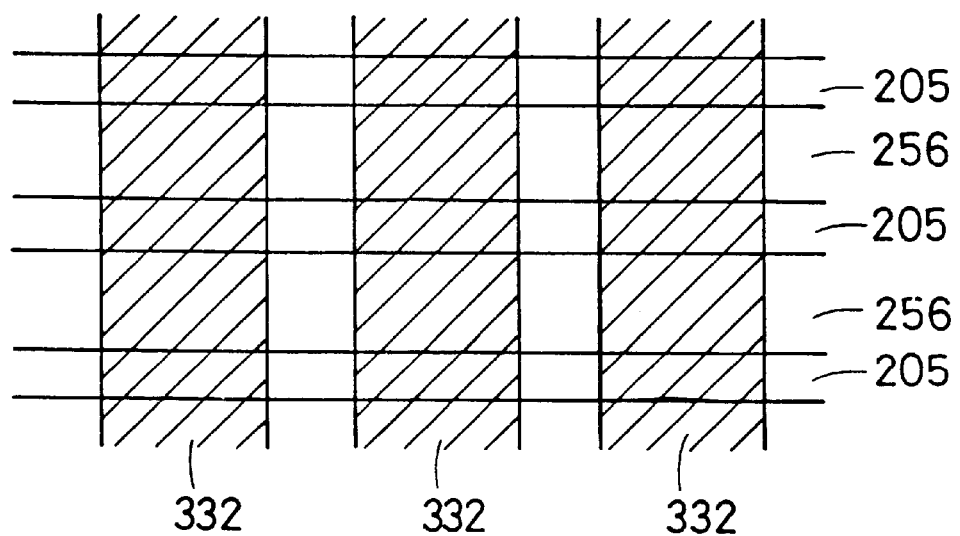
FIG. 37 is a process diagram about the method of manufacturing the UMOS-IGBT of the preferred embodiment of the present invention.

Next, in the same way as the process shown in FIG. 26, a mask having a predetermined pattern is formed by the photolithography on the upper main surface of the semiconductor base body. This mask 332 is formed in the stripe form perpendicular to the stripe-like N+ emitter layer 256 as shown in the plan view of FIG. 37. The RIE (Reactive Ion Etching) is applied to the upper main surface of the semiconductor base body using this mask 332 as a shield. As a result, the stripe-like trench 207 is formed so as to be perpendicular to the stripe-like N+ emitter layer 256. The depth of this trench 207 is controlled so that it extends from the upper surface of the N+ emitter layer 256 through the P base layer 205 to reach the N− semiconductor layer 204.

Processes after that are the same as the processes shown in and after FIG. 28 in the twelfth preferred embodiment.

<Sixteenth Preferred Embodiment>

In the twelfth preferred embodiment, when forming the gate interconnection GL and the gate electrode 210 of polysilicon shown in FIG. 30, the polysilicon layer 306 may be deposited previously to a thickness corresponding to the gate interconnection GL. That is, in the process shown in FIG. 28, the polysilicon layer 307 (FIG. 29) having a thickness from the upper main surface of the semiconductor base body 200 corresponding to the thickness of the gate interconnection GL may be directly formed by controlling the progress of deposition of the polysilicon layer 306.

<Seventeenth Preferred Embodiment>

Figure 38:
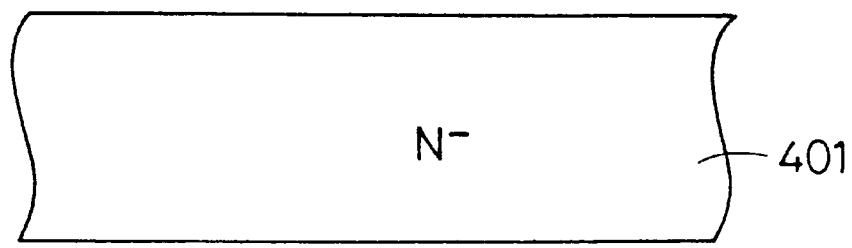
FIG. 38 is a process diagram about a method of manufacturing the UMOS of the preferred embodiment of the present invention.

Now, a preferred method of manufacturing a UMOS which is different from the UMOS-IGBT 110 only in that the P+ collector layer 202 does not exist in the semiconductor base body 200 will be described. When manufacturing this UMOS, first, as shown in FIG. 38, a silicon substrate 401 containing N-type impurity at a low concentration is prepared.

Figure 39:
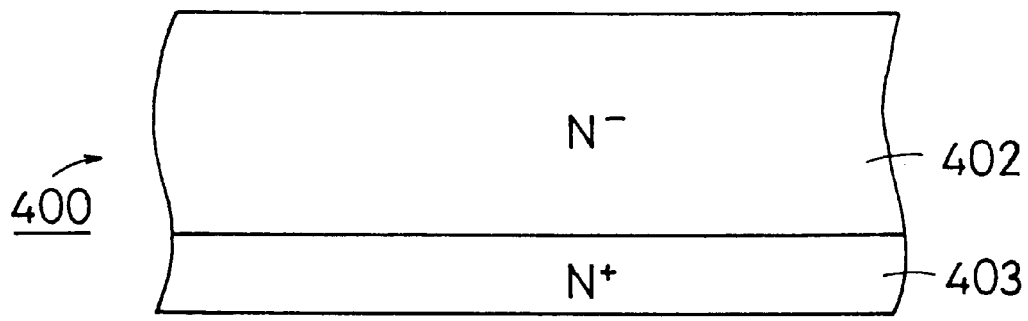
FIG. 39 is a process diagram about the method of manufacturing the UMOS of the preferred embodiment of the present invention.
Figure 40:
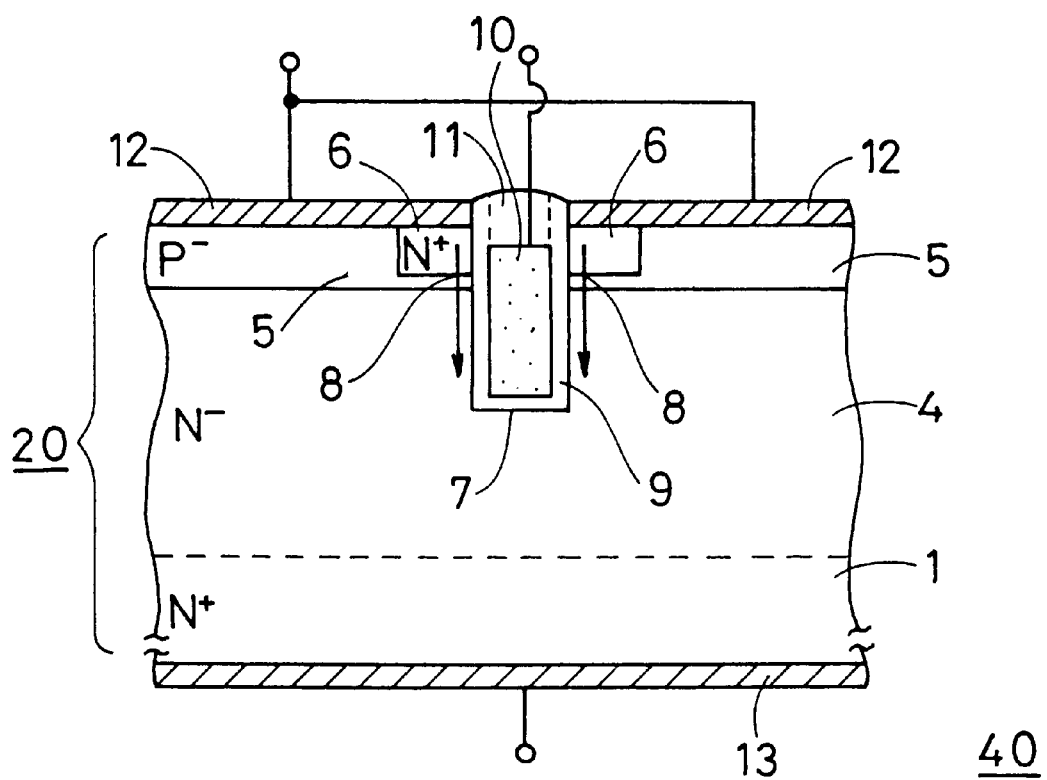
FIG. 40 is a front sectional view of the conventional UMOS.
Figure 41:
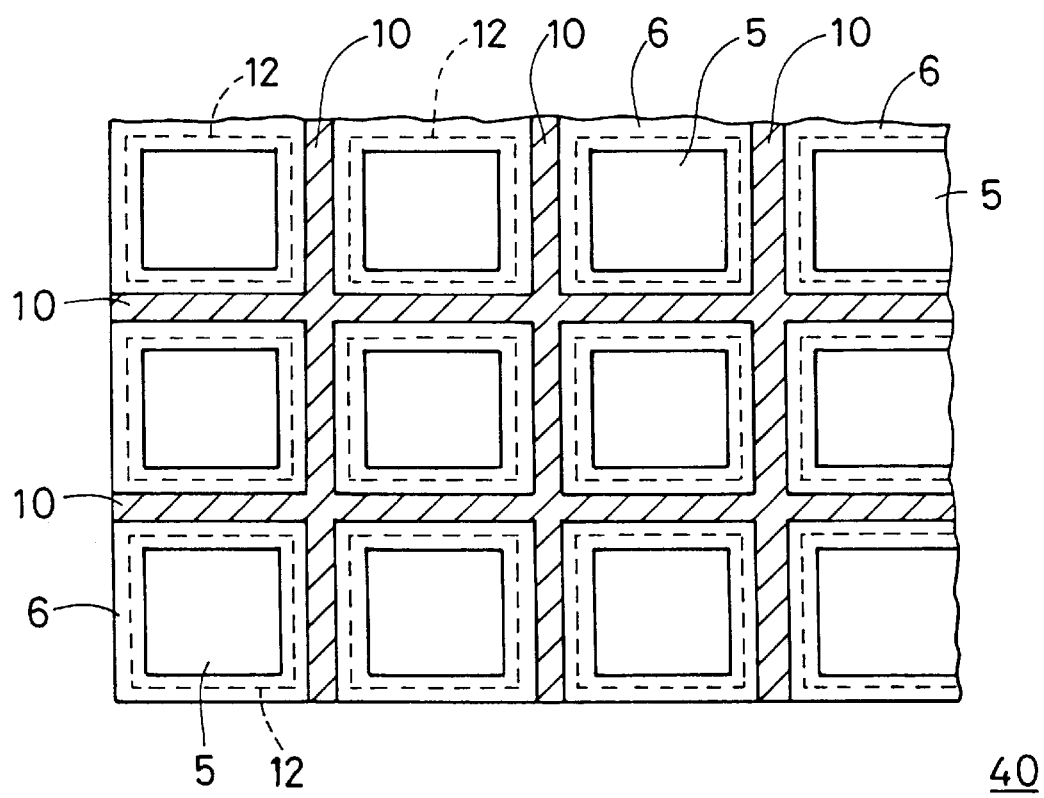
FIG. 41 is a plan view of the conventional UMOS.
Figure 42:
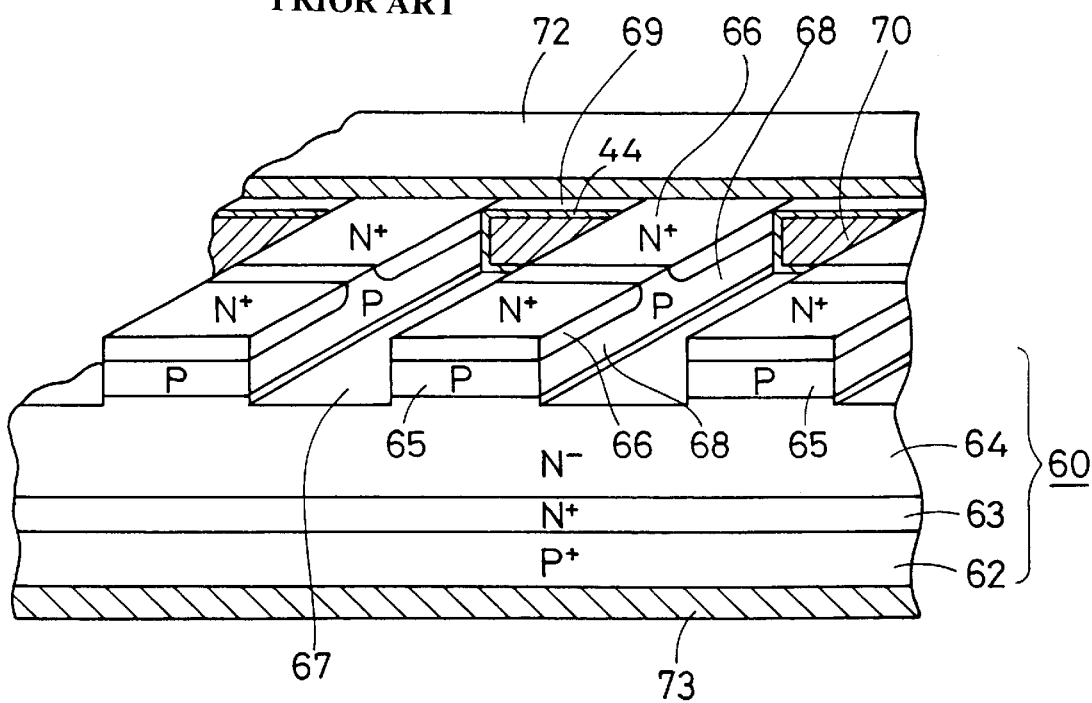
FIG. 42 is a cross-sectional perspective view of the conventional UMOS-IGBT.

Next, as shown in FIG. 39, N-type impurity is implanted to the lower main surface of this silicon substrate 401 to a high concentration, and then the annealing is applied to form an N+-type semiconductor layer 403 containing N-type impurity at a high concentration on the lower surface of the N-type semiconductor layer 402. In this process, the semiconductor base body 400 is formed. In place of implanting the N-type impurity, the N+-type semiconductor layer 403 containing N-type impurity at a high concentration may be formed by epitaxial growth on the lower main surface of the silicon substrate 401.

Processes after that are the same as the processes in and after FIG. 23 in the twelfth preferred embodiment.

<Eighteenth Preferred Embodiment>

Although the UMOS-IGBT and the UMOS have been described as examples in the preferred embodiments above, the present invention can also be applied to other insulated gate semiconductor devices such as EST (Emitter Switched Thyristor) and MCT (MOS Controlled Thyristor).

<Nineteenth Preferred Embodiment>

Although the description has been made on UMOS-IGBTs and the like of N-channel type in the preferred embodiments above, the present invention can be applied to insulated gate semiconductor devices of P-channel type.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing an insulated gate type semiconductor device in which a plurality of insulated gate type semiconductor elements having trench gate are arranged substantially in a stripe form in a semiconductor base body, comprising the steps of:

(a) preparing the semiconductor base body defining an upper main surface and a lower main surface and having a first semiconductor layer of a first conductivity type exposed on the upper main surface;

(b) forming a second semiconductor layer of a second conductivity type exposed the upper main surface of said semiconductor base body in an upper surface portion of said first semiconductor layer by introducing impurity of the second conductivity type in the upper main surface of said semiconductor base body;

(c) selectively introducing impurity of the first conductivity type in the upper main surface of said semiconductor base body to selectively form a third semiconductor layer of the first conductivity type exposed on the upper main surface in a lattice-like form in an upper surface portion of said second semiconductor layer;

(d) selectively carrying out etching from the upper main surface of said semiconductor base body to form a trench which opens in said upper main surface, reaches said first semiconductor layer, and includes at least as a part thereof a plurality of trenches arranged substantially in a stripe form, each of said plurality of trenches opens along and inside a portion of the lattice-like exposed surface of said third semiconductor layer extending in a stripe form;

(e) forming a first insulating film covering an inner wall of said trench and the upper main surface of said semiconductor base body;

(f) burying a gate electrode in said trench covered with said first insulating film;

(g) forming a second insulating film on said first insulating film and said gate electrode;

(h) selectively applying etching to said second insulating film to selectively remove said second insulating film substantially in a zonal form interposed between adjacent said strip-like trenches, separated from the trenches and extending along the trenches;

(i) forming a first conductor to cover said second insulating film and a portion from where it is removed; and (j) forming a second conductor on the lower main surface of said semiconductor base body.

2. A method of manufacturing an insulated gate type semiconductor device comprising the steps of:

(a) preparing a semiconductor base body defining an upper main surface and a lower main surface and having a first semiconductor layer of a first conductivity type exposed on the upper main surface;

(b) forming a second semiconductor layer of a second conductivity type exposed on the upper main surface of said semiconductor base body in an upper surface portion of said first semiconductor layer by introducing impurity of the second conductivity type in the upper main surface of said semiconductor base body;

(c) selectively introducing impurity of the first conductivity type in the upper main surface of said semiconductor base body to selectively form a third semiconductor layer of the first conductivity type selectively exposed on the upper main surface in the upper surface portion of said second semiconductor layer;

(d) selectively applying etching from the upper main surface of said semiconductor base body to form a trench reaching said first semiconductor layer;

(e) forming a first insulating film covering an inner wall of said trench and the upper main surface of said semiconductor base body;

(f) burying a gate electrode in said trench covered with said first insulating film;

(g) forming a second insulating film on said first insulating film and said gate electrode;

(h) selectively applying etching to said second insulating film to selectively remove said second insulating film in a form separated from said trench and along said trench;

(i) selectively introducing element containing platinum into the upper main surface of said semiconductor base body using said second insulating film as a shield to selectively form a conductive layer having platinum silicide on the upper main surface potion of said semiconductor base body;

(j) forming a first conductor to cover said second insulating film the a portion from where it is removed; and (k) forming a second conductor on the lower main surface of said semiconductor base body.

3. A method of manufacturing an insulated gate type semiconductor device, comprising the steps of:

(a) preparing a semiconductor base body defining an upper main surface and a lower main surface and having a first semiconductor layer of a first conductivity type exposed on the upper main surface;

(b) forming, on an upper surface portion of said first semiconductor layer, a second semiconductor layer of a second conductivity type exposed on the upper main surface of said semiconductor base body by introducing impurity of the second conductivity type in the upper main surface of said semiconductor base body;

(c) selectively introducing impurity of the first conductivity type in the upper main surface of said semiconductor base body to selectively form a third semiconductor layer of the first conductivity type selectively exposed on the upper main surface in the upper surface portion of said second semiconductor layer;

(d) selectively applying etching from the upper main surface of said semiconductor base body to form a trench reaching said first semiconductor layer;

(e) forming a first insulating film covering an inner wall of said trench and the upper main surface of said semiconductor base body;

(f) providing a polysilicon layer so as to fill said trench covered with said first insulating film and so as to have a predetermined or larger thickness above the upper main surface of said semiconductor base body covered with said first insulating film;

(g) applying etching to the upper surface of said polysilicon layer to adjust the thickness from the upper main surface of said semiconductor base body to a predetermined magnitude;

(h) selectively applying etching to said polysilicon layer to remove the polysilicon layer except a portion buried in said trench which functions as a gate electrode and a portion which functions as a gate interconnection;

(i) forming a second insulating film on said first insulating film and said gate electrode;

(j) selectively applying etching to said second insulating film to selectively remove said second insulating film in a form separated from said trench and along said trench;

(k) forming a first conductor to cover said second insulating film and a portion from where it is removed; and (l) forming a second conductor on the lower main surface of said semiconductor base body.

4. A method of manufacturing an insulated gate type semiconductor device, comprising the steps of:

(a) preparing a semiconductor base body defining an upper main surface and a lower main surface and having a first semiconductor layer of a first conductivity type exposed on the upper main surface;

(b) forming, on an upper surface portion of said first semiconductor layer, a second semiconductor layer of a second conductivity type exposed on the upper main surface of said semiconductor base body by introducing impurity of the second conductivity type in the upper main surface of said semiconductor base body;

(c) selectively introducing impurity of the first conductivity type in the upper main surface of said semiconductor base body to selectively form a third semiconductor layer of the first conductivity type selectively exposed on the upper main surface in an upper surface portion of said second semiconductor layer;

(d) selectively applying etching from the upper main surface of said semiconductor base body to form a trench reaching said first semiconductor layer;

(e) forming a first insulating film covering an inner wall of said trench and the upper main surface of said semiconductor base body;

(f) providing a polysilicon layer so as to fill said trench covered with said first insulating film and so as to have a predetermined thickness above the upper main surface of said semiconductor base body covered with said first insulating film;

(g) selectively applying etching to said polysilicon layer to remove said polysilicon layer except a portion buried in said trench which functions as a gate electrode and a portion which functions as a gate interconnection;

(h) forming a second insulating film on said first insulating film and said gate electrode;

(i) selectively applying, etching to said second insulating film to selectively remove said second insulating film in a form separated from said trench and along said trench;

(j) forming a first conductor to cover said second insulating film and a portion from where it is removed; and (k) forming a second conductor on the lower main surface of said semiconductor base body.

5. A method of manufacturing a semiconductor device according to claim 3, wherein the impurity of the first conductivity type is selectively implanted in said upper main surface with said first gate electrode and said second gate electrode used as shields and thereafter diffused to form said third semiconductor layer and said fifth semiconductor layer and selectively form an eighth semiconductor layer of the first conductivity type at the same time in said upper surface to be shallower than said second semiconductor layer and away from both said third semiconductor layer and said fifth semiconductor layer in said steps (b) and (c).

6. The method of manufacturing a semiconductor device according to claim 2, wherein said step (f) comprises the steps of (f-1) selectively forming a shield over said upper main surface; and (f-2) selectively implanting the impurity of the first conductivity type in said upper main surface by using said shield and thereafter diffusing it to form said seventh semiconductor layer and form an eighth semiconductor layer of the first conductivity type having an impurity concentration higher than that of said third semiconductor layer in a region inside edges of said third semiconductor layer in said upper main surface to be exposed to said first region and not to be exposed to said second region.

* * * * *

UNITED STATES PATENT AND TRADEMARK OFFICE
CERTIFICATE OF CORRECTION

PATENT NO.     : 6,331,466 B1
DATED          : December 18, 2001
INVENTOR(S)    : Hideki Takahashi et al.

It is certified that error appears in the above-identified patent and that said Letters Patent is hereby corrected as shown below:

<u>Title page,</u>
Item [62], change "Division of application No. 08/338,599 filed on February 14, 1995" to -- Division of application No. 08/388,599 filed on February 14, 1995 --.

Signed and Sealed this

Third Day of September, 2002

Attest:

Attesting Officer

JAMES E. ROGAN
Director of the United States Patent and Trademark Office